(12) United States Patent
Long et al.

(10) Patent No.: US 12,295,227 B2
(45) Date of Patent: May 6, 2025

(54) DISPLAY SUBSTRATE AND METHOD OF MANUFACTURING THE SAME, AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Yue Long, Beijing (CN); Yuanyou Qiu, Beijing (CN); Jianchang Cai, Beijing (CN); Chao Wu, Beijing (CN); Xingliang Xiao, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 548 days.

(21) Appl. No.: 17/784,897

(22) PCT Filed: Sep. 10, 2021

(86) PCT No.: PCT/CN2021/117748
§ 371 (c)(1),
(2) Date: Jun. 13, 2022

(87) PCT Pub. No.: WO2022/083349
PCT Pub. Date: Apr. 28, 2022

(65) Prior Publication Data
US 2023/0012412 A1 Jan. 12, 2023

(30) Foreign Application Priority Data
Oct. 23, 2020 (CN) .......................... 202011147168.7

(51) Int. Cl.
*H10K 59/131* (2023.01)
*H10K 59/12* (2023.01)
(Continued)

(52) U.S. Cl.
CPC ........... *H10K 59/131* (2023.02); *H10K 71/00* (2023.02); *H10K 59/1201* (2023.02); *H10K 59/124* (2023.02); *H10K 59/88* (2023.02)

(58) Field of Classification Search
CPC .. H10K 59/124; H10K 59/88; H10K 59/1201; H10K 59/131; H10K 71/00
See application file for complete search history.

(56) References Cited

U.S. PATENT DOCUMENTS 10,199,397 B2 2/2019 Liu et al.
11,334,184 B2 * 5/2022 Ye .......................... G06F 3/0412
(Continued)

FOREIGN PATENT DOCUMENTS

CN 103744213 A 4/2014
CN 204964955 U 1/2016
(Continued)

OTHER PUBLICATIONS

International Search Report in PCT/CN2021/117748 dated Nov. 25, 2021 in English.
(Continued)

*Primary Examiner* — Mark W Tornow
(74) *Attorney, Agent, or Firm* — Collard & Roe, P.C.; William Collard

(57) ABSTRACT

A display substrate, a preparation method therefor, and a display apparatus. The preparation method comprises: providing a base substrate, a plurality of pixel drive circuits being formed on the base substrate, the plurality of pixel drive circuits comprising a first pixel drive circuit and a second pixel drive circuit; forming a first insulating layer on the base substrate; forming a first wiring layer on the first insulating layer, the first wiring layer comprising a first connecting wire, the first connecting wire being formed electrically connected to the first pixel drive circuit by (Continued)

means of the first insulating layer; forming and patterning a second insulating layer on the first wiring layer; forming a second wiring layer on a second insulating layer, the second wiring layer comprising a second connecting wire, the second connecting wire being formed electrically connected to the second pixel drive circuit by means of the first insulating layer and the second insulating layer; and forming and patterning a second insulating layer on the second wiring layer, the third insulating layer and the second insulating layer using the same reticle for the patterning process.

20 Claims, 26 Drawing Sheets

(51) Int. Cl.
*H10K 59/124* (2023.01)
*H10K 59/88* (2023.01)
*H10K 71/00* (2023.01)

(56) References Cited

U.S. PATENT DOCUMENTS

| | | | |
|---|---|---|---|
| 11,355,047 B2* | 6/2022 | Liu | G09G 3/20 |
| 11,456,346 B2* | 9/2022 | Zhao | H10K 59/60 |
| 2020/0321356 A1* | 10/2020 | Shang | G02F 1/136286 |
| 2021/0124226 A1* | 4/2021 | Cheng | H01L 21/76804 |

FOREIGN PATENT DOCUMENTS

| | | |
|---|---|---|
| CN | 106990632 A | 7/2017 |
| CN | 109817531 A | 5/2019 |
| CN | 110034165 A | 7/2019 |
| CN | 110489012 A | 11/2019 |
| CN | 110491918 A | 11/2019 |
| CN | 110767139 A | 2/2020 |
| CN | 110993662 A | 4/2020 |

OTHER PUBLICATIONS

Written Opinion of the International Searching Authority in PCT/CN2021/117748 dated Nov. 25, 2021 in Chinese.
Written Opinion in PCT/CN2021/117748 dated Nov. 25, 2021 in English.

* cited by examiner

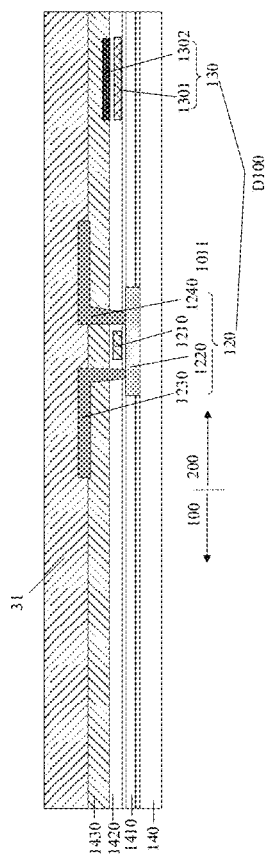
FIG. 8A
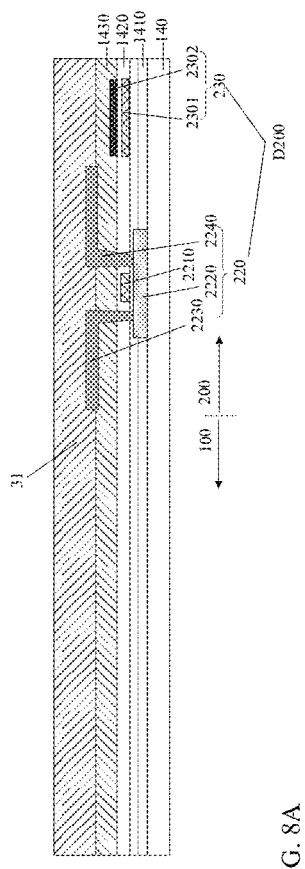
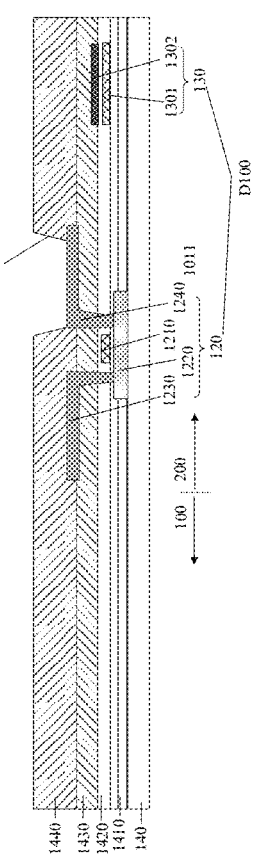
FIG. 8B
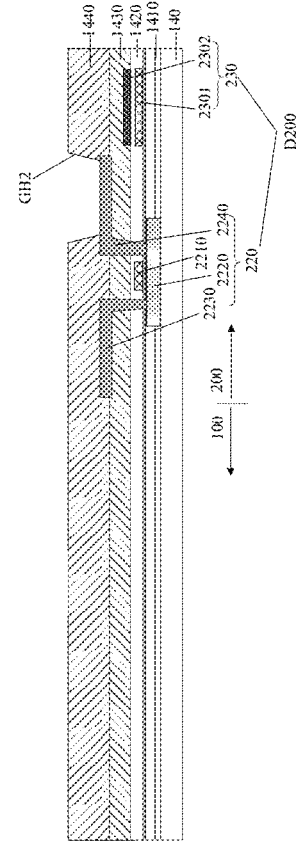

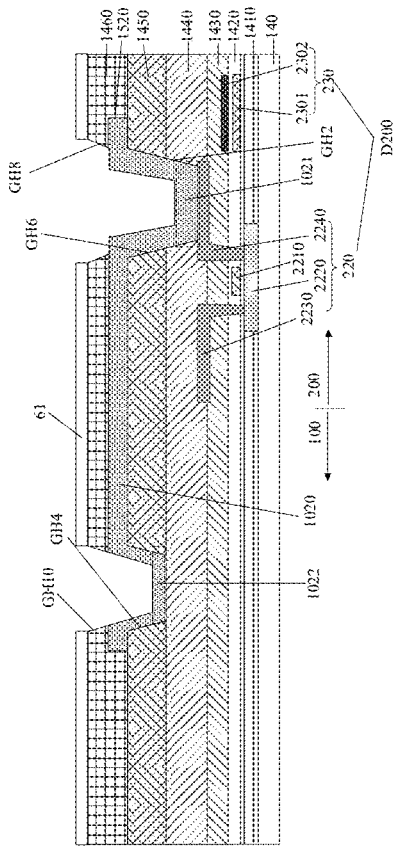
FIG. 8I
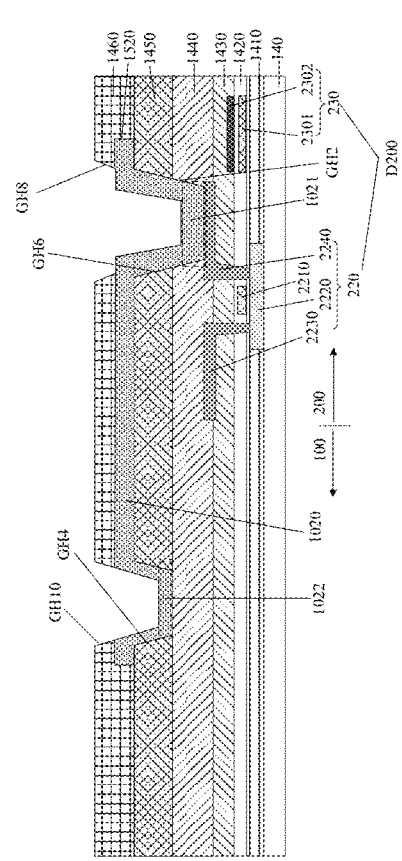
FIG. 8J
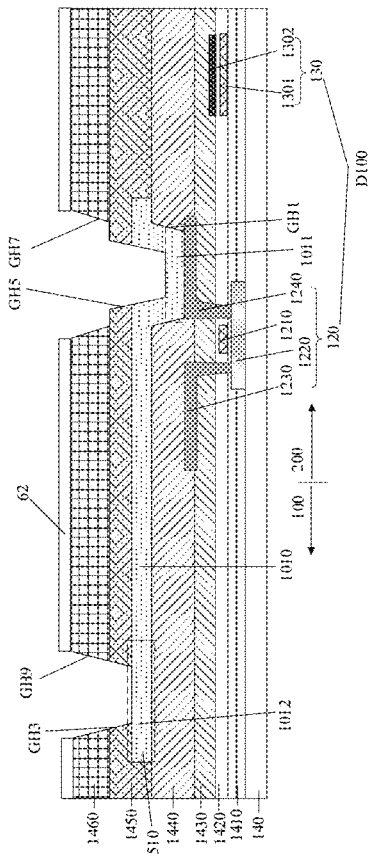
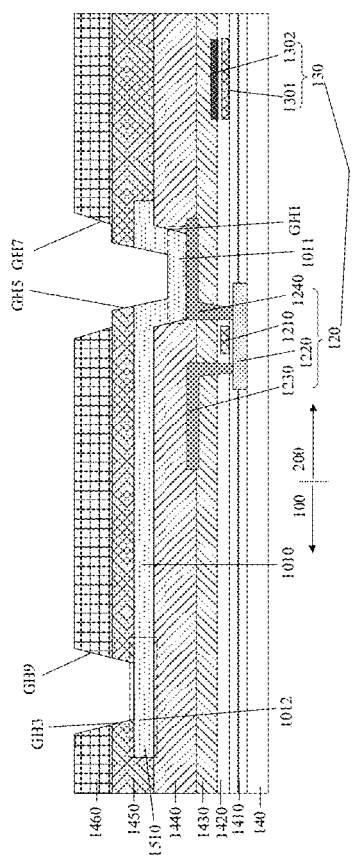

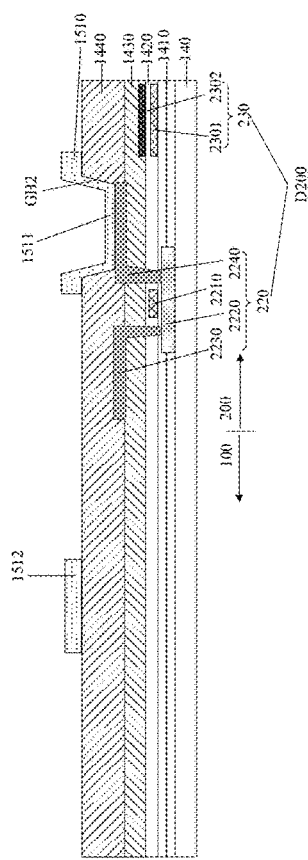
FIG. 9A
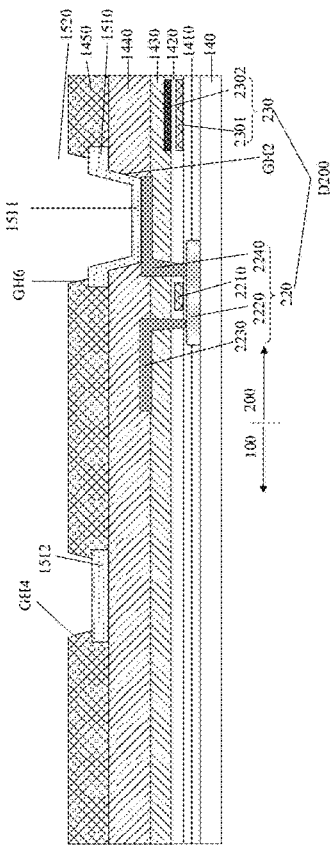
FIG. 9B
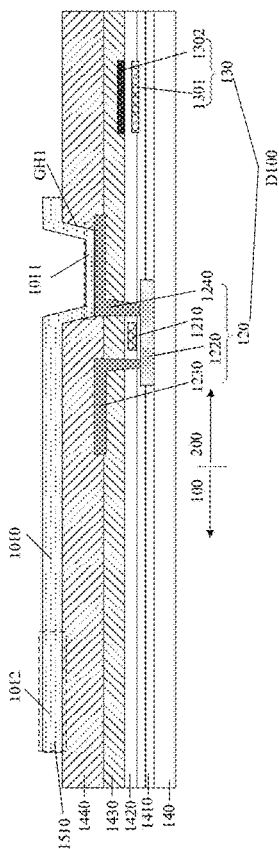
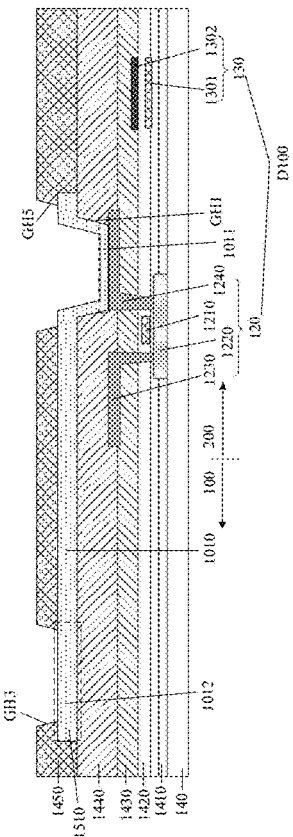

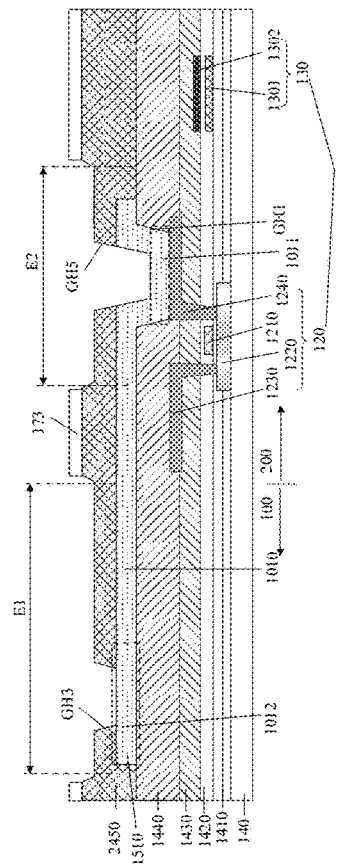
FIG. 10C
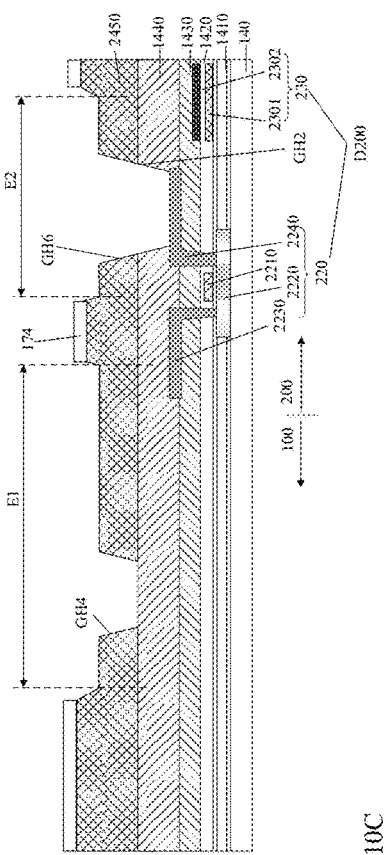
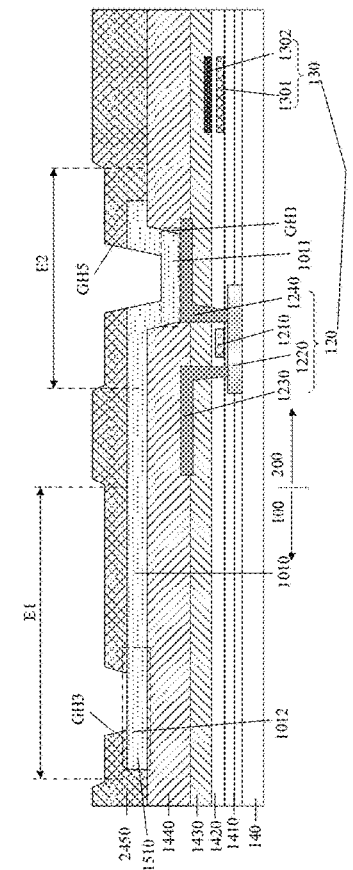
FIG. 10D
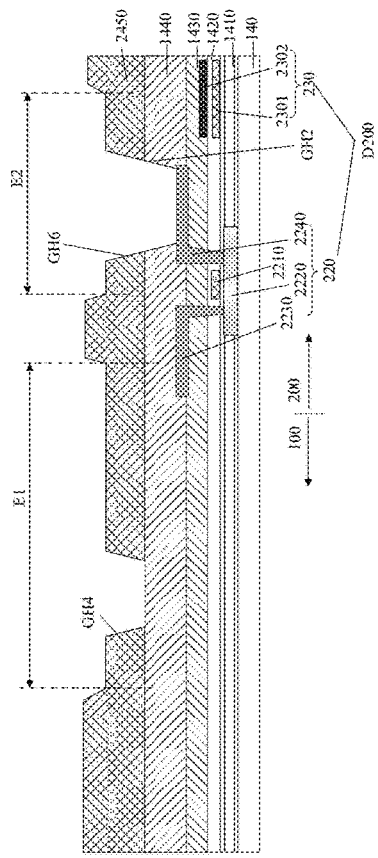

DISPLAY SUBSTRATE AND METHOD OF MANUFACTURING THE SAME, AND DISPLAY DEVICE

CROSS-REFERENCE TO RELATED APPLICATION

This application is the National Stage PCT/CN2021/117748 filed on Sep. 10, 2021, which claims the priority benefit of U.S.C. § 119 of Chinese Application No. 202011147168.7 filed on Oct. 23, 2020, the entire disclosure of which is incorporated herein by reference as part of the present application.

TECHNICAL FIELD

The embodiments of the present disclosure relate to a display substrate and a method of manufacturing the same, and a display device.

BACKGROUND

At present, display screens for electronic devices are developing towards larger screens and full screens, so that users can have better visual experience. Taking electronic products such as mobile phones and tablet computers as an example, because these electronic devices need to combine components such as cameras and light sensors, and these components usually occupy the display region of the display screen, it is difficult to achieve a full-screen design of the display screen. In order to ensure the light transmittance of the region where a camera is located in the display screen and ensure the photographing effect of the camera, only the light-emitting device of the pixel circuit is reserved in the region where the camera is located.

SUMMARY

At least one embodiment of the present disclosure provides a method of manufacturing a display substrate, which includes: providing a base substrate, wherein the base substrate has a plurality of pixel drive circuits formed thereon, and the plurality of pixel drive circuits include a first pixel drive circuit and a second pixel drive circuit: forming a first insulating layer on the base substrate, wherein the first insulating layer is formed to partially expose the plurality of pixel drive circuits, respectively: forming a first wiring layer on the first insulating layer, wherein the first wiring layer includes a first connecting wire, and the first connecting wire is formed to be electrically connected to the first pixel drive circuit through the first insulating layer: forming a second insulating layer on the first wiring layer, and patterning the second insulating layer: forming a second wiring layer on the second insulating layer, wherein the second wiring layer includes a second connecting wire, and the second connecting wire is formed to be electrically connected to the second pixel drive circuit through the first insulating layer and the second insulating layer; and forming a third insulating layer on the second wiring layer, and patterning the third insulating layer, wherein the third insulating layer and the second insulating layer are subjected to a patterning process using a same reticle.

For example, the method provided by at least one embodiment of the present disclosure further includes: forming a plurality of light-emitting devices on the third insulating layer, wherein each of the plurality of light-emitting devices includes a first electrode, and the plurality of light-emitting devices include a first light-emitting device and a second light-emitting device: a first electrode of the first light-emitting device is electrically connected to the first connecting wire through the second insulating layer and the third insulating layer; and a first electrode of the second light-emitting device is electrically connected to the second connecting wire through the third insulating layer.

For example, in the method provided by at least one embodiment of the present disclosure, forming the first insulating layer on the base substrate includes: forming a first via hole and a second via hole in the first insulating layer, wherein the first via hole partially exposes the first pixel drive circuit, and the second via hole partially exposes the second pixel drive circuit.

For example, in the method provided by at least one embodiment of the present disclosure, forming the first wiring layer on the first insulating layer includes: forming a first end of the first connecting wire to be electrically connected to the first pixel drive circuit through the first via hole in the first insulating layer, wherein a second end of the first connecting wire is formed for electrically connecting the first light-emitting device.

For example, in the method provided by at least one embodiment of the present disclosure, forming the second insulating layer includes: forming a third via hole and a fourth via hole in the second insulating layer, wherein the third via hole exposes the second end of the first connecting wire, and an orthographic projection of the fourth via hole on the base substrate overlaps with an orthographic projection of a second end of the second connecting wire on the base substrate.

For example, in the method provided by at least one embodiment of the present disclosure, forming the second insulating layer further includes: forming a fifth via hole and a sixth via hole in the second insulating layer, wherein an orthographic projection of the fifth via hole on the base substrate overlaps with an orthographic projection of the first via hole on the base substrate, and the fifth via hole exposes the first end of the first connecting wire, and the sixth via hole corresponds to the second via hole.

For example, in the method provided by at least one embodiment of the present disclosure, forming the second wiring layer includes: forming a first end of the second connecting wire to be electrically connected to the second pixel drive circuit through the second via hole in the first insulating layer and the sixth via hole in the second insulating layer, wherein the second end of the second connecting wire is formed for connecting the second light-emitting device.

For example, in the method provided by at least one embodiment of the present disclosure, forming the third insulating layer includes: forming a seventh via hole and an eighth via hole in the third insulating layer, wherein an orthographic projection of the seventh via hole on the base substrate overlaps with orthographic projections of the first via hole of the first insulating layer and the fifth via hole of the second insulating layer on the base substrate, and the seventh via hole exposes the first end of the first connecting wire, an orthographic projection of the eighth via hole on the base substrate overlaps with orthographic projections of the second via hole of the first insulating layer and the sixth via hole of the second insulating layer on the base substrate, and the eighth via hole exposes the first end of the second connecting wire.

For example, in the method provided by at least one embodiment of the present disclosure, forming the third insulating layer further includes: forming a ninth via hole and a tenth via hole in the third insulating layer, wherein an orthographic projection of the ninth via hole on the base substrate overlaps with an orthographic projection of the third via hole of the second insulating layer on the base substrate, the ninth via hole exposes the second end of the first connecting wire, an orthographic projection of the tenth via hole on the base substrate overlaps with an orthographic projection of the fourth via hole of the second insulating layer on the base substrate, and the tenth via hole exposes the second end of the second connecting wire.

For example, in the method provided by at least one embodiment of the present disclosure, forming first electrodes of the plurality of light-emitting devices includes: forming the first electrode of the first light-emitting device to be connected to the second end of the first connecting wire through the third via hole of the second insulating layer and the ninth via hole of the third insulating layer, and forming the first electrode of the second light-emitting device to be connected to the second end of the second connecting wire through the tenth via hole of the third insulating layer.

For example, in the method provided by at least one embodiment of the present disclosure, while forming the first electrodes of the plurality of light-emitting devices, a first protective layer and a second protective layer are further formed; and the first protective layer covers the seventh via hole of the third insulating layer and the fifth via hole of the second insulating layer, and the second protective layer covers the eighth via hole of the third insulating layer.

For example, in the method provided by at least one embodiment of the present disclosure, forming the first wiring layer further includes: forming a first pad layer at the second via hole of the first insulating layer, wherein the first pad layer at least partially covers the second via hole and is electrically connected to the second pixel drive circuit, and the sixth via hole of the second insulating layer at least partially exposes the first pad layer to allow the second connecting wire to be electrically connected to the second pixel drive circuit through the first pad layer.

For example, in the method provided by at least one embodiment of the present disclosure, forming the first wiring layer further includes: forming a second pad layer on the first insulating layer, wherein the second pad layer is electrically connected to the second end of the second connecting wire, and the fourth via hole of the second insulating layer at least partially exposes the second pad layer.

For example, in the method provided by at least one embodiment of the present disclosure, forming the second wiring layer further includes: forming a third pad layer at the fifth via hole of the second insulating layer, wherein the third pad layer at least partially overlaps with the fifth via hole of the second insulating layer, so as to be electrically connected to the first end of the first connecting wire, and the seventh via hole of the third insulating layer at least partially exposes the third pad layer to allow electrical connection to the first connecting wire through the third pad layer.

For example, in the method provided by at least one embodiment of the present disclosure, forming the second wiring layer further includes: forming a fourth pad layer on the second insulating layer, wherein the fourth pad layer at least partially overlaps with the third via hole of the second insulating layer and covers the second end of the first connecting wire, and the ninth via hole of the third insulating layer at least partially exposes the fourth pad layer.

For example, in the method provided by at least one embodiment of the present disclosure, forming the plurality of light-emitting devices further includes: after forming the first electrodes of the plurality of light-emitting devices, forming a pixel defining layer on a side of the first electrodes of the plurality of light-emitting devices and the third insulating layer away from the base substrate, wherein the pixel defining layer is formed to include a plurality of first pixel openings, and the plurality of first pixel openings are in one-to-one correspondence with the plurality of light-emitting devices, so as to form light-emitting regions of the plurality of light-emitting devices: forming a first light-emitting layer of the plurality of light-emitting devices in the plurality of first pixel openings; and forming second electrodes of the plurality of light-emitting devices on a side of the first light-emitting layer and the pixel defining layer away from the base substrate.

For example, in the method provided by at least one embodiment of the present disclosure, forming the first conductive layer further includes: forming a first dummy wire, wherein the first dummy wire is connected to the second end of the first connecting wire: forming the second conductive layer further includes: forming a second dummy wire, wherein the second dummy wire is connected to the second end of the second connecting wire; and an extending direction of the first dummy wire intersects with an extending direction of the first connecting wire, and an extending direction of the second dummy wire intersects with an extending direction of the second connecting wire.

At least one embodiment of the present disclosure further provides a display substrate, having a first side for display and a second side opposite to the first side, and including: a base substrate, including: a display region, wherein the display region includes a first display region and a second display region at least partially surrounding the first display region, wherein the first display region includes a first sub-pixel array, and the first display region allows light from the first side of the display substrate to be at least partially transmitted to the second side of the display substrate, the first sub-pixel array includes a plurality of light-emitting devices arranged in array, and the plurality of light-emitting devices include a first light-emitting device and a second light-emitting device, the second display region includes a first pixel drive circuit array, the first pixel drive circuit array includes a plurality of first pixel drive circuit units, and the plurality of first pixel drive circuit units include a first pixel drive circuit and a second pixel drive circuit: a first insulating layer, disposed on the base substrate, wherein the first insulating layer includes a first via hole and a second via hole, and the first via hole and the second via hole respectively expose the first pixel drive circuit and the second pixel drive circuit: a first connecting wire, located in the first display region and the second display region, wherein the first connecting wire is located on a side of the first insulating layer away from the base substrate, a first end of the first connecting wire is formed to be electrically connected to the first pixel drive circuit through the first via hole, and a second end of the first connecting wire is electrically connected to the first light-emitting device: a second insulating layer, disposed on a side of the first insulating layer away from the base substrate, wherein the second insulating layer includes a plurality of via holes, and the plurality of via holes of the second insulating layer are formed for electrical connection to the first light-emitting device, the second light-emitting device, the first pixel drive circuit and the second pixel drive circuit: a second connecting wire, located in the first display region and the second display region, wherein the second connecting wire is located on a side of the second insulating layer away from the base substrate, a first end of the second connecting wire is formed to be electrically connected to the second pixel drive circuit through the second via hole and one of the plurality of via holes in the second insulating layer for connection to the second pixel drive circuit, and a second end of the second connecting wire is electrically connected to the second light-emitting device; and a third insulating layer, disposed on the side of the second insulating layer away from the base substrate, wherein the third insulating layer includes a plurality of via holes, wherein positions of the plurality of via holes of the third insulating layer are in one-to-one correspondence with positions of the plurality of via holes of the second insulating layer, so as to form a plurality of via holes penetrating through the second insulating layer and the third insulating layer.

For example, in the display substrate provided by at least one embodiment of the present disclosure, each of the plurality of light-emitting devices includes a first electrode, the first electrode of the first light-emitting device is connected to the second end of the first connecting wire through via holes of the second insulating layer and the third insulating layer, and the first electrode of the second light-emitting device is connected to the second end of the second connecting wire through a via hole of the third insulating layer.

For example, in the display substrate provided by at least one embodiment of the present disclosure, the plurality of via holes of the second insulating layer include a third via hole, a fourth via hole, a fifth via hole and a sixth via hole, the third via hole and the fourth via hole are located in the first display region, the third via hole exposes the second end of the first connecting wire, and an orthographic projection of the fourth via hole on the base substrate overlaps with an orthographic projection of the second end of the second connecting wire on the base substrate; and the fifth via hole and the sixth via hole are located in the second display region, an orthographic projection of the fifth via hole on the base substrate overlaps with an orthographic projection of the first via hole of the first insulating layer on the base substrate, the fifth via hole exposes the first end of the first connecting wire, and an orthographic projection of the sixth via hole on the base substrate overlaps with an orthographic projection of the second via hole of the first insulating layer on the base substrate.

For example, in the display substrate provided by at least one embodiment of the present disclosure, the first end of the second connecting wire is electrically connected to the second pixel drive circuit through the second via hole of the first insulating layer and the sixth via hole of the second insulating layer, and the second end of the second connecting wire is used to electrically connect to the second light-emitting device.

For example, in the display substrate provided by at least one embodiment of the present disclosure, the plurality of via holes of the third insulating layer include a seventh via hole, an eighth via hole, a ninth via hole and a tenth via hole, the seventh via hole and the eighth via hole are located in the second display region, an orthographic projection of the ninth via hole on the base substrate overlaps with an orthographic projection of the third via hole of the second insulating layer on the base substrate, the ninth via hole exposes the second end of the first connecting wire, an orthographic projection of the tenth via hole on the base substrate overlaps with an orthographic projection of the fourth via hole of the second insulating layer on the base substrate, and the tenth via hole exposes the second end of the second connecting wire; and the ninth via hole and the tenth via hole are located in the first display region, an orthographic projection of the seventh via hole on the base substrate overlaps with orthographic projections of the first via hole of the first insulating layer and the fifth via of the second insulating layer on the base substrate, and the seventh via hole exposes the first end of the first connecting wire, an orthographic projection of the eighth via hole on the base substrate overlaps with orthographic projections of the second via hole of the first insulating layer and the sixth via hole of the second insulating layer on the base substrate, and the eighth via hole exposes the first end of the second connecting wire.

For example, in the display substrate provided by at least one embodiment of the present disclosure, the first electrode of the first light-emitting device is connected to the second end of the first connecting wire through the third via hole of the second insulating layer and the ninth via hole of the third insulating layer, and the first electrode of the second light-emitting device is connected to the second end of the second connecting wire through the tenth via hole of the third insulating layer.

For example, in the display substrate provided by at least one embodiment of the present disclosure, the first light-emitting device further includes a first protective layer, and the second light-emitting device further includes a second protective layer; and the first protective layer covers the seventh via hole of the third insulating layer and the fifth via hole of the second insulating layer, and the second protective layer covers the eighth via of the third insulating layer.

For example, the display substrate provided by at least one embodiment of the present disclosure, further includes a first pad layer and a second pad layer, wherein the first pad layer at least partially covers the second via hole of the first insulating layer and is electrically connected to the second pixel drive circuit: the sixth via hole of the second insulating layer at least partially exposes the first pad layer, so as to allow the second connecting wire to be electrically connected to the second pixel drive circuit through the first pad layer; and the second pad layer is electrically connected to the second end of the second connecting wire, and the fourth via hole of the second insulating layer at least partially exposes the second pad layer.

For example, the display substrate provided by at least one embodiment of the present disclosure, further includes a third pad layer and a fourth pad layer, wherein the third pad layer at least partially overlaps with the fifth via hole of the second insulating layer, so as to be electrically connected to the first end of the first connecting wire, and the seventh via hole of the third insulating layer at least partially exposes the third pad layer; and the fourth pad layer at least partially overlaps the third via hole of the second insulating layer and is electrically connected to the second end of the first connecting wire, and the ninth via hole of the third insulating layer at least partially exposes the fourth pad layer.

For example, the display substrate provided by at least one embodiment of the present disclosure, further includes a pixel defining layer disposed on a side of the first electrodes of the plurality of light-emitting devices and the third insulating layer away from the base substrate, wherein the pixel defining layer includes a plurality of first pixel openings, and the plurality of first pixel openings are in one-to-one correspondence with the plurality of light-emitting devices to form light-emitting regions of the plurality of light-emitting devices; and the plurality of light-emitting devices further include a first light-emitting layer and a second electrode, the second electrode is located on a side of the pixel defining layer away from the base substrate, and the first light-emitting layer is located in the first pixel opening and between the first electrode and the second electrode.

For example, the display substrate provided by at least one embodiment of the present disclosure, further includes a first dummy wire and a second dummy wire located in the first display region, wherein the first dummy wire is connected to the second end of the first connecting wire, and the second dummy wire is connected to the second end of the second connecting wire; and the first dummy wire and the first connecting wire are disposed in a same layer and formed integrally, the second dummy wire and the second connecting wire are disposed on a same layer and formed integrally, an extending direction of the first dummy wire intersects with an extending direction of the first connecting wire, and an extending direction of the second dummy wire intersects with an extending direction of the second connecting wire.

At least one embodiment of the present disclosure provides a display device, which includes any one of the display substrates described above.

BRIEF DESCRIPTION OF THE DRAWINGS

In order to more clearly illustrate the technical schemes of the embodiments of the present disclosure, the accompanying drawings of the embodiments will be briefly described as below. It is obvious that the accompanying drawings in the following description are only related to some embodiments of the present disclosure, and thus are not intended to limit the present disclosure.

FIG. 8A-FIG. 8M are process views of a method of manufacturing a display substrate shown in FIG. 5A provided by some embodiments of the present disclosure:

FIG. 9A-FIG. 9F are process views of a method of manufacturing a display substrate shown in FIG. 5B provided by some embodiments of the present disclosure:

FIG. 10A-FIG. 10H are process views of a method of manufacturing a display substrate shown in FIG. 6A provided by some embodiments of the present disclosure.

DETAILED DESCRIPTION

In order to make objects, technical schemes and advantages of the embodiments of the disclosure apparent, the technical schemes of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. As used in the present disclosure, "first," "second," and similar terms do not indicate any sequence, amount, or importance, but are merely used to distinguish various components. Likewise, terms such as "a," "an," or "the" do not indicate a limitation of amount, but rather indicate the presence of at least one. The terms "comprise," "comprising," "include," "including," etc., are intended to specify that the elements or the objects stated before these terms encompass the elements or the objects and equivalents thereof listed after these terms. For the convenience of description, in some drawings, "top," "bottom," "front," and "back" are given. In the embodiments of the present disclosure, a vertical direction is a direction from top to bottom, and the vertical direction is the direction of gravity; and a horizontal direction is a direction perpendicular to the vertical direction, and the horizontal direction from right to left is the direction from front to back.

In order to maximize the display-to-body ratio of mobile display products, technologies such as notch screen, water drop screen, and hole-digging screen have appeared successively. This type of technology can be used to install sensors (such as image sensors, infrared sensors, distance sensors) and other components by digging a hole in a portion of a display region. This portion of the display region is designed as a light-transmitting display region, and a camera is placed under the light-transmitting display region to reduce the screen-to-body ratio problem caused by a camera occupying the frame. In this way, the light-transmitting display region can provide convenience for installing components such as sensors while realizing the display function, so that these sensors can perform, for example, imaging, infrared sensing, distance sensing and other functions through the light-transmitting display region without substantially affecting the display function of the light-transmitting display region, thus contributing to the realization of electronic equipment with a full screen.

Figure 1A:
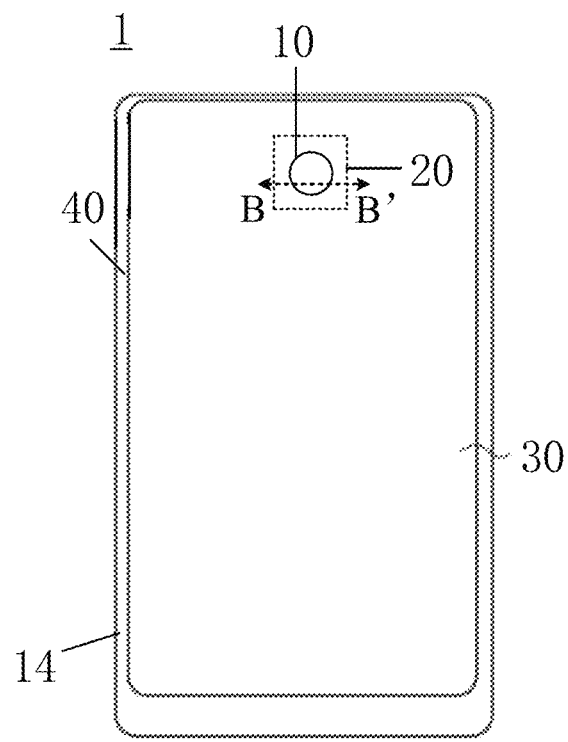
FIG. 1A is a schematic plan view of a display substrate.
Figure 1B:
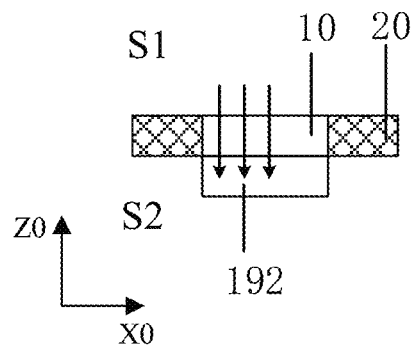
FIG. 1B is a schematic cross-sectional view along a line B-B' in FIG. 1A.
Figure 1C:
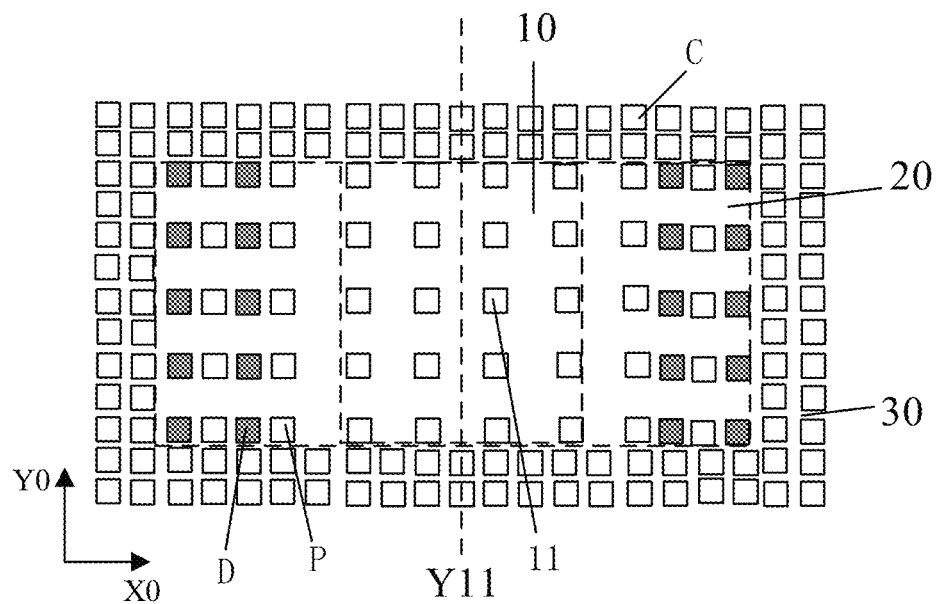
FIG. 1C is a partially enlarged schematic view of a display substrate.

For example, FIG. 1A is a schematic plan view of a display substrate. FIG. 1B is a schematic cross-sectional view along a line B-B' in FIG. 1A. FIG. 1C is a partially enlarged schematic view of a display substrate.

As shown in FIG. 1A, the display substrate 1 includes a base substrate 14. The base substrate 14 includes a display region and a peripheral region 40 surrounding the display region. The display region includes a light-transmitting display region 10, a peripheral display region 20 and a main display region 30 (e.g., a normal display region) that are arranged side by side. The peripheral display region 20 surrounds (e.g., at least partially surrounds) the light-transmitting display region 10. In FIG. 1A, the light-transmitting display region 10, the peripheral display region 20 and the main display region 30 form a rectangular or approximately rectangular display region as a whole to display a complete (rectangular) picture.

For example, as shown in FIG. 1B, the light-transmitting display region 10 allows an incident light from a display side S1 of the display substrate 1 to be transmitted through the light-transmitting display region 10 to reach a non-display side S2 of the display substrate 1. A sensor 192 may further be disposed on the non-display side S2 of the display substrate 1 to receive the light transmitted through the light-transmitting display region 10, thereby realizing corresponding functions (e.g., imaging, infrared sensing, distance sensing, etc.). The sensor 192 is disposed on the non-display side S2 of the display substrate 1 (by means of double-sided tape, etc.), the orthographic projection of the sensor 192 on the base substrate 14 at least partially overlaps with the light-transmitting display region 10, and the sensor 192 is configured to receive and process a light from the display side S1 of the display substrate 1. Therefore, the light-transmitting display region 10 provides convenience for the setting of the sensor 192 while realizing the display.

The sensor 192 is an image sensor, an infrared sensor, a distance sensor, etc., and the sensor 192 is, for example, implemented in the form of a chip or the like. The sensor 192 is disposed on the non-display side S2 of the display substrate.

As shown in FIG. 1C, the light-transmitting display region 10 includes a plurality of light-emitting devices 11 (white squares in the light-transmitting display region 10) arranged in array. The peripheral display region 20 includes a plurality of pixel circuit units D (gray squares in the peripheral display region 20) arranged in array. The peripheral display region 20 further includes a plurality of pixel units P arranged in array, and the pixel units P and the pixel circuit units D are alternately arranged. The normal display region 30 surrounds the peripheral display region 20, and the normal display region 30 includes a plurality of pixel units C (white squares in the normal display region 30) arranged in array.

The pixel circuit units D of the peripheral display region 20 are used to drive the plurality of light-emitting devices 11 in the light-transmitting display region 10 in a one-to-one correspondence, respectively. That is, the pixel circuits used for the light-transmitting display region 10 are arranged in the peripheral display region 20, such that the pixel circuit and the light-emitting device of each sub-pixel unit are separated from each other in position. The incident light from the display side S1 can be transmitted through a blank region between adjacent light-emitting devices 11 to ensure the light transmittance of the light-transmitting display region 10. The light-emitting device and the pixel circuit of the pixel unit P in the peripheral display region 20 are located in the same pixel region, and are not separated from each other in position. The light-emitting device and the pixel circuit of the pixel unit C in the normal display region 30 are located in the same pixel region, and are not separated from each other in position. The density of the array arrangement of the pixel units C in the normal display region 30 is greater than the density of the array arrangement of the pixel units P in the peripheral display region 20, while the density of the array arrangement of the pixel units P in the peripheral display region 20 is the same as the density of the array arrangement of the light-emitting devices 11 in the light-transmitting display region 10, so that the light-transmitting display region 10 and the peripheral display region 20 have the same resolution. The resolution of the normal display region 30 is greater than the resolution of the light-transmitting display region 10 and the resolution of the peripheral display region 20.

Figure 2A:
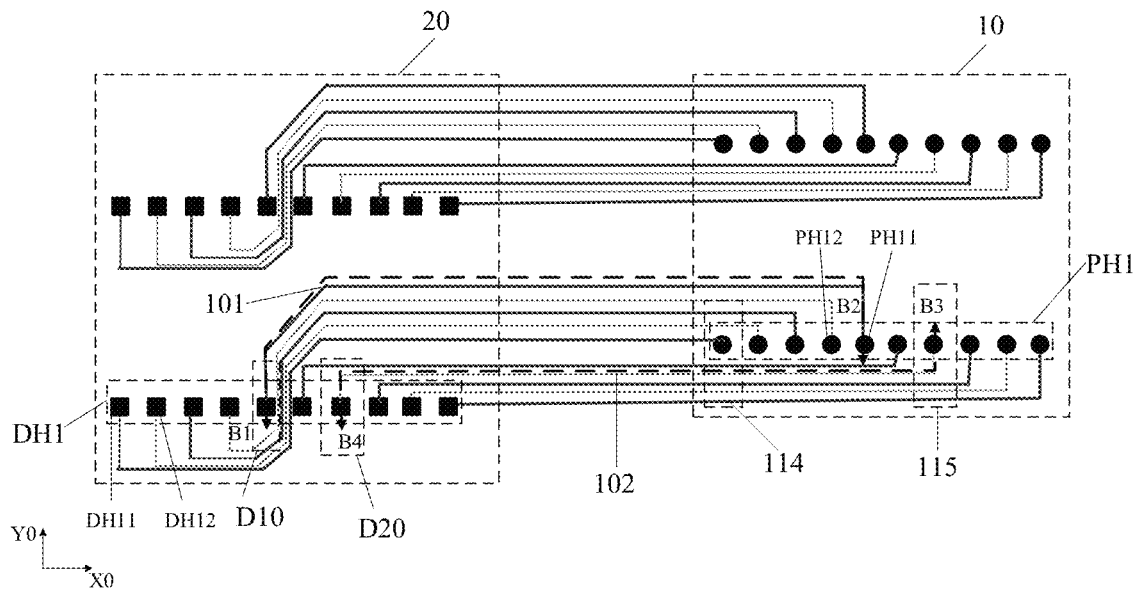
FIG. 2A is a schematic plan view of wiring arrangement in a display region of a display substrate.

FIG. 2A is a schematic plan view of wiring arrangement in a display region of a display substrate.

As shown in FIG. 2A, the plurality of light-emitting devices 11 in the light-transmitting display region 10 include a first light-emitting device 114 and a second light-emitting device 115. Correspondingly, the plurality of pixel circuit units D in the peripheral display region 20 include a first pixel circuit D10 and a second pixel circuit D20 for respectively receiving driving signals to drive the first light-emitting device 114 and the second light-emitting device 115 to emit light. The first light-emitting device 114 is correspondingly connected to the first pixel circuit D10 in a first direction X0, thereby functionally constituting a sub-pixel of the light-transmitting display region 10. The second light-emitting device 115 is correspondingly connected to the second pixel circuit D20 in the first direction X0, thereby functionally constituting a sub-pixel of the light-transmitting display region 10.

The display substrate 1 further includes a plurality of first connecting wires 101 (the wires with a darker color and a larger line width in FIG. 2A) and a plurality of second connecting wires 102 (the wires with a lighter color and a smaller line width in FIG. 2A). The plurality of first connecting wires 101 and the plurality of second connecting wires 102 generally extend along the first direction X0. The plurality of first connecting wires 101 and the plurality of first connecting wires 102 are arranged in parallel in the first direction X0, and orthographic projections of the plurality of first connecting wires 101 and the plurality of second connecting wires 102 on the base substrate 14 do not overlap with each other to avoid signal crosstalk between them. The plurality of first connecting wires 101 and the plurality of second connecting wires 102 are connected to the pixel circuits in the peripheral display region 20 and the light-emitting devices in the light-transmitting display region 10. The plurality of first connecting wires 101 are electrically connected to the plurality of first pixel circuits D10 and the plurality of first light-emitting devices 114 in one-to-one correspondence. The plurality of second connecting wires 102 are connected to the plurality of second pixel circuits D20 and the plurality of second light-emitting devices 115 in one-to-one correspondence, and the second pixel circuit D20 is configured to drive the second light-emitting devices 115 to emit light through the second connecting wires 102.

The first connecting wires 101 and the second connecting wires 102 are transparent conductive wires, and the first connecting wires 101 and the second connecting wires 102 located on the same side (an upper side or a lower side of the first light-emitting device 114) of the light-emitting device in the light-transmitting display region are alternately arranged. In order to reduce the wiring space of the first connecting wires 101 and the second connecting wires 102, the first connecting wires 101 and the second connecting wires 102 are located in different film layers to reduce the wiring space occupied by the first connecting wires 101 and the second connecting wires 102.

It should be noted that, the routing form of the first connecting wire 101 or the second connecting wire 102 shown in FIG. 2A is only an example, and the first connecting wire 101 and the second connecting wire 102 may also be straight wires, that is, having shapes without chamfers.

Figure 3A:
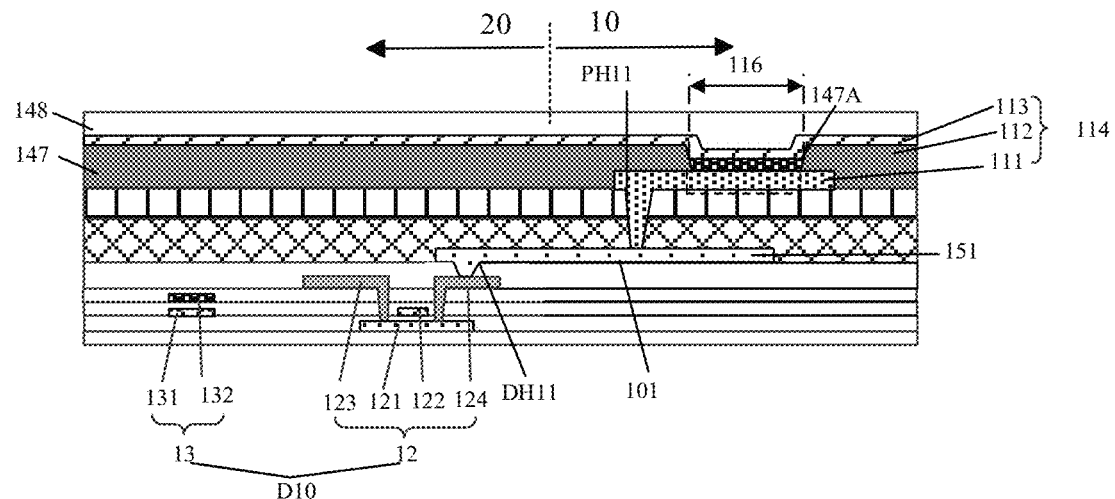
FIG. 3A is a schematic cross-sectional view along a line B1-B2 in FIG. 2A.

FIG. 3A is a schematic cross-sectional view along a line B1-B2 in FIG. 2A.

Figure 2B:
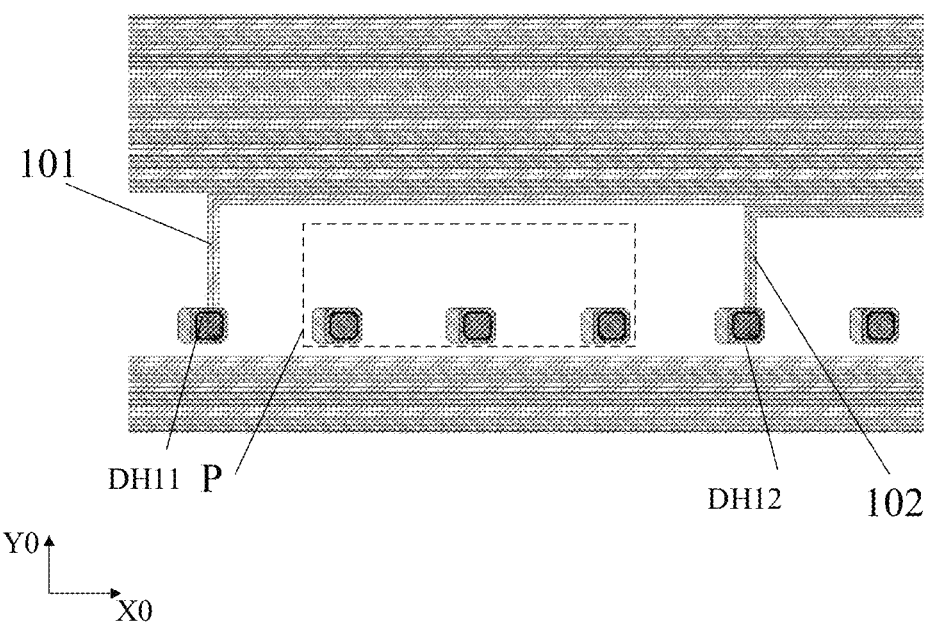
FIG. 2B is a partially enlarged schematic view of a peripheral display region of a display substrate.
Figure 3B:
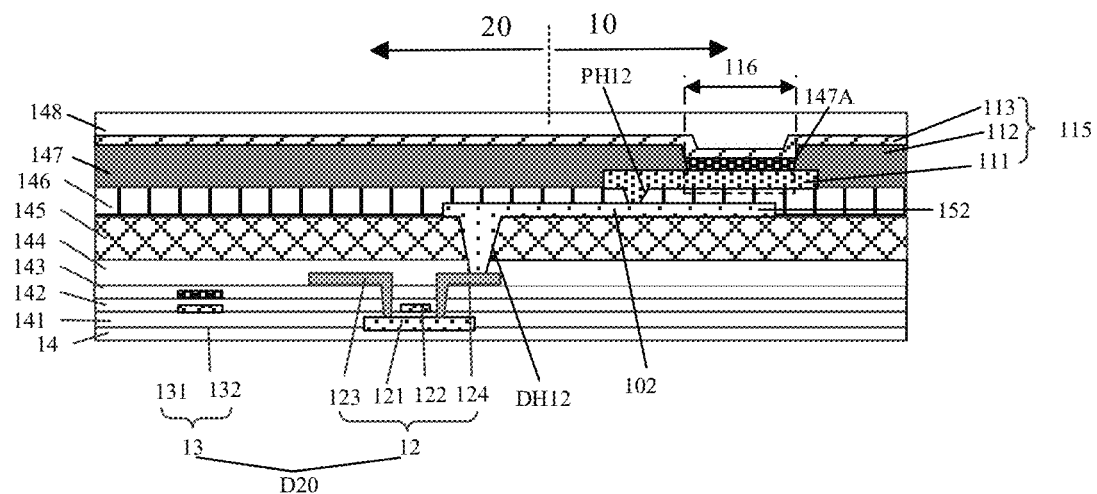
FIG. 3B is a schematic cross-sectional view along a line B3-B4 in FIG. 2B.

FIG. 3B is a schematic cross-sectional view along a line B3-B4 in FIG. 2B.

As shown in FIG. 3A and FIG. 3B, the display substrate 1 further includes a first planarization layer 144, a second planarization layer 145, a third planarization layer 146, a first wiring layer 151 and a second wiring layer 152.

The first planarization layer 144 is located on the side of the first pixel circuit D10 (shown in FIG. 3A) and the second pixel circuit D20 (shown in FIG. 3B) away from the base substrate 14 to provide a planarized surface, the second planarization layer 145 is located on the side of the first planarization layer 144 away from the base substrate 14 to provide a planarized surface, and the third planarization layer 146 is located on the side of the second planarization layer 145 away from the base substrate 14 to provide a planarized surface. The first wiring layer 151 is located between the first planarization layer 144 and the second planarization layer 145 (shown in FIG. 3A). The second wiring layer 152 is located on the side of the second planarization layer 145 away from the base substrate 14 (shown in FIG. 3B). The first light-emitting device 114 or the second light-emitting device 115 is located on the side of the third planarization layer 146 away from the base substrate 14. A first electrode 111 (anode) of the first light-emitting device 114 or the second light-emitting device 115 is located on the side of the third planarization layer 146 away from the base substrate 14.

For example, the materials of the first wiring layer 151 and the second wiring layer 152 include transparent conductive materials, for example, transparent metal oxides such as indium tin oxide (ITO), indium zinc oxide (IZO), etc., and the material of the metal wiring layer may include silver (Ag), aluminum (Al), molybdenum (Mo) or titanium (Ti) and other metal materials or their alloy materials.

As shown in FIG. 3A and FIG. 3B, the first connecting wire 101 is located in the first wiring layer 151. The second connecting wire 102 is located in the second wiring layer 152. The first connecting wire 101 and the second connecting wire 102 are respectively located in different film layers to reduce crosstalk between signals.

As shown in FIG. 3A and FIG. 3B, the display substrate 1 further includes a first pixel circuit connection hole DH11 and a second pixel circuit connection hole DH12. As shown in FIG. 3A, the first pixel circuit connection hole DH11 penetrates through the first planarization layer 144. The first connecting wire 101 located in the first wiring layer 151 is electrically connected to the first pixel circuit D10 through the first pixel circuit connection hole DH11. As shown in FIG. 3B, the second pixel circuit connection hole DH12 penetrates through the first planarization layer 144 and the second planarization layer 145, and the second connecting wire 102 located in the second wiring layer 152 is electrically connected to the second pixel circuit D20 through the second pixel circuit connection hole DH12.

As shown in FIG. 3A and FIG. 3B, the display substrate 1 further includes a first electrode connection hole PH11 and a second electrode connection hole PH12. As shown in FIG. 3A, the first electrode connection hole PH11 penetrates through the second planarization layer 144 and the third planarization layer 145, and the first connecting wire 101 located in the first wiring layer 151 is electrically connected to the first electrode 111 of the first light-emitting device 114 through the first electrode connection hole PH11. As shown in FIG. 3B, the second electrode connection hole PH12 penetrates through the third planarization layer 145, and the second connecting wire 102 located in the second wiring layer 152 is electrically connected to the first electrode 111 of the second light-emitting device 115 through the second electrode connection hole PH12.

As shown in FIG. 3A and FIG. 3B, the display substrate 1 further includes a pixel defining layer 147. The pixel defining layer 147 is located on the side of the first electrodes 111 of the first light-emitting device 114 and the second light-emitting device 115 away from the base substrate 14, and includes a plurality of first pixel openings 147A. The plurality of first pixel openings 147A are in one-to-one correspondence with the first light-emitting devices 114 and the second light-emitting devices 115, so as to form the light-emitting regions 116 of the first light-emitting devices 114 and the second light-emitting devices 115. Each of the plurality of light-emitting devices 11 further includes a first light-emitting layer 112 and a second electrode 113 (e.g., a cathode). The second electrode 113 is located on the side of the pixel defining layer 147 away from the base substrate 14. The light-emitting layer 112 is located in the first pixel opening 147 and is located between the first electrode 111 and the second electrode 113. A portion of the light-emitting layer 112 directly sandwiched between the first electrode 111 and the second electrode 112 will emit light after electrification, so that a region occupied by the portion corresponds to the above-mentioned light-emitting region 116.

The display substrate 1 further includes a first gate insulating layer 141, a second gate insulating layer 142, an interlayer insulating layer 143 and an encapsulation layer 148. Both the first pixel circuit D10 and the second pixel circuit D20 include a thin film transistor 12 and a storage capacitor 13. The thin film transistor 12 includes an active layer 121, a gate electrode 122, and source-drain electrodes (a source electrode 123 and a drain electrode 124). The storage capacitor 13 includes a first capacitor electrode plate 131 and a second capacitor electrode plate 132. The active layer 121 is disposed on the base substrate 14, the first gate insulating layer 141 is disposed on the side of the active layer 121 away from the base substrate 14, the gate electrode 122 and the first capacitor electrode plate 131 are disposed in the same layer and on the side of the first gate insulating layer 141 away from the base substrate 14, and the second gate insulating layer 142 is disposed on the side of the gate electrode 122 and the first capacitor electrode plate away from the base substrate 14. The second capacitor electrode plate 132 is disposed on the side of the second gate insulating layer 142 away from the base substrate 14, and the interlayer insulating layer 143 is disposed on the side of the second capacitor electrode plate 132 away from the base substrate 14. The source electrode 123 and the drain electrode 124 are disposed on the side of the interlayer insulating layer 143 away from the base substrate 14, and are electrically connected to the active layer 121 through the vias in the first gate insulating layer 141, the second gate insulating layer 142 and the interlayer insulating layer 143. The first wiring layer 151 is electrically connected to one of the source and drain electrodes (electrically connected to the drain electrode 124 as shown in FIG. 3A) through the first pixel circuit connection hole DH11 in the first planarization layer 144. The second wiring layer 152 is electrically connected to one of the source and drain electrodes (electrically connected to the drain electrode 124 as shown in FIG. 3B) through the second pixel circuit connection hole DH12 in the first planarization layer 144 and the second planarization layer 145. The encapsulation layer 148 is located on the side of the second electrode 113 away from the base substrate 148. The encapsulation layer 148 seals the first light-emitting device 114 and the second light-emitting device 115, so that deterioration of the light-emitting device 11 caused by moisture and/or oxygen included in the environment can be reduced or eliminated.

It should be noted that the first pixel circuit D10 and the second pixel circuit D20 may respectively be a pixel circuit of 2T1C type (that is, including two transistors and one capacitor), the two transistors are a data writing transistor and a driving transistor, respectively, and the one capacitor is a signal storage capacitor. The pixel circuit can generate a driving current for driving a light-emitting element to emit light according to a scan signal and a data signal that are received, and the light-emitting element emits light of different intensities according to the magnitude of the driving current. For example, the pixel circuit may also be another type of pixel circuit, for example, may further have a compensation function, a reset function, a sensing function, etc., and thus includes more than two thin film transistors.

As shown in FIG. 3A and FIG. 3B, in the case where the first connecting wire 101 is located between the first planarization layer 144 and the second planarization layer 145, and the second connecting wire 102 is located between the second planarization layer 145 and the third planarization layer 146, one reticle is needed to pattern and form the first wiring layer 151 where the first connecting wire 101 is located, for electrically connecting the first pixel circuit D10 and the first light-emitting device 114; one reticle is needed to pattern the second planarization layer 145 to form portions of the second pixel circuit connection hole DH12 and the first pixel circuit connection hole DH11 in the second planarization layer 145; one reticle is needed to pattern and form the second wiring layer 152 where the second connecting wire 102 is located, for electrically connecting the second pixel circuit D20 and the second light-emitting device 115; and one reticle is needed to pattern the third planarization layer 146 to form the second electrode connection hole PH12 and the first electrode connection hole PH11. Therefore, a total of four reticles are needed to complete the manufacture of the first wiring layer 151, the second planarization layer 145, the second wiring layer 152 and the third planarization layer 146, and the cost is relatively high.

Figure 2C:
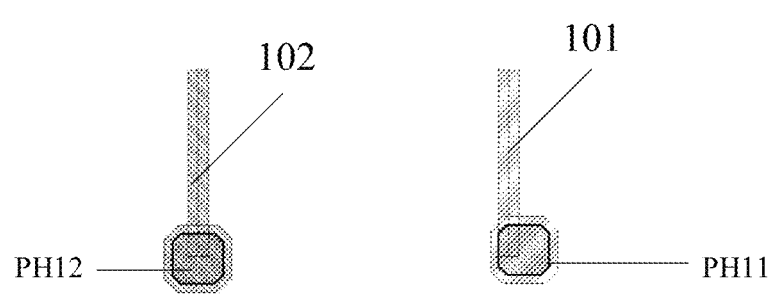
FIG. 2C is a partially enlarged schematic view of a light-transmitting display region of a display substrate.

FIG. 2B is a partially enlarged schematic view of a peripheral display region of a display substrate. FIG. 2C is a partially enlarged schematic view of a light-transmitting display region of a display substrate.

As shown in FIG. 2B and FIG. 2C, the first connecting wire 101 connects the first pixel circuit connection hole DH11 in the peripheral display region to the first electrode connection hole PH11 in the light-transmitting display region, and the second connecting wire 102 connects the second pixel circuit connection hole DH12 in the peripheral display region to the second electrode connection hole PH12 in the light-transmitting display region. In the peripheral display region, a pixel unit P in the peripheral display region is spaced between the first pixel circuit connection hole DH11 and the second pixel circuit connection hole DH12, resulting in that the distribution of the first connecting wire 101 and the second connecting wire 102 is not uniform, which may cause etching patterns and other phenomena.

At least one embodiment of the present disclosure provides a display substrate, and the display substrate has a first side for display and a second side opposite to the first side, and includes a base substrate, a first insulating layer disposed on the base substrate, a first connecting wire located in a first display region and a second display region, a second insulating layer disposed on the side of the first insulating layer away from the base substrate, a second connecting wire located in the first display region and the second display region, and a third insulating layer disposed on the side of the second insulating layer away from the base substrate. The base substrate includes a display region, and the display region includes the first display region and the second display region at least partially surrounding the first display region. The first display region includes a first sub-pixel array, and the first display region allows light from the first side of the display substrate to be at least partially transmitted to the second side of the display substrate. The first sub-pixel array includes a plurality of light-emitting devices arranged in array, and the plurality of light-emitting devices include a first light-emitting device and a second light-emitting device. The second display region includes a first pixel drive circuit array, the first pixel drive circuit array includes a plurality of first pixel drive circuit units, and the plurality of first pixel drive circuit units include a first pixel drive circuit and a second pixel drive circuit. The first insulating layer includes a first via hole and a second via hole, and the first via hole and the second via hole respectively expose the first pixel drive circuit and the second pixel drive circuit. The first connecting wire is located on the side of the first insulating layer away from the base substrate, a first end of the first connecting wire is formed to be connected to the first pixel drive circuit through the first via hole, and a second end of the first connecting wire is connected to the first light-emitting device. The second insulating layer includes a plurality of via holes, and the plurality of via holes of the second insulating layer are formed for connecting the first light-emitting device, the second light-emitting device, the first pixel drive circuit and the second pixel drive circuit. The second connecting wire is located on the side of the second insulating layer away from the base substrate, a first end of the second connecting wire is formed to be electrically connected to the second pixel drive circuit through the second via hole and the via hole in the second insulating layer for connecting the second pixel drive circuit, and a second end of the second connecting wire is electrically connected to the second light-emitting device. The third insulating layer includes a plurality of via holes, the positions of the plurality of via holes in the third insulating layer are in one-to-one correspondence with the positions of the plurality of via holes in the second insulating layer, so as to form a plurality of via holes penetrating through the second insulating layer and the third insulating layer, and the third insulating layer and the second insulating layer have substantially the same planar pattern.

In the display substrate of the above-mentioned embodiment, the third insulating layer and the second insulating layer have substantially the same planar pattern, so the third insulating layer and the second insulating layer can be formed by using the same reticle to perform a patterning process to reduce the manufacturing cost.

At least one embodiment of the present disclosure further provides a display device including the above-mentioned display substrate.

The embodiments of the present disclosure and examples thereof will be described in detail below with reference to the accompanying drawings.

Figure 4A:
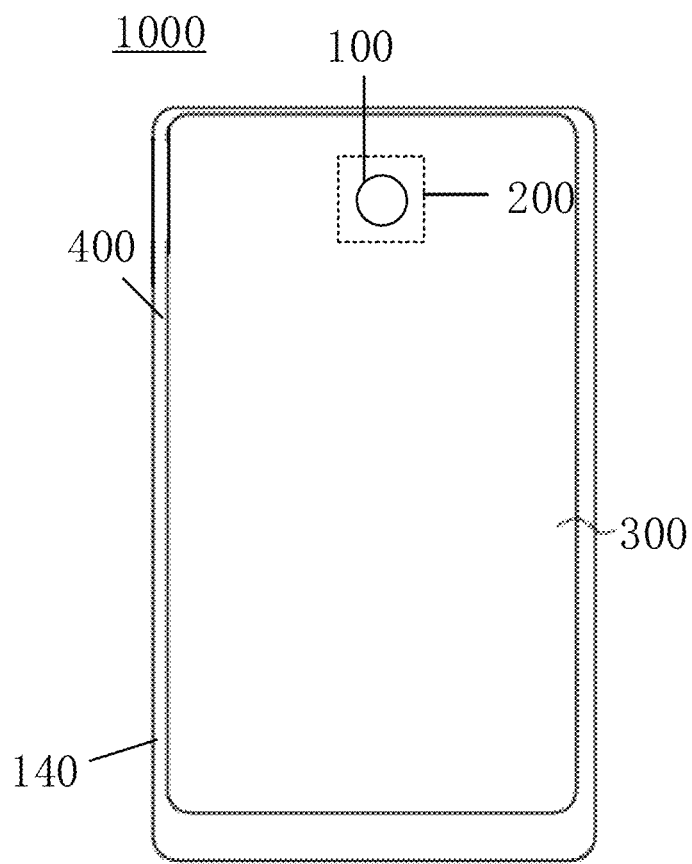
FIG. 4A is a schematic plan view of a display substrate provided by at least one embodiment of the present disclosure.

For example, FIG. 4A is a schematic plan view of a display substrate provided by at least one embodiment of the present disclosure. As shown in FIG. 4A, the display substrate 1000 provided by at least one embodiment of the present disclosure includes a base substrate 140. The base substrate 140 includes a display region, and the display region includes a first display region 100 (e.g., a light-transmitting display region), a second display region 200 (e.g., a low-resolution display region), and a third display region 300 (e.g., a normal display region). The second display region 200 surrounds (e.g., at least partially surrounds) the first display region 100. In FIG. 4A, the first display region 10, the second display region 20 and the third display region 30 form a rectangular or approximately rectangular display region as a whole to display a complete (rectangular) screen. For example, the display substrate 1000 further includes a peripheral region 400 surrounding the display region. For example, the first display region 100 allows incident light from a display side (e.g., a side facing the user) of the display substrate 1000 to be transmitted through the region to reach a non-display side (e.g., a side facing away from the user) of the display substrate 1000.

For example, the display substrate 1000 is a display substrate such as an organic light-emitting diode (OLED) display substrate or a quantum dot light-emitting diode (QLED) display substrate, and the embodiments of the present disclosure do not limit the specific type of the display substrate.

For example, a sensor (e.g., the sensor 192 as shown in FIG. 1B) may further be disposed on the non-display side of the display substrate 1000 to receive the transmitted light, thereby realizing corresponding functions (e.g., imaging, infrared sensing, distance sensing, etc.). The sensor is disposed on the non-display side of the display substrate 1000 (by means of double-sided tape, etc.), and the sensor is located (or partially located) in the first display region 100. Therefore, the first display region 10 provides convenience for the setting of the sensor while realizing the display. For example, the sensor is an image sensor, an infrared sensor, a distance sensor, etc., and the sensor is implemented in the form of a chip, for example.

Figure 4B:
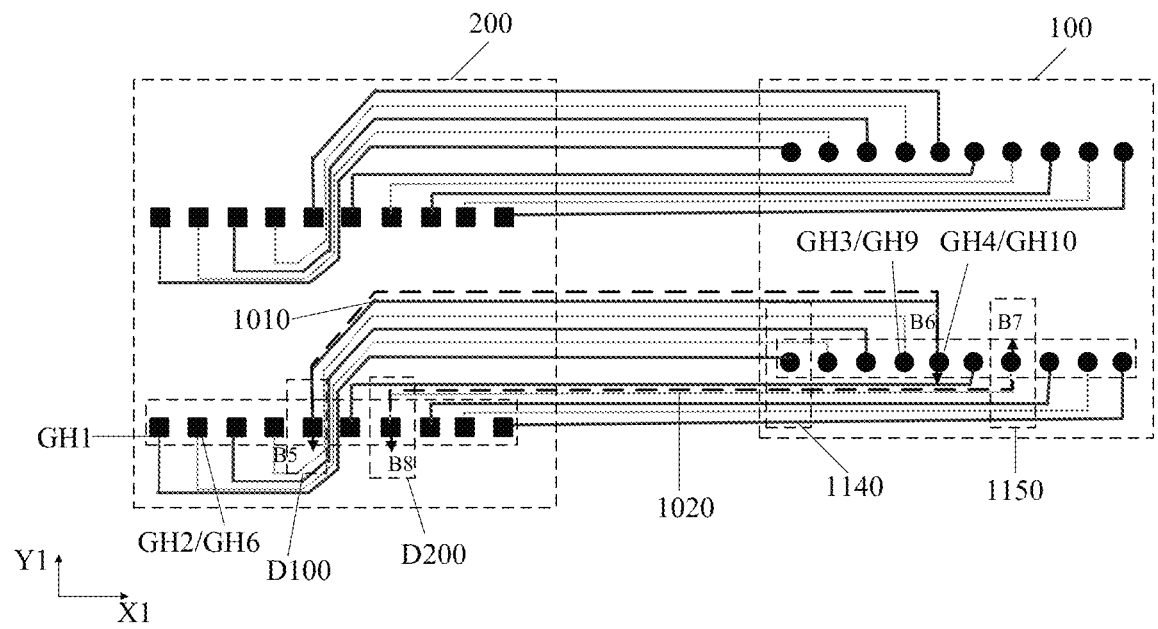
FIG. 4B is a schematic plan view of wiring arrangement in a display region of a display substrate provided by at least one embodiment of the present disclosure.

For example, as shown in FIG. 4B, the first display region 100 includes a first sub-pixel array, the first sub-pixel array includes a plurality of light-emitting devices arranged in array (the arrangement of the light-emitting devices 11 in FIG. 1C may be adopted), and the plurality of light-emitting devices include a first light-emitting device 1140 and a second light-emitting device 1150. The second display region 200 includes a first pixel drive circuit array, and the first pixel drive circuit array includes a plurality of first pixel drive circuit units (the arrangement of the pixel units D in the peripheral display region 20 in FIG. 1C may be adopted), and the plurality of first pixel drive circuit units include a first pixel drive circuit D100 and a second pixel drive circuit D200. The plurality of first pixel drive circuit units in the second display region 200 are configured to drive the plurality of light-emitting devices in the first display region 100 in one-to-one correspondence, respectively. That is, the pixel drive circuits for the first display region 10 are disposed in the second display region 200, so that the pixel drive circuit and the light-emitting device of the first sub-pixel are separated from each other in position. The incident light from the display side of the display substrate 1000 can be transmitted through blank regions between adjacent light-emitting devices to ensure the light transmittance of the first display region 100.

For example, as shown in FIG. 4B, the first pixel drive circuit D100, the second pixel drive circuit D200, the first light-emitting device 1140 and the second light-emitting device 1150 are located in a row (e.g., one of the two rows in FIG. 4B). The first light-emitting device 1140 is correspondingly connected to the first pixel drive circuit D100 in the first direction X1, thereby functionally constituting a sub-pixel in the first display region 100. The second light-emitting device 1150 is correspondingly connected to the second pixel drive circuit D200 in the first direction X1, thereby functionally constituting a sub-pixel in the first display region 100.

For example, as shown in FIG. 4B, the display substrate 1000 further includes a first connecting wire 1010 (a wire with a darker color and a larger line width in FIG. 4A) located in the first display region 100 and the second display region 200, and a second connecting wire 1020 (a wire with a lighter color and a smaller line width in FIG. 4A) located in the first display region 100 and the second display region 200. The first connecting wire 1010 and the second connecting wire 1020 generally extend along the first direction X1. The first connecting wire 1010 and the second connecting wire 1020 are arranged side by side and in parallel in the first direction X1, and the orthographic projections of the first connecting wire 1010 and the second connecting wire 1020 on the base substrate 100 do not overlap with each other to avoid signal crosstalk between them. For example, the first connecting wire 1010 is electrically connected to the first pixel drive circuit D100 and the first light-emitting device 1140. The first pixel drive circuit D100 is configured to drive the first light-emitting device 1140 to emit light through the first connecting wire 1010. That is, the first connecting wire 1010 electrically connects the first pixel drive circuit D100 and the first light-emitting device 1140 located in the same row. The second connecting wire 1020 electrically connects the second pixel drive circuit D200 and the second light-emitting device 1150, and the second pixel drive circuit D200 is configured to drive the second light-emitting device 1150 to emit light through the second connecting wire 1020. That is, the second connecting wire 1020 electrically connects the second pixel drive circuit D200 and the second light-emitting device 1150 located in the same row.

It should be noted that the routing form of the first connecting wires 1010 or the second connecting wires 102 shown in FIG. 4B is only an example, and the embodiments of the present disclosure are not limited thereto. The first connecting wires 1010 and the second connecting wires 1020 may also be straight wires, that is, having shapes without chamfers.

For example, the first connecting wires 1010 and the second connecting wires 1020 are transparent conductive wires.

For example, the materials of the first connecting wire 1010 and the second connecting wire 1010 include transparent conductive materials, such as transparent metal oxides such as indium tin oxide (ITO), indium zinc oxide (IZO).

Figure 5A:
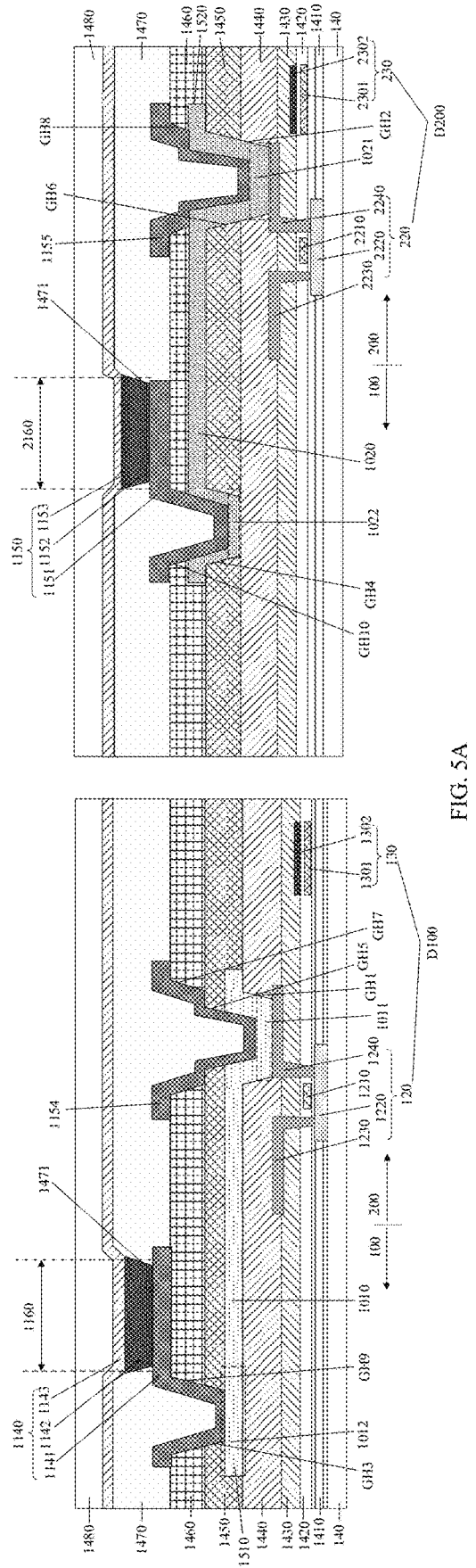
FIG. 5A is a schematic cross-sectional view of a display substrate provided by at least one embodiment of the present disclosure, along lines B5-B6 and B7-B8 in FIG. 4B.

FIG. 5A is a schematic cross-sectional view of a display substrate provided by at least one embodiment of the present disclosure along lines B5-B6 and B7-B8 in FIG. 4B. The line B5-B6 is along the first connecting wire 1010 and pass through the first light-emitting device 1140 located in the first display region 100 and the first pixel drive circuit D100 located in the second display region 200. The line B7-B8 is along the second connecting wire 1020 and passes through the second light-emitting device 1150 located in the first display region 100 and the second pixel drive circuit D200 located in the second display region 200.

For example, as shown in FIG. 5A, the display substrate 1000 further includes a first insulating layer 1440 (i.e., a first planarization layer), a second insulating layer 1450 (i.e., a second planarization layer), a third insulating layer 1460 (i.e., a third planarization layer), a first wiring layer 1510 and a second wiring layer 1520. The first insulating layer 1440 is disposed on the side of the first pixel drive circuit D100 and the second pixel drive circuit D200 away from the base substrate 140 to provide a planarized surface. The second insulating layer 1450 is located on the side of the first insulating layer 1440 away from the base substrate 140 to provide a planarized surface, the third insulating layer 1460 is located on the side of the second insulating layer 1450 away from the base substrate 140 to provide a planarized surface, and the first wiring layer 1510 is located between the first insulating layer 1440 and the second insulating layer 1450. The second wiring layer 1520 is located between the second insulating layer 1450 and the third insulating layer 1460. The first light-emitting device 1140 and the second light-emitting device 1150 are located on the side of the third insulating layer 1460 away from the base substrate 140.

For example, the materials of the first insulating layer 1440, the second insulating layer 1450 and the third insulating layer 1460 include inorganic insulating materials such as silicon oxide, silicon nitride, silicon oxynitride, or the like, and may also include organic insulating materials such as polyimide, polyphthalimide, polyphthalamide, acrylic resin, benzocyclobutene, or phenolic resin, or the like, which are not limited in the embodiments of the present disclosure.

For example, as shown in FIG. 5A, the first insulating layer 1440 includes a first via hole GH1 and a second via hole GH2. The first via hole GH1 exposes the first pixel drive circuit D100 for the electrical connection between the first connecting wire 1010 and the first pixel drive circuit D100, and the second via hole GH2 exposes the second pixel drive circuit D200 for the electrical connection between the second connecting wire 1020 and the second pixel drive circuit D200.

The first connecting wire 1010 is located in the first wiring layer 1510, that is, on the side of the first insulating layer 1440 away from the base substrate 140. A first end 1011 of the first connecting wire 1010 is formed to be electrically connected to the first pixel drive circuit D100 through the first via hole GH1, and a second end 1012 of the first connecting wire 1010 is electrically connected to the first light-emitting device 1140. Thus, the first pixel drive circuit D100 drives the first light-emitting device 1140 to emit light through the first connecting wire 1010.

The second insulating layer 1450 includes a plurality of via holes (e.g., including a third via hole GH3, a fourth via hole GH4, a fifth via hole GH5, and a sixth via hole GH6). The plurality of via holes of the second insulating layer 1450 are formed for electrically connecting the first light-emitting device 1140 (e.g., connected to the third via hole GH3), the second light-emitting device 1150 (e.g., connected to the fourth via hole GH4), the first pixel drive circuit D100 (e.g., connected to the fifth via hole GH5) and the second pixel drive circuit D200 (e.g., connected to the sixth via hole GH6).

The second connecting wire 1020 is located in the second wiring layer 1520, that is, on the side of the second insulating layer 1450 away from the base substrate 140. A first end 1021 of the second connecting wire 1020 is formed to be electrically connected to the second pixel drive circuit D200 through the second via hole GH2 and the via hole in the second insulating layer 1450 for connecting with the second pixel drive circuit D200 (e.g., connected to the sixth via hole GH6). A second end 1021 of the second connecting wire 1020 is electrically connected to the second light-emitting device D200. The first connecting wire 1010 and the second connecting wire 1020 are located in different film layers to reduce wiring space.

The third insulating layer 1460 includes a plurality of via holes (e.g., including a seventh via hole GH7, an eighth via hole GH8, a ninth via hole GH9, and a tenth via hole GH10). The positions of the via holes of the third insulating layer 1460 and the positions of the via holes of the second insulating layer 1450 are in one-to-one correspondence (for example, an orthographic projection of the ninth via hole GH9 on the base substrate 140 overlaps with an orthographic projection of the third via hole GH3 on the base substrate 140, an orthographic projection of the seventh via hole GH7 on the base substrate 140 overlaps with an orthographic projection of the fifth via hole GH5 on the base substrate 140, an orthographic projection of the eighth via hole GH8 on the base substrate 140 overlaps with an orthographic projection of the sixth via hole GH6 on the base substrate 140, and an orthographic projection of the tenth via hole GH10 on the base substrate 140 overlaps with an orthographic projection of the fourth via hole GH4 on the base substrate 140), so as to form a plurality of via holes penetrating through the second insulating layer 1450 and the third insulating layer 1460. The second insulating layer 1450 and the third insulating layer 1460 have substantially the same planar pattern, so that the second insulating layer 1450 and the third insulating layer 1460 can be formed by using the same reticle to perform a patterning process to reduce the manufacturing cost.

It should be noted that, "an orthographic projection overlaps with another orthographic projection" in the embodiments of the present disclosure includes the case where an orthographic projection partially overlaps with another orthographic projection.

For example, as shown in FIG. 5A, each of the plurality of light-emitting devices located in the first display region 100 includes a first electrode (e.g., an anode). The first light-emitting device 1140 (located in the figure on the left in FIG. 5A) includes a first electrode 1141, and the second light-emitting device 1150 (located in the figure on the right in FIG. 5A) includes a first electrode 1151. The first electrode 1141 of the first light-emitting device 1140 is connected to the second end 1012 of the first connecting wire 1010 through via holes of the second insulating layer 1450 and the third insulating layer 1460 (e.g., through the ninth via hole GH9 and the third via hole GH3). The first electrode 1151 of the second light-emitting device 1150 is connected to the second end 1022 of the second connecting wire 1020 through a via hole (e.g., the tenth via hole GH10) of the third insulating layer 1460. The first electrode 1141 of the first light-emitting device 1140 and the first electrode 1151 of the second light-emitting device 1150 are disposed in the same layer and made of the same material.

It should be noted that, in the embodiments of the present disclosure, "being disposed in the same layer" includes that two functional layers or structural layers are formed in the same layer and with the same material in the layered structure of the display substrate, that is, in a manufacturing process, the two functional layers or structural layers are formed with the same material layer, and the required patterns and structures can be formed through the same patterning process. one patterning process includes, for example, steps such as photoresist formation, exposure, development, and etching.

For example, the materials of the first electrode 1141 of the first light-emitting device 1140 and the first electrode 1151 of the second light-emitting device 1150 may respectively include at least one transparent conductive oxide material, including indium tin oxide (ITO), indium zinc oxide (IZO), zinc oxide (ZnO), etc. In addition, the first electrode 1141 of the first light-emitting device 1140 and the first electrode 1151 of the second light-emitting device 1150 may include a metal having high reflectivity serving as a reflective layer, such as silver (Ag).

For example, as shown in FIG. 5A, the plurality of via holes of the second insulating layer 1450 include a third via hole GH3, a fourth via hole GH4, a fifth via hole GH5 and a sixth via hole GH6. The third via hole GH3 and the fourth via hole GH4 are located in the first display region 100. The fifth via hole GH5 and the sixth via hole GH6 are located in the second display region 200. The third via hole GH3 exposes the second end 1012 of the first connecting wire 1010 for connecting the first electrode 1141 of the first light-emitting device 1140 to the first connecting wire 1010. The orthographic projection of the fourth via hole GH4 on the base substrate 140 overlaps with the orthographic projection of the second end 1022 of the second connecting wire 1020 on the base substrate 140, for connecting the first electrode 1151 of the second light-emitting device 1150 to the second connecting wire 1020. The orthographic projection of the fifth via hole GH5 on the base substrate 140 overlaps with the orthographic projection of the first via hole GH1 of the first insulating layer 1440 on the base substrate 140, and the fifth via hole GH5 exposes the first end 1011 of the first connecting wire 1010. The orthographic projection of the sixth via hole GH6 on the base substrate 140 overlaps with the orthographic projection of the second via hole GH2 of the first insulating layer 1440 on the base substrate 140 for electrically connecting the second pixel drive circuit D200 through the second connecting wire 1020.

For example, as shown in FIG. 5A, the first end 1021 of the second connecting wire 1020 is electrically connected to the second pixel drive circuit D200 through the second via hole GH2 in the first insulating layer 1440 and the sixth via hole GH6 in the second insulating layer 1450. The second end 1022 of the second connecting wire 1020 covers the fourth via hole GH4 in the second insulating layer 1450 and is used to connect to the second light-emitting device 1150 (e.g., through the tenth via hole GH10 in the third insulating layer 1460). Thus, the second pixel drive circuit D200 is configured to drive the second light-emitting device 1150 to emit light through the second connecting wire 1020.

For example, as shown in FIG. 5A, the plurality of via holes of the third insulating layer 1460 include a seventh via hole GH7, an eighth via hole GH8, a ninth via hole GH9 and a tenth via hole GH10. The seventh via hole GH7 and the eighth via hole GH8 are located in the second display region 200. The ninth via hole GH9 and the tenth via hole GH10 are located in the first display region 100. The orthographic projection of the ninth via hole GH9 on the base substrate 140 overlaps with the orthographic projection of the third via hole GH3 of the second insulating layer 1450 on the base substrate 140, and the ninth via hole GH9 exposes the second end 1012 of the first connecting wire 1010 to allow the second end 1012 of the first connecting wire 1010 to be electrically connected to the first electrode 1141 of the first light-emitting device 1140. The orthographic projection of the tenth via hole GH10 on the base substrate 140 overlaps with the orthographic projection of the fourth via hole GH4 of the second insulating layer 1450 on the base substrate 140, and the tenth via hole GH10 exposes the second end 1022 of the second connecting wire 1020 to allow the second end 1022 of the second connecting wire 1020 to be electrically connected to the first electrode 1151 of the second light-emitting device 1150. The orthographic projection of the seventh via hole GH7 on the base substrate 140 overlaps with the orthographic projections of the first via hole GH1 of the first insulating layer 1440 and the fifth via hole GH5 of the second insulating layer 1450 on the base substrate 140, and the seventh via hole GH7 (and the fifth via hole GH5) exposes the first end 1011 of the first connecting wire 1010. The orthographic projection of the eighth via hole GH8 on the base substrate 140 overlaps with the orthographic projections of the second via hole GH2 of the first insulating layer 1440 and the sixth via hole GH6 of the second insulating layer 1450 on the base substrate 140, and the eighth via hole GH8 exposes the first end 1021 of the second connecting wire 1020.

For example, as shown in FIG. 5A, the orthographic projection of the ninth via hole GH9 of the second insulating layer 1450 on the base substrate 140 overlaps with the orthographic projection of the third via hole GH3 of the first insulating layer 1440 on the base substrate 140, the orthographic projection of the seventh via hole GH7 of the second insulating layer 1450 on the base substrate 140 overlaps with the orthographic projection of the fifth via hole GH5 of the first insulating layer 1440 on the base substrate 140, the orthographic projection of the eighth via hole GH8 of the second insulating layer 1450 on the base substrate 140 overlaps with the orthographic projection of the sixth via hole GH6 of the first insulating layer 1440 on the base substrate 140, and the orthographic projection of the tenth via hole GH10 of the second insulating layer 1450 on the base substrate 140 overlaps with the orthographic projection of the fourth via hole GH4 of the first insulating layer 1440 on the base substrate 140, thereby forming via hole sets between the second insulating layer 1450 and the first insulating layer 1440, so that the second insulating layer 1450 and the first insulating layer 1440 can be formed by using the same reticle to perform a patterning process to reduce manufacturing cost.

For example, as shown in FIG. 5A, the first electrode 1141 of the first light-emitting device 1140 is connected to the second end 1012 of the first connecting wire 1010 through the third via hole GH3 of the second insulating layer 1450 and the ninth via hole GH9 of the third insulating layer 1450. The first electrode 1151 of the second light-emitting device 1150 is connected to the second end 1022 of the second connecting wire 1020 through the tenth via hole GH10 of the third insulating layer 1450.

For example, as shown in FIG. 5A, the first light-emitting device 1140 further includes a first protective layer 1154, and the second light-emitting device 1150 further includes a second protective layer 1155. The first protective layer 1154 covers the seventh via hole GH7 of the third insulating layer 1460, and the second protective layer 1155 covers the eighth via hole GH8 of the third insulating layer 1460. The first protective layer 1154 further covers the surface of the side of the first end 1011 of the first connecting wire 1010 away from the base substrate 140, and the second protective layer 1155 further covers the surface of the side of the first end 1021 of the second connecting wire 1020 away from the base substrate 140, so as to protect the first connecting wire 1010 and the second connecting wire 1020 to prevent them from being damaged in subsequent manufacturing processes, such as corroded by an etching solution.

For example, as shown in FIG. 5A, the display substrate 1000 further includes the first electrode 1141 of the first light-emitting device 1140, the first electrode 1151 of the second light-emitting device 1150, and a pixel-defining layer 1470 disposed on the side of the third insulating layer 1460 away from the base substrate 140. The pixel defining layer 1470 includes a plurality of first pixel openings 1471. The plurality of first pixel openings 1471 are in one-to-one correspondence with the first light-emitting device 1140 and the second light-emitting device 1150 to form a light-emitting region 1160 of the first light-emitting device 1140 and a light-emitting region 2160 of the second light-emitting device 1150. The first light-emitting device 1140 further includes a first light-emitting layer 1142 and a second electrode 1143 (e.g., a cathode) (located in the figure on the left in FIG. 5A), and the second light-emitting device 1150 further includes a first light-emitting layer 1152 and a second electrode 1153 (e.g., a cathode) (located in the figure on the right in FIG. 5A). The second electrode 1143 of the first light-emitting device 1140 and the second electrode 1153 of the second light-emitting device 1150 are located on the side of the pixel defining layer 1470 away from the base substrate 140. The first light-emitting layer 1142 of the first light-emitting device 1140 is located in the first pixel opening 1471 and between the first electrode 1141 and the second electrode 1143. The first light-emitting layer 1152 of the second light-emitting device 1150 is located in the first pixel opening 1471 and between the first electrode 1151 and the second electrode 1153. A portion of the first light-emitting layer 1142 directly sandwiched between the first electrode 1141 and the second electrode 1143 will emit light after electrification, and thus a region occupied by the portion corresponds to the light-emitting region 1160 of the first light-emitting device 1140. A portion of the first light-emitting layer 1152 directly sandwiched between the first electrode 1151 and the second electrode 1153 will emit light after electrification, and thus a region occupied by the portion corresponds to the light-emitting region 2160 of the second light-emitting device 1150.

It should be noted that the second electrode 1143 of the first light-emitting device 1140 and the second electrode 1153 of the second light-emitting device 1150 are disposed in the same layer and made of the same material. The second electrode 1143 of the first light-emitting device 1140 and the second electrode 1153 of the second light-emitting device 1150 can also be regarded as the same film layer, and in FIG. 5, which is regarded as the second electrode 1143 in the first light-emitting device 1140 and is regarded as the second electrode 1153 in the second light-emitting device 1150 for distinction.

For example, the first light-emitting layer 1142 of the first light-emitting device 1140 and the second light-emitting layer 1152 of the second light-emitting device 1150 are disposed in the same layer and made of the same material.

For example, the material of the pixel defining layer 1470 includes organic insulating materials such as polyimide, polyphthalimide, polyphthalamide, acrylic resin, benzocyclobutene, phenolic resin, or the like, or includes inorganic insulating materials such as silicon oxide, silicon nitride, or the like, which is not limited in the embodiments of the present disclosure.

For example, for an OLED, the first light-emitting layer 114 of the first light-emitting device 1140 and the second light-emitting layer 1150 of the second light-emitting device 1150 include small molecular organic materials or polymer molecular organic materials, which may be fluorescent light-emitting materials or phosphorescent light-emitting materials, and can emit a red light, a green light, a blue light, or can emit a white light; and, as required, the light-emitting layer may further include functional layers such as an electron injection layer, an electron transport layer, a hole injection layer, a hole transport layer, etc.

For a QLED, the light-emitting layer may include quantum dot materials, for example, silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, etc., and the particle size of the quantum dot is 2-20 nm.

For example, the second electrode 1143 of the first light-emitting device 1140 and the second electrode 1153 of the second light-emitting device 1150 may include various conductive materials. For example, the second electrode 1143 of the first light-emitting device 1140 and the second electrode 1153 of the second light-emitting device 1150 may include metal materials such as lithium (Li), aluminum (Al), magnesium (Mg), silver (Ag), or the like.

The embodiments of the present disclosure do not limit the pixel drive circuits (e.g., the first pixel drive circuit D100 and the second pixel drive circuit D200) of the sub-pixels. For example, the pixel drive circuit may be a pixel drive circuit of 2T1C type (that is, including two transistors and one capacitor), the two transistors are a data writing transistor and a driving transistor, respectively, and the one capacitor is a signal storage capacitor. The pixel drive circuit can generate a driving current for driving a light-emitting element to emit light according to a scan signal and a data signal that are received, and the light-emitting element emits light of different intensities according to the magnitude of the driving current. For example, the pixel drive circuit may also be another type of pixel drive circuit, for example, further has a compensation function, a reset function, a sensing function, etc., and thus may include more than two thin film transistors.

For example, as shown in FIG. 5A, the display substrate 1000 further includes a first gate insulating layer 1410, a second gate insulating layer 1420 and an interlayer insulating layer 1430. The first pixel drive circuit D100 includes a thin film transistor 120 and a storage capacitor 130. The thin film transistor 120 includes an active layer 1220, a gate electrode 1210, and source/drain electrodes (a source electrode 1230 and a drain electrode 1240). The storage capacitor 130 includes a first capacitor electrode plate 1301 and a second capacitor electrode plate 1302. The active layer 1220 is disposed on the base substrate 140, the first gate insulating layer 1410 is disposed on the side of the active layer 1220 away from the base substrate 140, the gate electrode 1210 and the first capacitor electrode plate 1301 are disposed in the same layer on the side of the first gate insulating layer 1410 away from the base substrate 140, and the second gate insulating layer 1420 is disposed on the side of the gate electrode 1210 and the first capacitor electrode plate 1301 away from the base substrate 140. The second capacitor electrode plate 1302 is disposed on the side of the second gate insulating layer 1420 away from the base substrate 140, and the interlayer insulating layer 1430 is disposed on the side of the second capacitor electrode plate 1320 away from the base substrate 140. The source electrode 1230 and the drain electrode 1240 are disposed on the side of the interlayer insulating layer 1430 away from the base substrate 140 and are electrically connected to the active layer 1220 through the via holes in the first gate insulating layer 1410, the second gate insulating layer 1420 and the interlayer insulating layer 1430. The first end 1011 of the first connecting wire 1010 is electrically connected to one of the source and drain electrodes (electrically connected to the drain electrode 1240 as shown in the figure on the left side of FIG. 5A) through the first via hole GH1 in the first insulating layer 1440.

For example, the materials of one or more of the first gate insulating layer 1410, the second gate insulating layer 1420 and the interlayer insulating layer 1430 include insulating materials such as silicon oxide, silicon nitride, silicon oxynitride, or the like. The materials of the first gate insulating layer 1410, the second gate insulating layer 1420 and the interlayer insulating layer 1430 may be the same or different.

For example, the material of the active layer 1220 may include polysilicon or oxide semiconductor (e.g., indium gallium zinc oxide). The material of the gate electrode 1210 may include a metal material or an alloy material, such as a metal single-layer or multi-layer structure formed by molybdenum, aluminum, titanium, or the like, for example, the multi-layer structure is a structure in which multiple metal layers are stacked (such as a three-layer metal stack of titanium, aluminum and titanium (Ti/Al/Ti)). The materials of the source electrode 1230 and the drain electrode 1240 include a metal material or an alloy material, such as a metal single-layer or a multi-layer structure formed of molybdenum, aluminum, and titanium, for example, the multi-layer structure is a structure in which multiple metal layers are stacked (such as a three-layer metal stack of titanium, aluminum and titanium (Ti/Al/Ti)). The embodiments of the present disclosure do not specifically limit the materials of each functional layer.

For example, a passivation layer may further be disposed between the first insulating layer 1440, and the source electrode 1230 and the drain electrode 1240. The passivation layer may be configured to include a via hole to expose one of the source electrode 1230 and the drain electrode 1240, for example, to expose the drain electrode 1240. The passivation layer can protect the source electrode 1230 and the drain electrode 1240 from being corroded by moisture. For example, the material of the passivation layer may include organic insulating material or inorganic insulating material, such as a silicon nitride material, because of its high dielectric constant and good hydrophobic function, which can well protect the first pixel drive circuit D100 or the second pixel drive circuit D200 from being corroded by moisture.

For example, as shown in FIG. 5A, the second pixel drive circuit D200 includes a thin film transistor 220 and a storage capacitor 230. The thin film transistor 220 includes an active layer 2210, a gate electrode 2220, and source/drain electrodes (a source electrode 2230 and a drain electrode 2240). The storage capacitor 230 includes a first capacitor electrode plate 2301 and a second capacitor electrode plate 2302. The active layer 2210 is disposed on the base substrate 240, and the gate electrode 2220 and the first capacitor electrode plate 2301 are disposed in the same layer on the side of the first gate insulating layer 1410 away from the base substrate 140. The second capacitor electrode plate 2302 is disposed on the side of the second gate insulating layer 1420 away from the base substrate 140. The source electrode 2230 and the drain electrode 2240 are disposed on the side of the interlayer insulating layer 1430 away from the base substrate 140 and are connected to the active layer 2210 through the via holes in the first gate insulating layer 1410, the second gate insulating layer 1420 and the interlayer insulating layer 1430. The first end 1021 of the second connecting wire 1020 is electrically connected to one of the source/drain electrodes (electrically connected to the drain electrode 2240 as shown in the figure on the right side of FIG. 5A) through the second via hole GH2 in the first insulating layer 1440 and the second insulating layer 1450.

For example, as shown in FIG. 5A, the display substrate 1000 further includes an encapsulation layer 1480. The encapsulation layer 1480 is located on the side of the first light-emitting device 1140 and the second light-emitting device 1150 away from the base substrate 140. The encapsulation layer 1480 seals the first light-emitting device 1140 and the second light-emitting device 1150, so that deterioration of the light-emitting device caused by moisture and/or oxygen included in the environment can be reduced or eliminated. The encapsulation layer 1480 is a single-layer structure or a composite-layer structure, and the composite-layer structure includes a structure in which an inorganic layer and an organic layer are stacked. The encapsulation layer 1480 includes at least one encapsulation sub-layer. For example, the encapsulation layer 1480 includes a first inorganic encapsulation layer, a first organic encapsulation layer, and a second inorganic encapsulation layer arranged in sequence.

For example, the material of the encapsulation layer 1480 may include an insulating material such as silicon nitride, silicon oxide, silicon oxynitride, or polymer resin, or the like. The inorganic material such as silicon nitride, silicon oxide, silicon oxynitride, or the like, has high compactness and can prevent the intrusion of moisture or oxygen. The material of the organic encapsulation layer is a polymer material containing a desiccant or a polymer material that can block moisture, etc., such as polymer resin, etc. to planarize the surface of the display substrate, and can relieve the stress of the first inorganic encapsulation layer and the second inorganic encapsulation layer, and can also include a water-absorbing material such as desiccant to absorb substances such as water, oxygen and the like intruding into the interior.

For example, other film layers, such as a buffer layer, a barrier layer, etc., may further be disposed between the base substrate 140 and the first gate insulating layer 1410, and the embodiments of the present disclosure are not limited thereto.

For example, as shown in FIG. 5A, the base substrate 140 may be a glass plate, a quartz plate, a metal plate, a resin-based plate, or the like. For example, the material of the base substrate includes an organic material, for example, the organic material may be a resin material such as polyimide, polycarbonate, polyacrylate, polyetherimide, polyethersulfone, polyethylene terephthalate, polyethylene naphthalate, or the like. For example, the base substrate 140 may be a flexible substrate or a non-flexible substrate, which is not limited in the embodiments of the present disclosure.

Figure 5B:
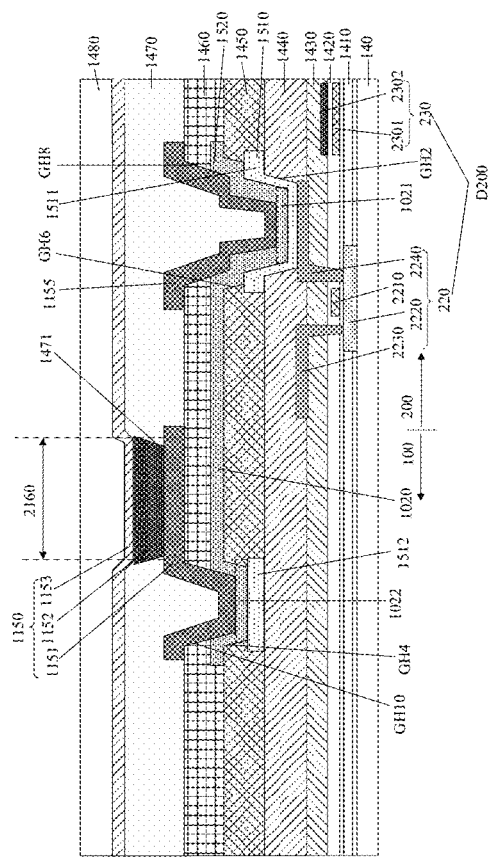
FIG. 5B is a schematic cross-sectional view of a display substrate provided by at least another embodiment of the present disclosure, along lines B5-B6 and B7-B8 in FIG. 4B.
Figure 5B:
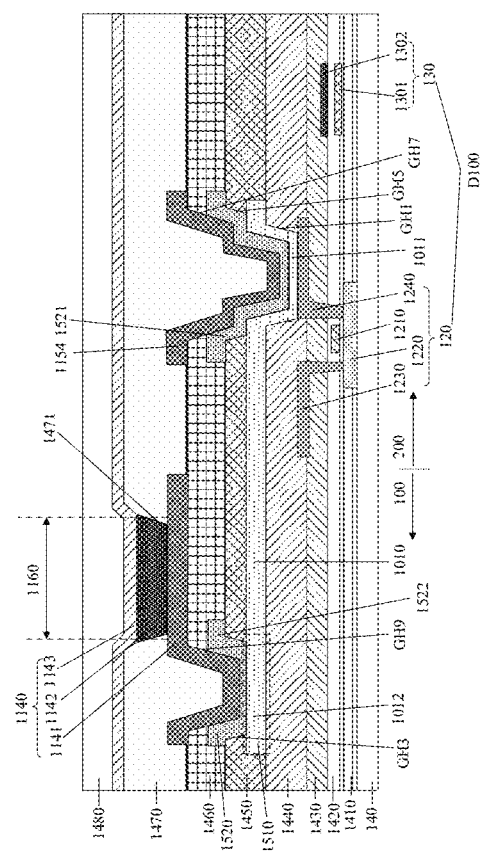

For example, FIG. 5B is a schematic cross-sectional view of a display substrate provided by at least another embodiment of the present disclosure, along lines B5-B6 and B7-B8 in FIG. 4B. The display substrate 1000 further includes a first pad layer 1511 and a second pad layer 1512. The first pad layer 1511 and the second pad layer 1512 are located in the first wiring layer 1510, that is, are disposed in the same layer and made of the same material as the first connecting wire 1010. The first pad layer 1511 covers (e.g., partially covers) the second via hole GH2 of the first insulating layer 1440 and is electrically connected to the second pixel drive circuit D200 (e.g., connected to the drain electrode 2240 of the thin film transistor 220). The first pad layer 1511 is located on the side of the second connecting wire 1020 close to the base substrate 140 and is connected to the second connecting wire 1020 to electrically connect the second connecting wire 1020 to the second pixel drive circuit D200 (e.g., to the drain electrode 2240 of the thin film transistor 220). The sixth via hole GH6 of the second insulating layer 1450 exposes (e.g., partially exposes) the first pad layer 1511 to allow the second connecting wire 1020 to be electrically connected to the second pixel drive circuit through the first pad layer 1511. The second pad layer 1512 is located on the side of the second end 1021 of the second connecting wire 1020 close to the base substrate and is connected to the second end 1021 of the second connecting wire 1020, and the fourth via hole GH3 of the second insulating layer 1450 exposes the second pad layer 1512. The first pad layer 1511 can reduce the height of the via hole set formed by the first via hole GH1, the sixth via hole GH6 and the eighth via hole GH8, and the second pad layer 1512 can reduce the heights of the fourth via hole GH4 and the tenth via hole GH10, thereby improving the slope angles of the second connecting wire 1020 and the first electrode 1151 of the second light-emitting device 1150, and preventing the second connecting wire 1020 and the first electrode 1151 of the second light-emitting device 1150 from being broken.

For example, in other examples, the display substrate 1000 may further include one of the first pad layer 1511 and the second pad layer 1512, and the present disclosure is not limited thereto.

For example, as shown in FIG. 5B, the display substrate 1000 further includes a third pad layer 1521 and a fourth pad layer 1522. The third pad layer 1521 and the fourth pad layer 1522 are located in the second wiring layer 1520, that is, are disposed in the same layer and made of the same material as the second connecting wire 1020. A portion of the third pad layer 1521 overlaps with the fifth via hole GH5 of the second insulating layer 1450, that is, the third pad layer 1521 covers the fifth via hole GH5 to be electrically connected to the first end 1011 of the first connecting wire 1010. The third pad layer 1521 is located on the side of the first protective layer 1154 close to the base substrate 140 and is connected to the first protective layer 1154. The seventh via hole GH7 of the third insulating layer 1460 at least partially exposes the third pad layer 1521 to allow electrical connection to the first connecting wire 1010 through the third pad layer 1521. A portion of the fourth pad layer 1522 overlaps with the third via hole GH3 of the second insulating layer 1450 and covers the second end 1012 of the first connecting wire 1010, and the ninth via hole GH9 of the third insulating layer 1460 exposes (e.g., partially exposes) the fourth pad layer 1522. The fourth pad layer 1522 is located on the side of the first electrode 1141 of the first light-emitting device 1140 away from the base substrate and is connected to the portion of the first electrode 1141 located in the ninth via hole GH9, to electrically connect the first electrode 1141 to the first connecting wire 1010. The third pad layer 1521 can reduce the height of the via hole set formed by the seventh via hole GH7 and the fifth via hole GH5, and the fourth pad layer 1522 can reduce the height of the via hole set formed by the third via hole GH3 and the ninth via hole GH9, thereby improving the slope angle of the first electrode 1141 of the first light-emitting device 1140 and preventing the first electrode 1141 of the first light-emitting device 1140 from being broken.

For example, in other examples, the display substrate 1000 may further include one of the third pad layer 1521 and the fourth pad layer 1522, and the present disclosure is not limited thereto.

It should be noted that, the display substrate 1000 may include the first pad layer 1511 and the third pad layer 1521, but not include the second pad layer 1512 and the fourth pad layer 1522.

It should be noted that, the difference between the embodiment shown in FIG. 5B and the embodiment shown in FIG. 5A is that: the first pad layer 1511, the second pad layer 1512, the third pad layer 1521 and the fourth pad layer 1522 are added. The other same film layer structures of the embodiment shown in FIG. 5B and the embodiment shown in FIG. 5A will not be described again.

Figure 6A:
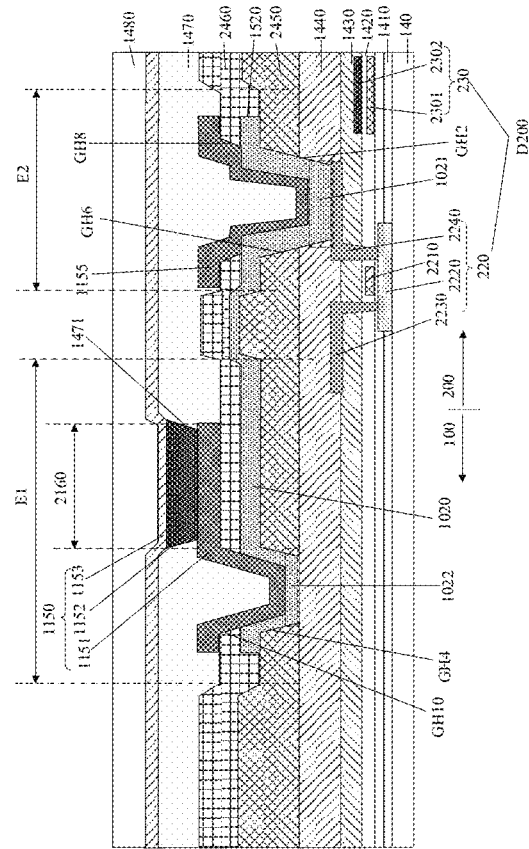
FIG. 6A is a schematic cross-sectional view of a display substrate provided by at least yet another embodiment of the present disclosure, along lines B5-B6 and B7-B8 in FIG. 4B.
Figure 6A:
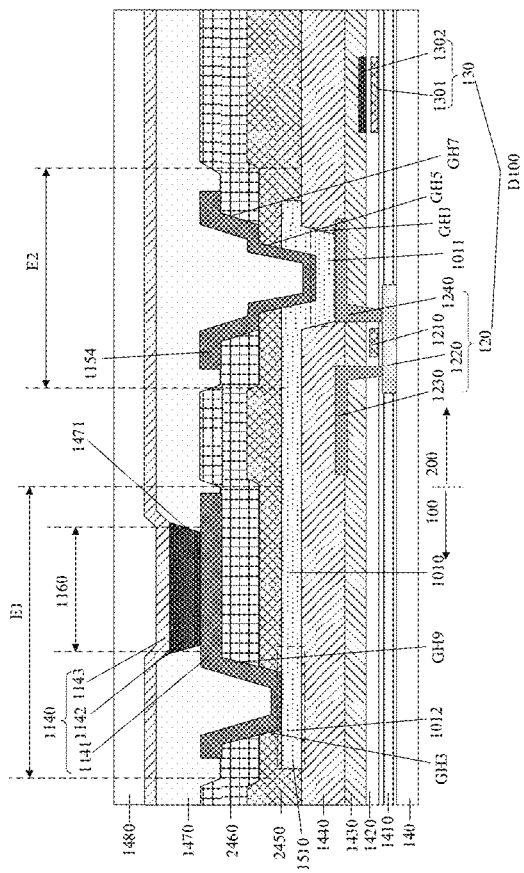

For example, FIG. 6A is a schematic cross-sectional view of a display substrate provided by at least yet another embodiment of the present disclosure along lines B5-B6 and line B7-B8 in FIG. 4B. Compared with the embodiment shown in FIG. 5A, in the embodiment shown in FIG. 6A, the second insulating layer 2450 in FIG. 6A is the same film layer as the second insulating layer 1450 in FIG. 5A, but the structure is changed due to the difference in the manufacturing method. As shown in FIG. 6A, the second insulating layer 2450 is patterned using a gray-tone reticle or a half-tone reticle (described in detail later), so that the second insulating layer 2450 has two portions with different thicknesses. It should be noted that, the thickness refers to a height in a direction perpendicular to the base substrate 140. For example, the second insulating layer 2450 includes a first portion with a higher thickness and a second portion with a lower thickness. The second portion of the second insulating layer 2450 with a lower thickness in an E1 region corresponds to the third via hole GH3 and the fourth via hole GH4, and the second portion of the second insulating layer 2450 with a lower thickness in an E2 region corresponds to the fifth via hole GH5 and the sixth via hole GH6. Therefore, by reducing the height of a portion of the second insulating layer 2450, the heights of the third via hole GH3, the fourth via hole GH4, the fifth via hole GH5 and the sixth via hole GH6 can be reduced, and the slope angles of the first connecting wire 1010 and the first electrode 1141 of the first light-emitting device 1140 can be improved, thereby preventing the first connecting wire 1010 and the first electrode 1141 of the first light-emitting device 1140 from being broken.

For example, compared with the embodiment shown in FIG. 5A, in the embodiment shown in FIG. 6A, the third insulating layer 2460 in FIG. 6A is the same film layer as the third insulating layer 1460 in FIG. 5A, but the structure is changed due to the difference in the manufacturing method. As shown in FIG. 6A, the third insulating layer 2460 is patterned using a gray-tone reticle or a half-tone reticle (described in detail later), so that the third insulating layer 2460 has two portions with different thicknesses. It should be noted that the thickness refers to a height in a direction perpendicular to the base substrate 140. The third insulating layer 2460 has two portions with different thicknesses, for example, including a first portion with a higher thickness and a second portion with a lower thickness. The second portion of the third insulating layer 2460 with a lower thickness in the E1 region corresponds to the ninth via hole GH9 and the tenth via hole GH10. The second portion of the third insulating layer 2460 with a lower thickness in the E2 region corresponds to the seventh via hole GH7 and the eighth via hole GH8. Therefore, by reducing the height of a portion of the third insulating layer 2460, the heights of the seventh via hole GH7, the eighth via hole GH8, the ninth via hole GH9 and the tenth via hole GH10 can be reduced, and the slope angles of the second connecting wire 1020 and the first electrode 1151 of the second light-emitting device 1150 can be improved, thereby preventing the second connecting wire 1020 and the first electrode 1151 of the second light-emitting device 1150 from being broken.

Figure 6B:
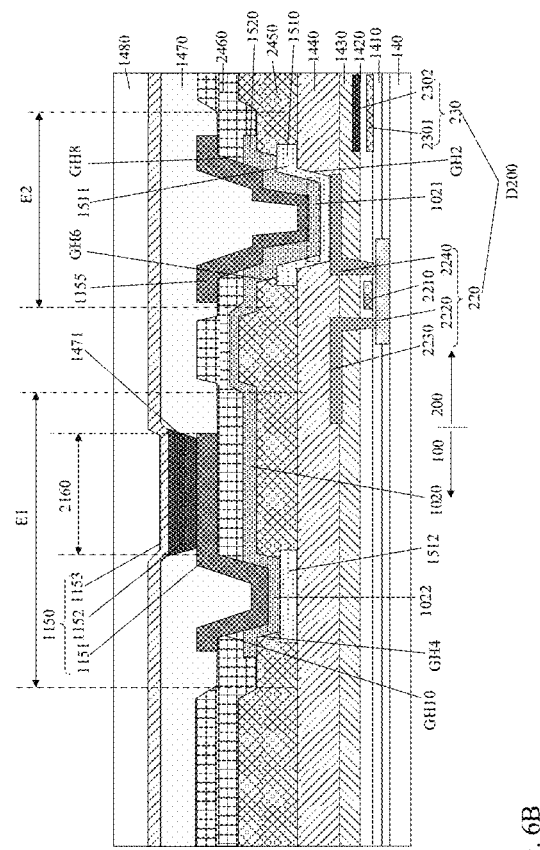
FIG. 6B is a schematic cross-sectional view of a display substrate provided by at least yet another embodiment of the present disclosure, along lines B5-B6 and B7-B8 in FIG. 4B.
Figure 6B:
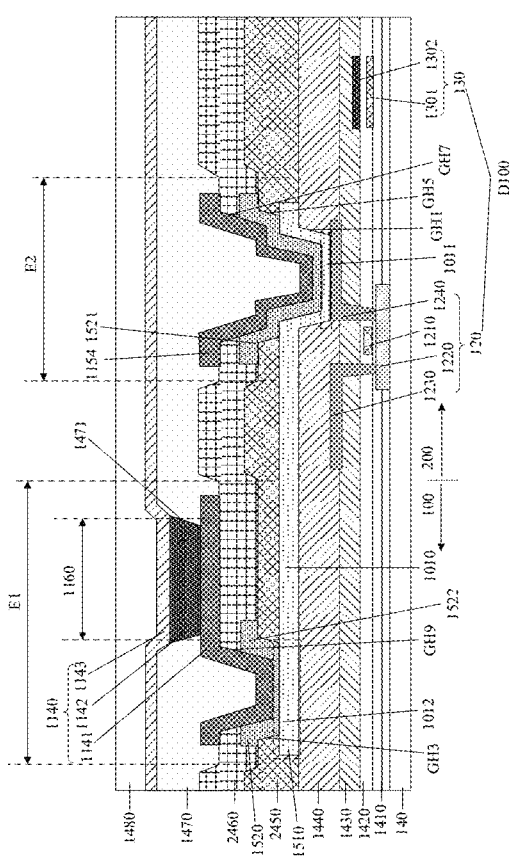

FIG. 6B is a schematic cross-sectional view of a display substrate provided by at least yet another embodiment of the present disclosure, along the line B5-B6 and the line B7-B8 in FIG. 4B. The embodiment shown in FIG. 6B corresponds to the embodiment shown in FIG. 5B, that is, the first pad layer 1511, the second pad layer 1512, the third pad layer 1521 and the fourth pad layer 1522 are added. The film layer structures of the second insulating layer 2450 and the third insulating layer 2460 in FIG. 6B are the same as the film layer structures of the second insulating layer 2450 and the third insulating layer 2460 shown in FIG. 6A, that is, the embodiment shown in FIG. 6B is obtained after combining the embodiments shown in FIG. 5B and FIG. 6A and details are not described again here.

Figure 7:
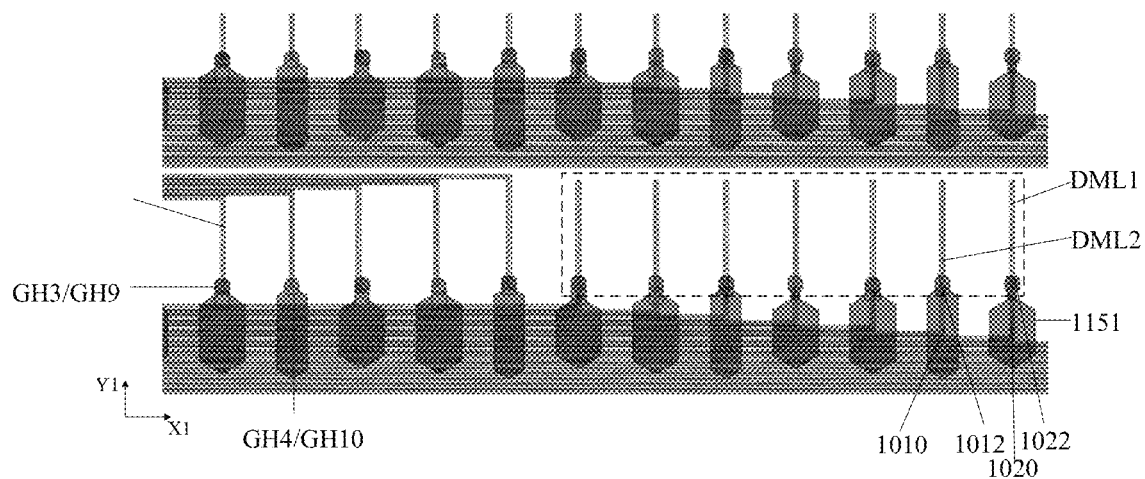
FIG. 7 is a partially enlarged schematic view of a second display region of a display substrate provided by at least one embodiment of the present disclosure.

For example, FIG. 7 is a partially enlarged schematic view of a second display region of a display substrate provided by at least one embodiment of the present disclosure. As shown in FIG. 7, the display substrate 1000 further includes first dummy wires DML1 and second dummy wires DML2 located in the first display region 100. The first dummy wire DML1 is connected to the second end 1012 of the first connecting wire 1010, and the second dummy wire DML2 is connected to the second end 1022 of the second connecting wire 1020. The first dummy wire DML1 and the first connecting wire 1010 are disposed in the same layer and integrally formed, and the second dummy wire DML2 and the second connecting wire 1020 are disposed in the same layer and integrally formed. The first dummy wires DML1 and the second dummy wires DML2 are located between the first connecting wires 1010 and the second connecting wires 1020 which are in two adjacent rows along a second direction Y1. The extending direction (e.g., the second direction Y1) of the first dummy wire DML1 intersects with the extending direction (e.g., the first direction X1) of the first connecting wire 1010, and the extending direction (e.g., the second direction Y1) of the second dummy wire DML2 intersects with the extending direction (e.g., the first direction X1) of the second connecting wire 1020. The setting of the first dummy wires DML1 and the second dummy wires DML2 can enable the wires of the first display region 100 more uniform, thereby enabling the light transmission of the first display region 100 uniform, and further improving the uniformity of wire etching in the first display region 100.

At least one embodiment of the present disclosure further provides a method of manufacturing a display substrate. The manufacturing method includes: providing a base substrate, the base substrate has a plurality of pixel drive circuits formed thereon, and the plurality of pixel drive circuits include a first pixel drive circuit and a second pixel drive circuit: forming a first insulating layer on the base substrate, and the first insulating layer is formed to partially expose the plurality of pixel drive circuits, respectively: forming a first wiring layer on the first insulating layer, and the first wiring layer includes a first connecting wire, and the first connecting wire is formed to be electrically connected to the first pixel drive circuit through the first insulating layer: forming and patterning a second insulating layer on the first wiring layer: forming a second wiring layer on the second insulating layer, and the second wiring layer includes a second connecting wire, and the second connecting wire is formed to be electrically connected to the second pixel drive circuit through the first insulating layer and the second insulating layers; and forming and patterning a third insulating layer on the second wiring layer, the third insulating layer and the second insulating layer are formed by using the same reticle to perform a patterning process to have substantially the same planar pattern.

In the display substrate manufactured by the above-mentioned manufacturing method, the third insulating layer and the second insulating layer are formed by using the same reticle to perform a patterning process to have substantially the same planar pattern, so that the manufacturing cost can be reduced.

A method of manufacturing the above-mentioned display substrate provided by at least one embodiment of the present disclosure is described in detail below with reference to the accompanying drawings.

FIG. 8A-FIG. 8M are process views of a method of manufacturing a display substrate shown in FIG. 5A provided by some embodiments of the present disclosure. Taking the display substrate shown in FIG. 5A as an example, a method of manufacturing a display substrate provided by at least one embodiment of the present disclosure is described with reference to FIG. 8A-FIG. 8M.

For example, the display substrate 1000 includes the first pixel drive circuit D100 and the second pixel drive circuit D200 located in the second display region 200, the first light-emitting device 1140 and the second light-emitting device 1150 located in the first display region 100, the first connecting wire 1010, the second connecting wire 1020, the first gate insulating layer 1410, the second gate insulating layer 1420, the interlayer insulating layer 1430, the first insulating layer 1440, the second insulating layer 1450, the third insulating layer 1460, the pixel defining layer 1470 and the encapsulation layer 1480.

For example, in some embodiments, a base substrate is provided.

For example, as shown in FIG. 8A, the base substrate 140 is provided. The base substrate 140 includes a display region including the first display region 100 (e.g., a light-transmitting display region) and the second display region 200 (e.g., a low-resolution display region). A plurality of pixel drive circuits are formed on the base substrate 140. The plurality of pixel drive circuits include the first pixel drive circuit D100 and the second pixel drive circuit D200.

For example, the material of the base substrate 140 includes an organic material, for example, the organic material is a resin material such as polyimide, polycarbonate, polyacrylate, polyetherimide, polyethersulfone, polyethylene terephthalate, polyethylene naphthalate, or the like. For example, the base substrate 140 may be a flexible substrate or a non-flexible substrate, which is not limited in the embodiments of the present disclosure.

For example, in the second display region 200 on the base substrate 140, an active layer 1220 (belonging to the thin film transistor 120 of the first pixel drive circuit D100) and an active layer 2220 (belonging to the thin film transistor 220 of the second pixel drive circuit D200) are formed. For example, a semiconductor material layer is deposited on the base substrate 140, and then a patterning process is performed on the semiconductor material layer to form the active layer 1220 and the active layer 2220. The active layer 1220 and the active layer 2220 respectively include a source region, a drain region, and a channel region between the source region and the drain region.

For example, the semiconductor materials of the active layer 1220 and the active layer 2220 may include polysilicon or oxide semiconductor (e.g., indium gallium zinc oxide) or the like.

For example, after the active layer 1220 and the active layer 2220 are formed, the first gate insulating layer 1410 may be formed on the active layer 1220 and the active layer 2220 by deposition or the like. The material of the first gate insulating layer 1410 may include, for example, an insulating material such as silicon oxide, silicon nitride, silicon oxynitride, or the like.

For example, after the first gate insulating layer 1410 is formed, a gate electrode 1210 (belonging to the thin film transistor 120 of the first pixel drive circuit D100), the first capacitor electrode plate 1301 (belonging to the storage capacitor 130 of the first pixel drive circuit D100), a gate electrode 2210 (belonging to the thin film transistor 220 of the second pixel drive circuit D200) and the first capacitor electrode plate 2301 (belonging to the storage capacitor 230 of the second pixel drive circuit D200) are formed on the first gate insulating layer 1410 in the second display region 200 by a patterning process. The materials of the gate electrode 1210, the first capacitor electrode plate 1301, the gate electrode 2210 and the first capacitor electrode plate 2301 may include a metal material or an alloy material, such as a metal single-layer or a multi-layer structure formed of molybdenum, aluminum, and titanium, for example, the multi-layer structure is a structure in which multiple metal layers are stacked (such as a three-layer metal stack of titanium, aluminum and titanium (Ti/Al/Ti)).

In some examples, the source region and the drain region of the active layer 1220 that are conductive are formed by doping the active layer 1220, using the gate electrode 1210 as a mask, and the source region and the drain region of the active layer 2220 that are conductive are formed by doping the active layer 2220 using the gate electrode 2210 as a mask, while the channel region between the source region and the drain region is not doped due to being masked by the gate electrode.

For example, after the gate electrode 1210, the first capacitor electrode plate 1301, the gate electrode 2210 and the first capacitor electrode plate 2301 are formed, an insulating material may be deposited on the base substrate 140 by a method such as deposition, etc., and a second gate insulating layer 1420 is formed on the gate electrode 1210, the first capacitor electrode plate 1301, the gate electrode 2210 and the first capacitor electrode plate 2301. The material of the second gate insulating layer 1420 includes, for example, an insulating material such as silicon oxide, silicon nitride, silicon oxynitride, or the like.

For example, a metal material layer is deposited on the base substrate 140 in the second display region 200: through a patterning process, the second capacitor electrode plate 1302 is formed at a portion of the metal material layer overlapping with the first capacitor electrode plate 1301, and the second capacitor electrode plate 2302 is formed at a portion of the metal material layer overlapping with the first capacitor electrode plate 2301. The first capacitor electrode plate 1301 and the second capacitor electrode plate 1302 are implemented as the storage capacitor 130, and the first capacitor electrode plate 2301 and the second capacitor electrode plate 2302 are implemented as the storage capacitor 230.

For example, after the second capacitor electrode plate 1302 and the second capacitor electrode plate 2302 are formed, the interlayer insulating layer 1430 is formed by deposition or the like, and the material of the interlayer insulating layer 1430 includes, for example, an insulating material such as silicon oxide, silicon nitride, silicon oxynitride, or the like.

For example, via holes are formed in the first gate insulating layer 1410, the second gate insulating layer 1420 and the interlayer insulating layer 1430 to expose the source region and the drain region of the active layer 1220 and the source region and the drain region of the active layer 2220.

For example, a metal material or an alloy material is deposited, and then the source electrode 1230 and the drain electrode 1240 of the thin film transistor 120, and the source electrode 2230 and the drain electrode 2240 of the thin film transistor 220 are formed in the second display region 200 by a patterning process. The source electrode 1230 and the drain electrode 1240 are respectively electrically connected to the source region and the drain region of the active layer 1220 through via holes in the first gate insulating layer 1410, the second gate insulating layer 1420 and the interlayer insulating layer 1430. The source electrode 2230 and the drain electrode 2240 are respectively electrically connected to the source region and the drain region of the active layer 2220 through the via holes in the first gate insulating layer 1410, the second gate insulating layer 1420 and the interlayer insulating layer 1430.

For example, the materials of the source electrode 1230 and the drain electrode 1240 of the thin film transistor 120 and the source electrode 2230 and the drain electrode 2240 of the thin film transistor 220 may include a metal material or an alloy material, such as a metal single-layer or a multi-layer structure formed of molybdenum, aluminum, titanium, or the like, for example, the multi-layer structure is a structure in which multiple metal layers are stacked (such as a three-layer metal stack of titanium, aluminum and titanium (Ti/Al/Ti)).

For example, in some embodiments, a first insulating layer is formed on the base substrate.

For example, as shown in FIG. 8A, a first insulating material layer 31 is formed on the source electrode 1230 and the drain electrode 1240 of the thin film transistor 120 and the source electrode 2230 and the drain electrode 2240 of the thin film transistor 220. The material of the first insulating material layer 31 includes an inorganic insulating material such as silicon oxide, silicon nitride, silicon oxynitride, or the like, or includes an organic insulating material such as polyimide, polyphthalimide, polyphthalamide, acrylic resin, benzocyclobutene, or phenolic resin, or the like, which is not limited in the embodiments of the present disclosure.

For example, as shown in FIG. 8B, the first insulating layer 1440 covering the first pixel drive circuit D100 and the second pixel drive circuit D200 is formed by a patterning process, and a plurality of via holes are formed in the first insulating layer 1440 to partially expose the first pixel drive circuit D100 and the second pixel drive circuit D200, respectively.

For example, the first via hole GH1 and the second via hole GH2 are formed in the first insulating layer 1440. The first via hole GH1 partially exposes the first pixel drive circuit D100 (e.g., the drain electrode 1240 of the thin film transistor 120), and the second via hole GH2 partially exposes the second pixel drive circuit D200 (e.g., the drain electrode 2240 of the thin film transistor 220).

For example, a first wiring layer is formed on the first insulating layer.

Figure 8C:
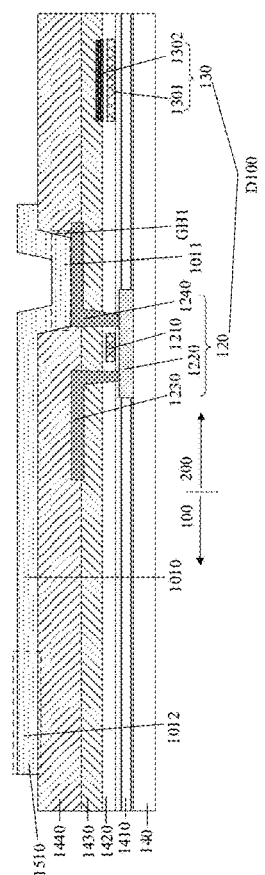
Figure 8C:
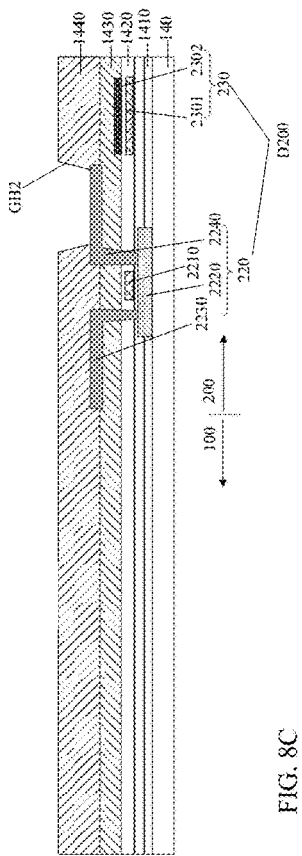

For example, as shown in FIG. 8C, a conductive material or a transparent conductive material is deposited on the first insulating layer 1440, and then the first wiring layer 1510 is formed by a patterning process. For example, the material of the first wiring layer 1510 may include a transparent conductive material, such as a transparent metal oxide such as indium tin oxide (ITO), indium zinc oxide (IZO), or the like. The first wiring layer 1510 includes the first connecting wire 1010, which is formed to be electrically connected to the first pixel drive circuit D100 (e.g., the drain electrode 1240 of the thin film transistor 120) through the first insulating layer 1440. It should be noted that, the electrical connection through the first insulating layer 1440 means that the first connecting wire 1010 is electrically connected to another element through a via hole (e.g., the first via hole GH1) in the first insulating layer 1440. The first pixel drive circuit D100 is configured to drive the first light-emitting device 1140 to emit light through the first connecting wire 1010.

For example, the first end 1011 of the first connecting wire 1010 is formed to be electrically connected to the first pixel drive circuit D100 (e.g., the drain electrode 1240 of the thin film transistor 120 thereof) through the first via hole GH1, and the second end 1012 of the first connecting wire 1010 is used for the electrical connection to the first light-emitting device 1140. Thus, the first pixel drive circuit D100 drives the first light-emitting device 1140 to emit light through the first connecting wire 1010.

Figure 8D:
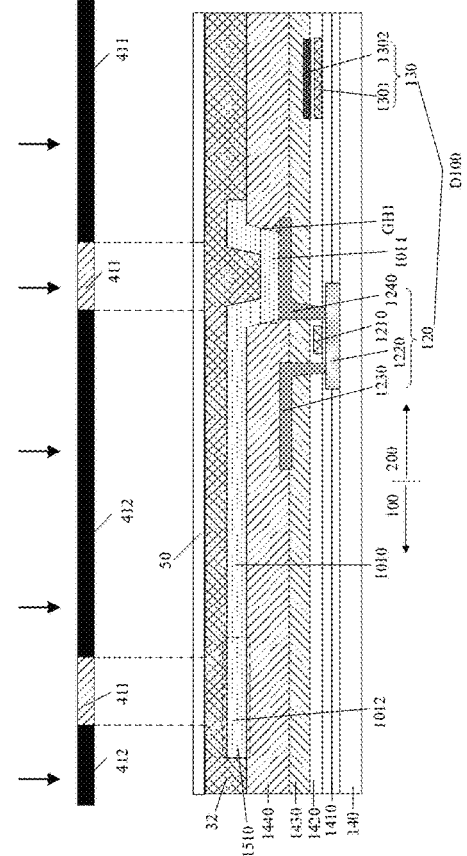
Figure 8D:
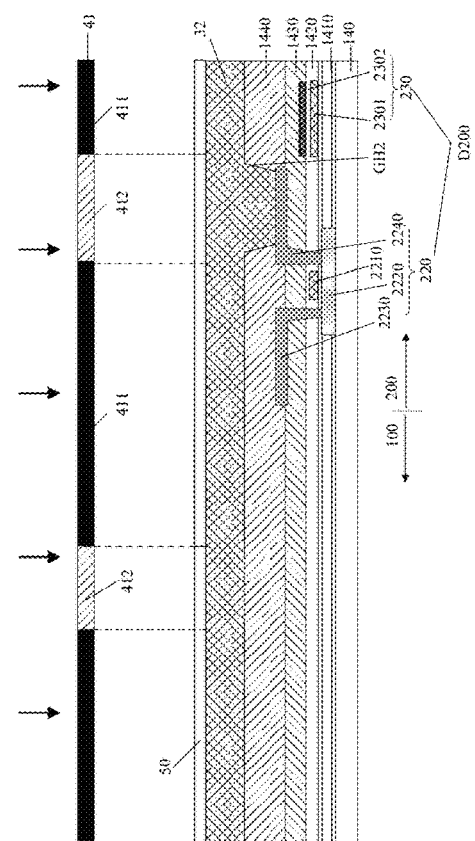

For example, as shown in FIG. 8D, a second insulating material layer 32 is deposited on the base substrate 140. The second insulating material layer 32 includes an inorganic insulating material such as silicon oxide, silicon nitride, silicon oxynitride, or the like, or includes an organic insulating material such as polyimide, polyphthalimide, polyphthalamide, acrylic resin, benzocyclobutene, or phenolic resin, or the like. A photoresist 50 is deposited on the second insulating material layer 32. A first reticle 41 is provided to expose the photoresist 50. The first reticle 41 includes a light-transmitting region and an opaque region. The first reticle 41 includes a light-transmitting pattern 411 corresponding to the first end 1011 and the second end 1012 of the first connecting wire 1010, the first via hole GH1 and a portion for subsequently forming the fourth via hole GH4 of the first insulating layer 1440, and an opaque pattern 412 which is the portion other than the light-transmitting pattern 411. The photoresist 50 is a positive photoresist. During the exposure process, the portion of the photoresist 50 corresponding to the light-transmitting pattern 411 is fully exposed, while the portion corresponding to the opaque pattern 412 is not exposed.

Figure 8E:
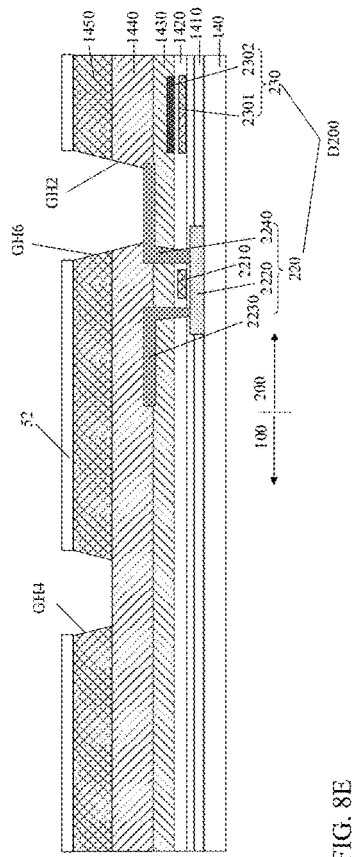
Figure 8E:
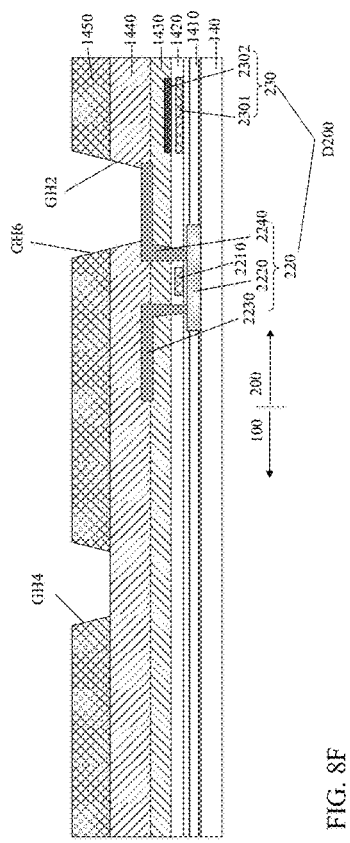
Figure 8E:
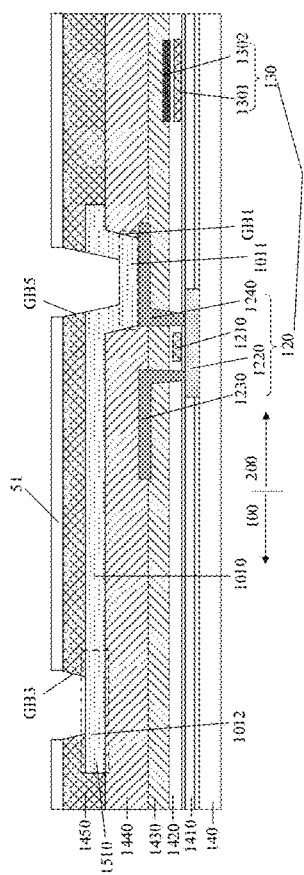

For example, as shown in FIG. 8E, the photoresist 50 is developed, and the fully exposed portion of the photoresist 50 is removed, so as to form a photoresist pattern 51 (in the figure on the left in FIG. 8E) and a photoresist pattern 52 (in the figure on the right in FIG. 8E). For another example, in the above patterning process, a negative photoresist may also be used, then the used reticle is, for example, a reticle complementary to the first reticle 41 mentioned above, so that the photoresist pattern 51 (in the figure on the left in FIG. 8E) and the photoresist pattern 52 (in the figure on the right in FIG. 8E) mentioned above are obtained after exposure and development.

For example, continuing as shown in FIG. 8E, the second insulating material layer 32 is etched to form the second insulating layer 1450, and the third via hole GH3, the fourth via hole GH4, the fifth via hole GH5 and the sixth via hole GH6 are formed in the second insulating layer 1450. The third via hole GH3 and the fourth via hole GH4 are located in the first display region 100. The fifth via hole GH5 and the sixth via hole GH6 are located in the second display region 200. The third via hole GH3 exposes the second end 1012 of the first connecting wire 1010 for connecting the first electrode 1141 of the first light-emitting device 1140 to the first connecting wire 1010. The orthographic projection of the fourth via hole GH4 on the base substrate 140 overlaps with the orthographic projection of the second end 1022 of the second connecting wire 1020 on the base substrate 140, which is used for connecting the first electrode 1151 of the second light-emitting device 1150 to the second connecting wire 1020. The orthographic projection of the fifth via hole GH5 on the base substrate 140 overlaps with the orthographic projection of the first via hole GH1 of the first insulating layer 1440 on the base substrate 140, and the fifth via hole GH5 exposes the first end 1011 of the first connecting wire 1010. The orthographic projection of the sixth via hole GH6 on the base substrate 140 overlaps with the orthographic projection of the second via hole GH2 of the first insulating layer 1440 on the base substrate 140, which is used for the electrically connection to the second pixel drive circuit D200 through the second connecting wire 1020.

Figure 8F:
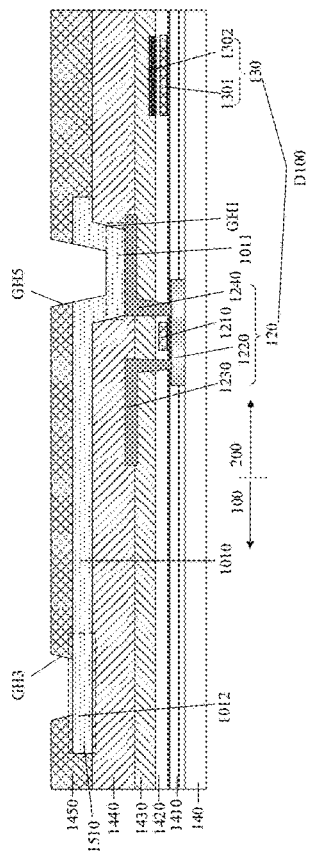

For example, as shown in FIG. 8F, an ashing process is performed to remove the photoresist pattern 51 (in the figure on the left in FIG. 8E) and the photoresist pattern 52 (in the figure on the right in FIG. 8E) to form the second insulating layer 1450. The second insulating layer 1450 may further be etched and the etched thickness can be controlled to provide a planarized surface.

For example, in some embodiments, a second wiring layer is formed on the second insulating layer.

Figure 8G:
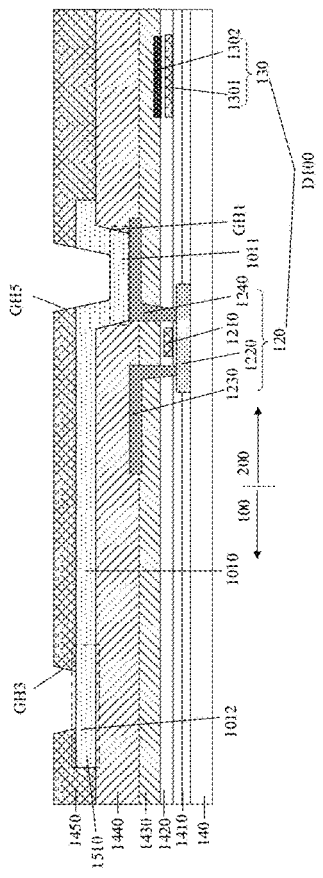

For example, as shown in FIG. 8G, a conductive material or a transparent conductive material is deposited on the second insulating layer 1450, and then the second wiring layer 1520 is formed by a patterning process. For example, the material of the second wiring layer 1520 may include a transparent conductive material, for example, a transparent metal oxide such as indium tin oxide (ITO), indium zinc oxide (IZO), or the like. The second wiring layer 1520 includes the first connecting wire 1020, and the second connecting wire 1020 is formed to be electrically connected to the second pixel drive circuit D200 through the first insulating layer 1440 and the second insulating layer 1450. The second pixel drive circuit D200 is configured to drive the second light-emitting device 1150 to emit light through the second connecting wire 1020.

For example, the first end 1021 of the second connecting wire 1020 is formed to be electrically connected to the second pixel drive circuit D200 (e.g., the drain electrode 2240 of the thin film transistor 220) through the second via hole GH2 and the sixth via hole GH6 in the second insulating layer 1450. The second end 1022 of the second connecting wire 1020 covers the fourth via hole GH4 in the second insulating layer 1450. The second end 1022 of the second connecting wire 1020 is used for electrical connection to the second light-emitting device D200. The first connecting wire 1010 and the second connecting wire 1020 are located in different film layers to reduce wiring space.

For example, in some embodiments, a third insulating layer is formed and patterned on the second wiring layer.

Figure 8H:
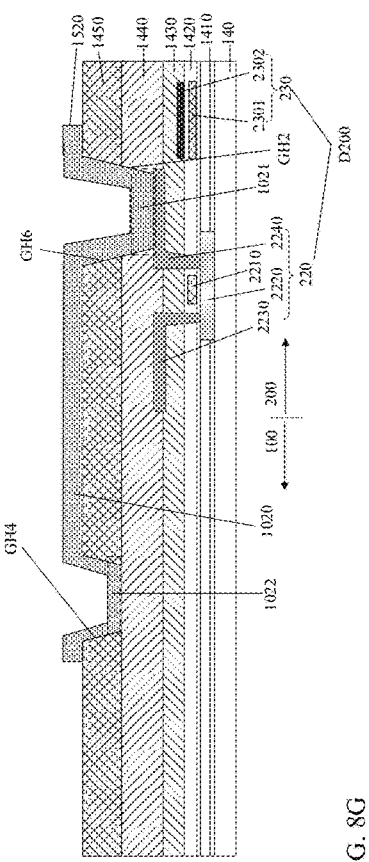
Figure 8H:
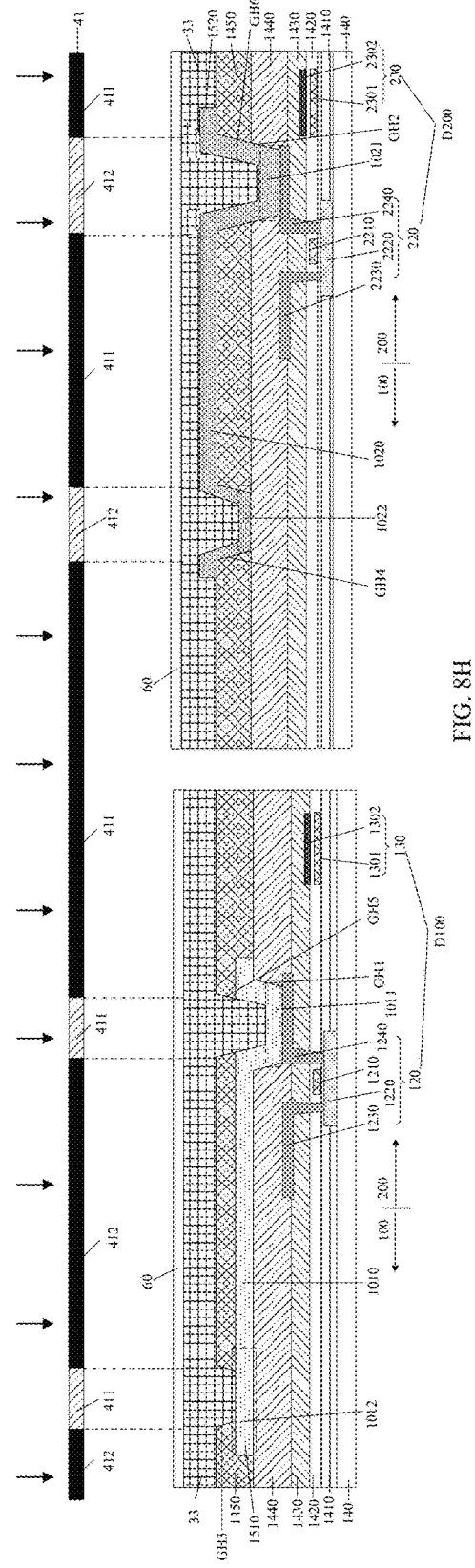

For example, as shown in FIG. 8H, a third insulating material layer 33 is deposited on the base substrate 140. The third insulating material layer 33 may include an inorganic insulating material such as silicon oxide, silicon nitride, silicon oxynitride, or the like, or includes an organic insulating material such as polyimide, polyphthalimide, polyphthalamide, acrylic resin, benzocyclobutene, or phenolic resin, or the like. A photoresist 60 is deposited on the third insulating material layer 33. A first reticle 41 is provided to expose the photoresist 60. The first reticle 41 and the first reticle 41 shown in FIG. 8D for manufacturing the second insulating layer 1450 are the same one reticle. The photoresist 60 is a positive photoresist. The light-transmitting pattern 411 of the first reticle 41 corresponds to the third via hole GH3, the fourth via hole GH4, the fifth via hole GH5 and the sixth via hole GH6. During the exposure process of the second insulating layer 1450, the portion of the photoresist 60 corresponding to the light-transmitting pattern 411 of the first reticle 41 is fully exposed, while the portion of the photoresist 60 corresponding to the opaque pattern 412 of the first reticle 41 is not exposed.

For example, as shown in FIG. 8I, the photoresist 60 is developed, and the portion of the photoresist 60 that is fully exposed is removed, so as to form a photoresist pattern 61 (in the figure on the left in FIG. 8I) and a photoresist pattern 62 (in the figure on the right in FIG. 8I). For another example, in the above patterning process, a negative photoresist may also be used, then the used reticle is, for example, a reticle complementary to the first reticle 41 mentioned above, so that the photoresist pattern 61 (in the figure on the left in FIG. 8I) and the photoresist pattern 62 (in the figure on the right in FIG. 8I) mentioned above are obtained after exposure and development.

For example, continuing as shown in FIG. 8I, the third insulating material layer 33 is etched to form the third insulating layer 1460, and the seventh via hole GH7, the eighth via hole GH8, the ninth via hole GH9 and the tenth via hole GH10 are formed in the third insulating layer 1460. The seventh via hole GH7 and the eighth via hole GH8 are located in the second display region 200. The ninth via hole GH9 and the tenth via hole GH10 are located in the first display region 100. The orthographic projection of the ninth via hole GH9 on the base substrate 140 overlaps with the orthographic projection of the third via hole GH3 of the second insulating layer 1450 on the base substrate 140, and the ninth via hole GH9 exposes the second end 1012 of the first connecting wire 1010 to allow the second end 1012 of the first connecting wire 1010 to be connected to the first electrode 1141 of the first light-emitting device 1140. The orthographic projection of the tenth via hole GH10 on the base substrate 140 overlaps with the orthographic projection of the fourth via hole GH4 of the second insulating layer 1450 on the base substrate 140, and the tenth via hole GH10 exposes the second end 1022 of the second connecting wire 1020 to allow the second end 1022 of the second connecting wire 1020 to be connected to the first electrode 1151 of the second light-emitting device 1150. The orthographic projection of the seventh via hole GH7 on the base substrate 140 overlaps with the orthographic projections of the first via hole GH1 of the first insulating layer 1440 and the fifth via hole GH5 of the second insulating layer 1450 on the base substrate 140, and the seventh via hole GH7 (and the fifth via hole GH5) exposes the first end 1011 of the first connecting wire 1010. The orthographic projection of the eighth via hole GH8 on the base substrate 140 overlaps with the orthographic projections of the second via hole GH2 of the first insulating layer 1440 and the sixth via hole GH6 of the second insulating layer 1450 on the base substrate 140, and the eighth via hole GH8 exposes the first end 1021 of the second connecting wire 1020.

For example, as shown in FIG. 8J, an ashing process is performed to remove the photoresist pattern 61 (in the figure on the left in FIG. 8I) and the photoresist pattern 62 (in the figure on the right in FIG. 8I). The third insulating layer 1460 may further be etched and the etched thickness can be controlled to provide a planarized surface.

For example, the third insulating layer and the second insulating layer are formed by a patterning process using the same reticle to have substantially the same planar pattern. As shown in FIG. 8I, the orthographic projection of the ninth via hole GH9 of the second insulating layer 1450 on the base substrate 140 overlaps with the orthographic projection of the third via hole GH3 of the first insulating layer 1440 on the base substrate 140, the orthographic projection of the seventh via hole GH7 of the second insulating layer 1450 on the base substrate 140 overlaps with the orthographic projection of the fifth via hole GH5 of the first insulating layer 1440 on the base substrate 140, the orthographic projection of the eighth via hole GH8 of the second insulating layer 1450 on the base substrate 140 overlaps with the orthographic projection of the sixth via hole GH6 of the first insulating layer 1440 on the base substrate 140, and the orthographic projection of the tenth via hole GH10 of the second insulating layer 1450 on the base substrate 140 overlaps with the orthographic projection of the fourth via hole GH4 of the first insulating layer 1440 on the base substrate 140, thereby forming via hole sets between the second insulating layer 1450 and the first insulating layer 1440, so that the second insulating layer 1450 and the first insulating layer 1440 can be formed by using the same reticle to perform a patterning process, so as to reduce manufacturing cost.

For example, a plurality of light-emitting devices are formed on the third insulating layer. As shown in FIG. 5A, the first light-emitting device 1140 includes the first electrode 1141, the first light-emitting layer 1142 and the second electrode 1143. The second light-emitting device 1150 includes the first electrode 1151, the first light-emitting layer 1152 and the second electrode 1153.

Figure 8K:
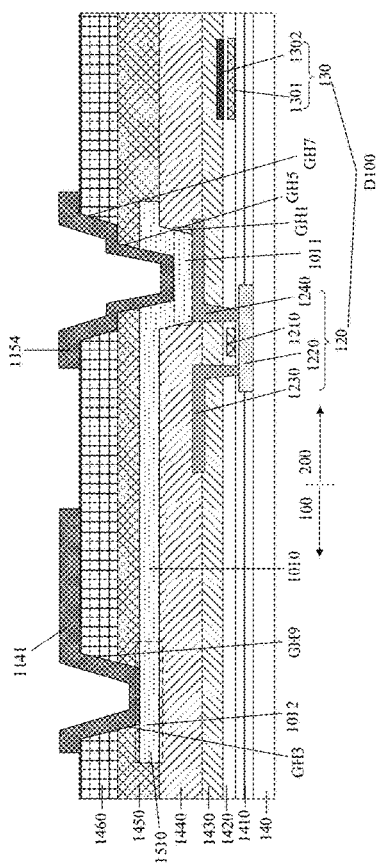
Figure 8K:
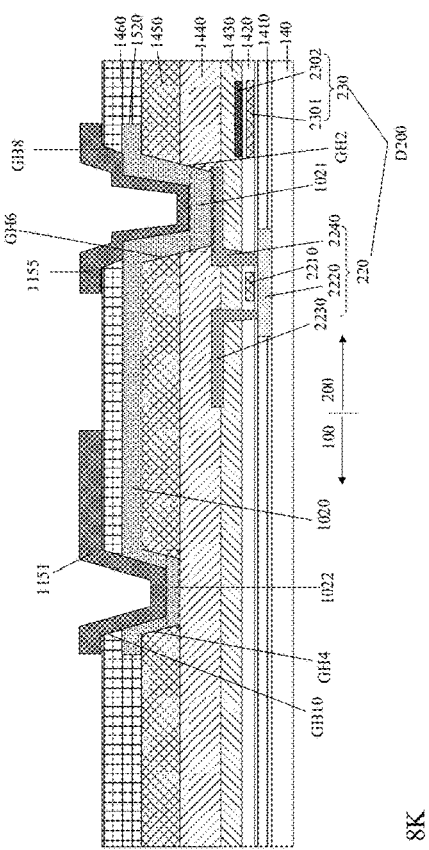

For example, as shown in FIG. 8K, a metal material or an alloy material is deposited, and then the first electrode 1141 of the first light-emitting device 1140 and the first electrode 1151 of the second light-emitting device 1150 are formed in the first display region 100 by a patterning process. The first electrode 1141 of the first light-emitting device 1140 is formed to be connected to the second end 1012 of the first connecting wire 1010 through the third via hole GH3 of the second insulating layer 1450 and the ninth via hole GH9 of the third insulating layer 1450. The first electrode 1151 of the second light-emitting device 1150 is formed to be connected to the second end 1022 of the second connecting wire 1020 through the tenth via hole GH10 of the third insulating layer 1450. For example, the material of the first electrode 1141 of the first light-emitting device 1140 and the first electrode 1151 of the second light-emitting device 1150 may include at least one transparent conductive oxide material including indium tin oxide (ITO), indium zinc oxide (IZO), zinc oxide (ZnO), etc. In addition, the first electrode 1141 of the first light-emitting device 1140 and the first electrode 1151 of the second light-emitting device 1150 may include a metal having high reflectivity, such as silver (Ag), serving as a reflective layer.

For example, while forming the first electrodes of the plurality of light-emitting devices, a first protective layer and a second protective layer may further be formed. As shown in FIG. 8K, while the first electrode 1141 of the first light-emitting device 1140 and the first electrode 1151 of the second light-emitting device 1150 are formed, the first protective layer 1154 and the second protective layer 1155 are also formed. The first protective layer 1154 covers the seventh via hole GH7 of the third insulating layer 1460, and the second protective layer 1155 covers the eighth via hole GH8 of the third insulating layer 1460. The first protective layer 1154 further covers the surface of the side of the first end 1011 of the first connecting wire 1010 away from the base substrate 140, and the second protective layer 1155 further covers the surface of the side of the first end 1021 of the second connecting wire 1020 away from the base substrate 140, so as to protect the first connecting wire 1010 and the second connecting wire 1020 to prevent them from being damaged in subsequent manufacturing processes, such as being corroded by an etching solution.

Figure 8L:
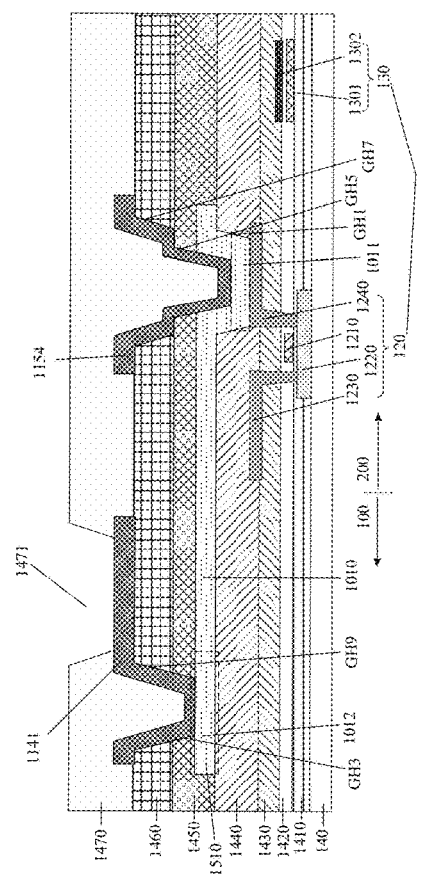
Figure 8L:
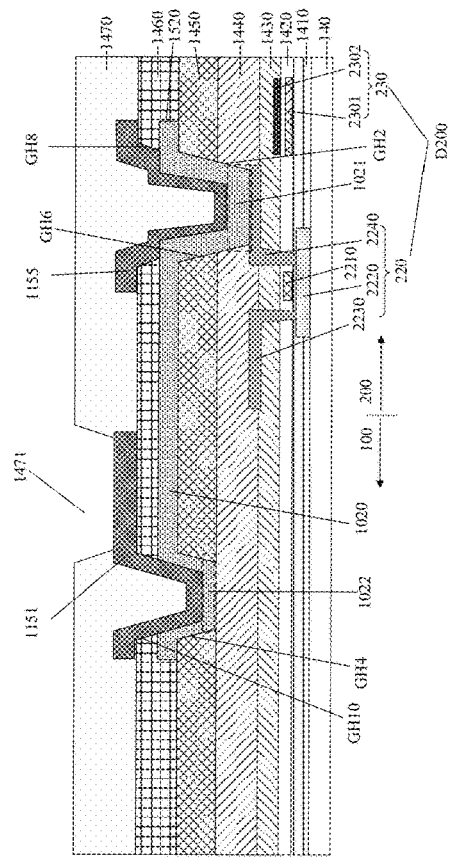

For example, after the first electrodes of the plurality of light-emitting devices are formed, a pixel defining layer is formed on the side of the first electrodes of the plurality of light-emitting devices and the third insulating layer away from the base substrate. For example, as shown in FIG. 8L, the pixel defining layer 1470 is formed on the first electrode 1141 of the first light-emitting device 1140, the first electrode 1151 of the second light-emitting device 1150 and the third insulating layer 1460. The pixel defining layer 1470 is formed to include a plurality of first pixel openings 1471. The plurality of first pixel openings 1471 are in one-to-one correspondence with the first light-emitting device 1140 and the second light-emitting device 1150 to form the light-emitting region 1160 of the first light-emitting device 1140 and the light-emitting region 2160 of the second light-emitting device 1150 (as shown in FIG. 8M).

For example, the first light-emitting layers of the plurality of light-emitting devices are formed in the first pixel openings, and second electrodes of the plurality of light-emitting devices are formed on the side of the first light-emitting layers and the pixel defining layer away from the base substrate. As shown in FIG. 8M, the first light-emitting layer 1142 of the first light-emitting device 1140 and the first light-emitting layer 1152 of the second light-emitting device 1150 are formed in the plurality of first pixel openings 1471. The second electrode 1143 of the first light-emitting device 1140 and the second electrode 1153 of the second light-emitting device 1150 are formed on the pixel defining layer 1470, the first light-emitting layer 1142 of the first light-emitting device 1140 and the first light-emitting layer 1152 of the second light-emitting device 1150. That is, the first light-emitting layer 1142 of the first light-emitting device 1140 is formed to be located in the first pixel opening 1471 and between the first electrode 1141 and the second electrode 1143. The first light-emitting layer 1152 of the second light-emitting device 1150 is formed to be located in the first pixel opening 1471 and between the first electrode 1151 and the second electrode 1153. A portion of the first light-emitting layer 1142 directly sandwiched between the first electrode 1141 and the second electrode 1143 will emit light after electrification, and thus a region occupied by the portion corresponds to the light-emitting region 1160 of the first light-emitting device 1140. A portion of the first light-emitting layer 1152 directly sandwiched between the first electrode 1151 and the second electrode 1153 will emit light after electrification, and thus a region occupied by the portion corresponds to the light-emitting region 2160 of the second light-emitting device 1150.

Figure 8M:
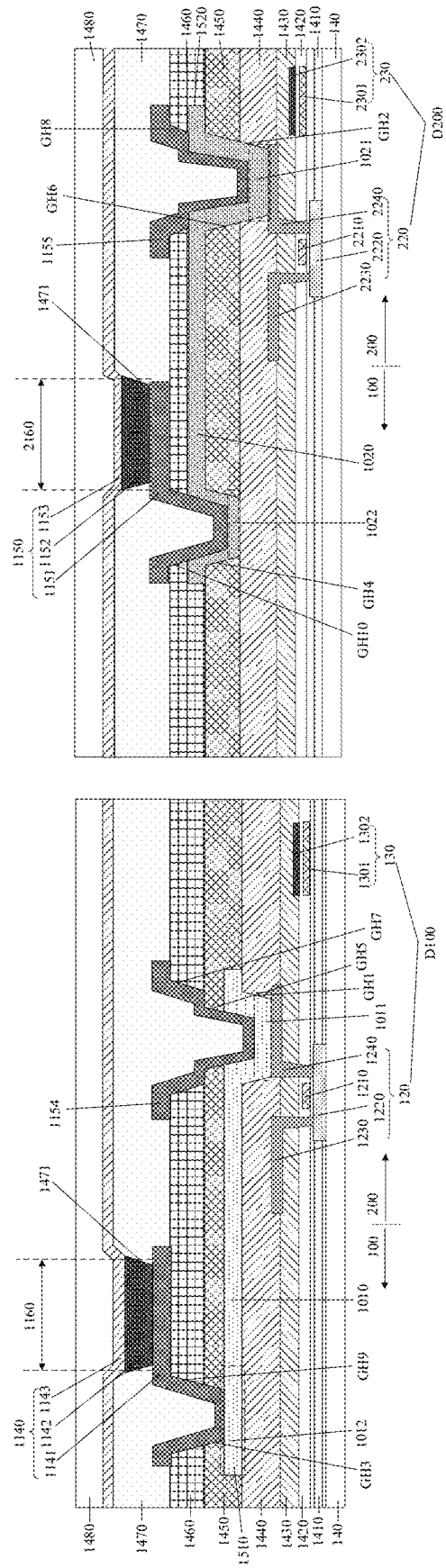

For example, continuing as shown in FIG. 8M, an insulating material is deposited on the second electrode 1142 of the first light-emitting device 1140 and the second electrode 1153 of the second light-emitting device 1150 to form an encapsulation layer 1480. The encapsulation layer 1480 seals the first light-emitting device 1140 and the second light-emitting device 1150, so that deterioration of the light-emitting device caused by moisture and/or oxygen included in the environment can be reduced or eliminated. The encapsulation layer 1480 may be a single-layer structure or a composite-layer structure, and the composite-layer structure includes a structure in which an inorganic layer and an organic layer are stacked. The encapsulation layer 1480 includes at least one encapsulation sub-layer. For example, the encapsulation layer 1480 may include a first inorganic encapsulation layer, a first organic encapsulation layer, and a second inorganic encapsulation layer arranged in sequence.

For example, the material of the encapsulation layer 1480 includes an insulating material such as silicon nitride, silicon oxide, silicon oxynitride, polymer resin, or the like. The inorganic material such as silicon nitride, silicon oxide, silicon oxynitride, or the like, have high compactness and can prevent the intrusion of moisture and oxygen. The material of the organic encapsulation layer is a polymer material containing a desiccant or a polymer material that can block moisture, etc., such as polymer resin, etc. to planarize the surface of the display substrate, and can relieve the stress of the first inorganic encapsulation layer and the second inorganic encapsulation layer, and can also include a water-absorbing material such as desiccant to absorb substances such as water, oxygen, or the like intruding into the interior.

FIG. 9A-FIG. 9F are process views of a method of manufacturing a display substrate shown in FIG. 5B provided by some embodiments of the present disclosure.

It should be noted that, the difference between the embodiment shown in FIG. 5B and the embodiment shown in FIG. 5A is that: the first pad layer 1511, the second pad layer 1512, the third pad layer 1521 and the fourth pad layer 1522 are added. The other same film layer structures of the embodiment shown in FIG. 5B and the embodiment shown in FIG. 5A will not be described again.

For example, a first pad layer and a second pad layer are formed at the same time as the first connecting wire is formed.

The embodiment shown in FIG. 9A corresponds to the embodiment shown in FIG. 8C, that is, both are used to form the first wiring layer 1510.

For example, as shown in FIG. 9A, a conductive material or a transparent conductive material is deposited on the first insulating layer 1440, and then the first wiring layer 1510 is formed by a patterning process. The first wiring layer 1510 includes the first connecting wire 1010, the first pad layer 1511 and the second pad layer 1512. The first pad layer 1511 is formed to cover (e.g., partially cover) the second via hole GH2 of the first insulating layer 1440 and is electrically connected to the second pixel drive circuit D200 (e.g., the drain electrode 2240 of the thin film transistor 220). The first pad layer 1511 corresponds to the second end 1022 of the second connecting wire 1020 and is exposed by the sixth via hole GH6 of the second insulating layer 1450, so as to allow the second connecting wire 1020 to be electrically connected to the second pixel drive circuit through the first pad layer 1511. The fourth via hole GH4 of the second insulating layer 1450 exposes the second pad layer 1512, and the second pad layer 1512 is connected to the second end 1022 of the second connecting wire 1020. The first pad layer 1511 and the second pad layer 1512 can reduce the height of the via hole in the second insulating layer 1450, thereby improving the slope angles of the second connecting wire 1020 and the first electrode 1151 of the second light-emitting device 1150 and preventing the second connecting wire 1020 and the first electrode 1151 of the second light-emitting device 1150 from being broken.

For example, in other examples, the display substrate 1000 is formed to further include one of the first pad layer 1511 and the second pad layer 1512, and the present disclosure is not limited thereto.

For example, as shown in FIG. 9B, the second insulating layer 1450 is formed on the first wiring layer 1510, and the detailed forming process of the second insulating layer 1450 can refer to the manufacturing process shown in FIG. 8D to FIG. 8M. The sixth via hole GH6 of the second insulating layer 1450 exposes the first pad layer 1511, and the fourth via hole of the second insulating layer 1450 exposes the second pad layer 1512.

For example, a third pad layer and a fourth pad layer are formed at the same time as the second connecting wire is formed.

Figure 9C:
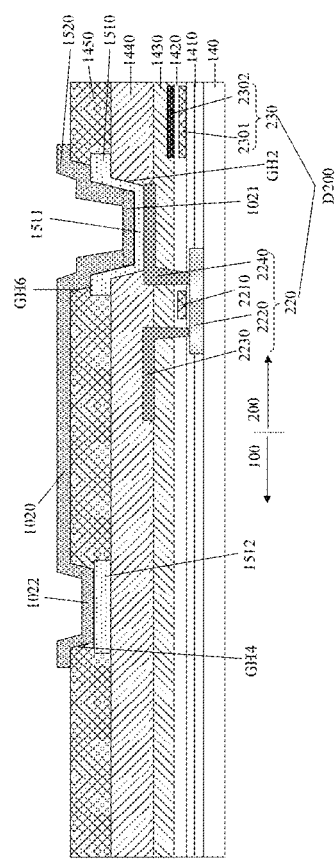

The embodiment shown in FIG. 9C corresponds to the embodiment shown in FIG. 8G, that is, both are used to form the second wiring layer 1520.

For example, as shown in FIG. 9C, a conductive material or a transparent conductive material is deposited on the second insulating layer 1450, and then the second wiring layer 1520 is formed by a patterning process. For example, the second wiring layer 1520 includes the first connecting wire 1020, the third pad layer 1521 and the fourth pad layer 1522. A portion of the third pad layer 1521 overlaps with the fifth via hole GH5 of the second insulating layer 1450, that is, the third pad layer 1521 covers the fifth via hole GH5 so as to be electrically connected to the first end 1011 of the first connecting wire 1010. A portion of the fourth pad layer 1522 overlaps with the third via hole GH3 of the second insulating layer 1450 and covers the second end 1012 of the first connecting wire 1010.

For example, in other examples, one of the third pad layer 1521 and the fourth pad layer 1522 is formed, and the present disclosure is not limited thereto.

Figure 9D:
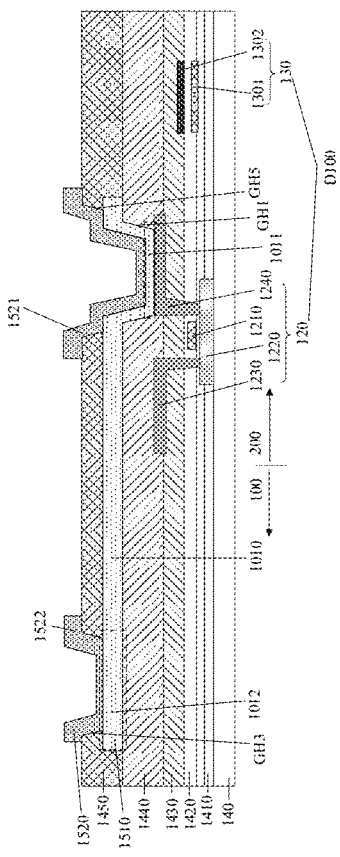

For example, as shown in FIG. 9D, the third insulating layer 1460 is formed on the second wiring layer 1520. The detailed forming process of the third insulating layer 1460 may refer to the manufacturing process shown in FIG. 8H-FIG. 8J. The seventh via hole GH7 of the third insulating layer 1460 at least partially exposes the third pad layer 1521 to allow electrical connection to the first connecting wire 1010 through the third pad layer 1521. The ninth via hole GH9 of the third insulating layer 1460 exposes (e.g., partially exposes) the fourth pad layer 1522. The third pad layer 1521 can reduce the height of the via hole set formed by the seventh via hole GH7 and the fifth via hole GH5, and the fourth pad layer 1522 can reduce the height of the via hole set formed by the third via hole GH3 and the ninth via hole GH9, thereby improving the slope angle of the first electrode 1141 of the first light-emitting device 1140 and preventing the first electrode 1141 of the first light-emitting device 1140 from being broken.

Figure 9E:
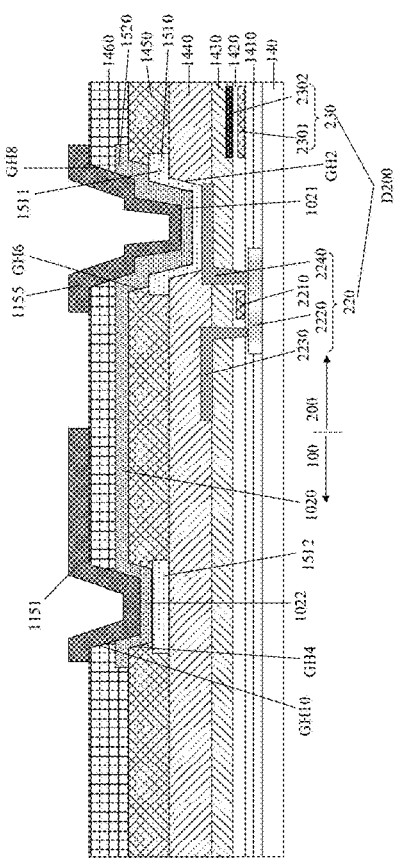

For example, as shown in FIG. 9E, the first electrode 1141 of the first light-emitting device 1140, the first electrode 1151 of the second light-emitting device 1150, the first protective layer 1154 and the second protective layer 1155 are formed on the third insulating layer 1460. The detailed forming process may refer to the forming process shown in FIG. 8K. The third pad layer 1521 is located on the side of the first protective layer 1154 close to the base substrate 140 and is connected to the first protective layer 1154. The fourth pad layer 1522 is connected to the portion of the first electrode 1141 located in the ninth via hole GH9, so as to electrically connect the first electrode 1141 to the first connecting wire 1010.

Figure 9F:
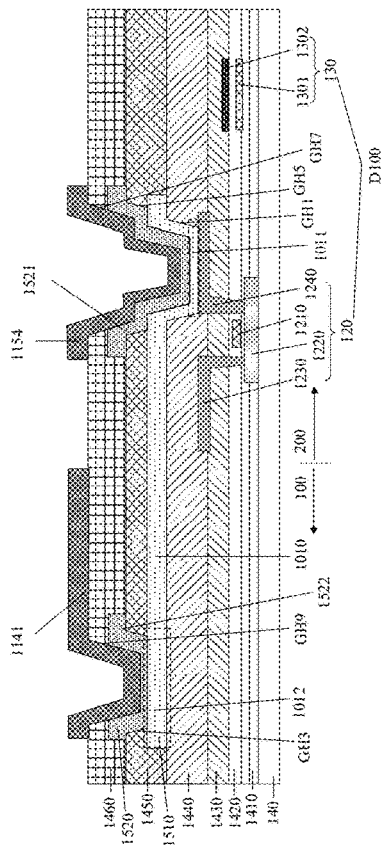

For example, as shown in FIG. 9F, the pixel defining layer 1470, the first light-emitting device 1140 and the second light-emitting device 1150 are formed on the base substrate. The detailed forming process may refer to the steps shown in FIG. 8L to FIG. 8M, which will not be described in detail.

FIG. 10A-FIG. 10H are process views of a method of manufacturing a display substrate shown in FIG. 6A provided by some embodiments of the present disclosure. FIG. 10A-FIG. 10H illustrate the manufacturing process of patterning the second insulating layer 2450 and the third insulating layer 2460 in FIG. 6A by using a gray-tone reticle or a half-tone reticle.

Figure 10A:
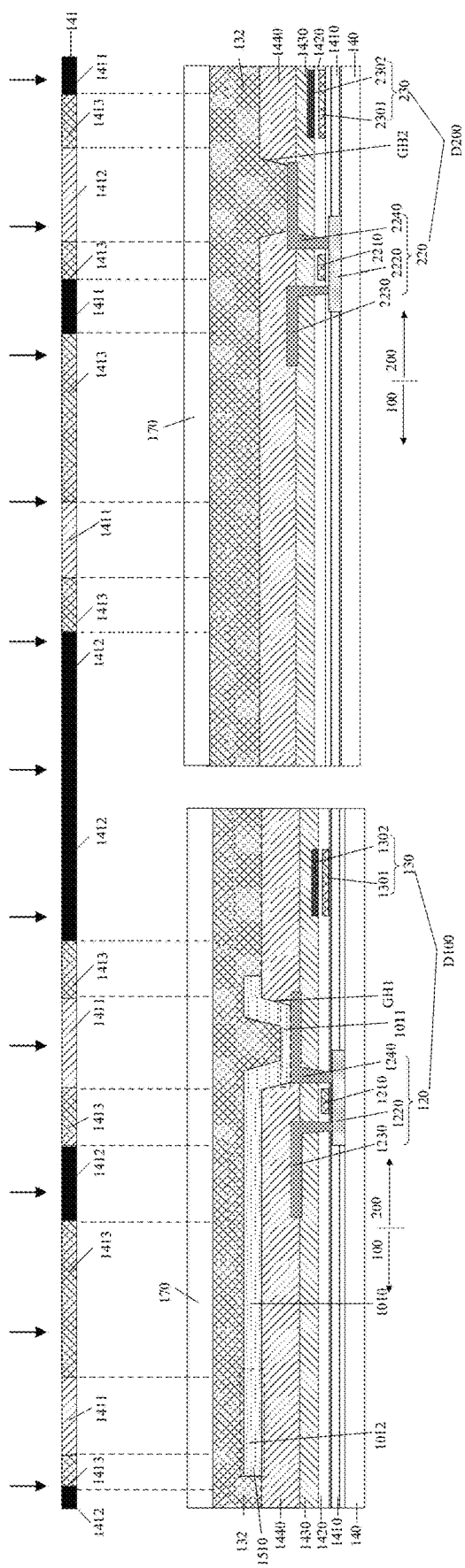

As shown in FIG. 10A, a second insulating material layer 132 is deposited on the base substrate 100. The second insulating material layer 132 may include an inorganic insulating material such as silicon oxide, silicon nitride, silicon oxynitride, or the like, or include an organic insulating material such as polyimide, polyphthalimide, polyphthalamide, acrylic resin, benzocyclobutene, or phenolic resin, or the like. A photoresist 170 is deposited on the second insulating material layer 132. A second reticle 141 is provided to expose the photoresist 170. The second reticle 141 includes a fully light-transmitting region, a partially light-transmitting region and an opaque region. The second reticle 141 includes a fully light-transmitting pattern 1411, a partially light-transmitting pattern 1413 and an opaque pattern 1412. The fully light-transmitting pattern 1411 corresponds to the first end 1011 and the second end 1012 of the first connecting wire 1010, the first via hole GH1 and a portion used to subsequently form the fourth via hole GH4 of the first insulating layer 1440. The partially light-transmitting pattern 1413 corresponds to the portions of the second insulating layer 2450 located in the E1 region and the E2 region in FIG. 6A. The opaque pattern 1412 is a portion of the second reticle 141 other than the light-transmitting pattern 1411 and the partially light-transmitting pattern 1413. The second reticle 141 is a gray-tone reticle or a half-tone reticle. The photoresist 170 is a positive photoresist, correspondingly, the light transmittance of the partially light-transmitting pattern 1413 is lower than the light transmittance of the fully light-transmitting pattern 1411. During the exposure process, the portion of the photoresist 170 corresponding to the partially light-transmitting pattern 141 is partially exposed under the condition that the portion of the photoresist 170 corresponding to the fully light-transmitting pattern 1411 is fully exposed. The portion of the photoresist 170 corresponding to the opaque pattern 1412 is not exposed.

Figure 10B:
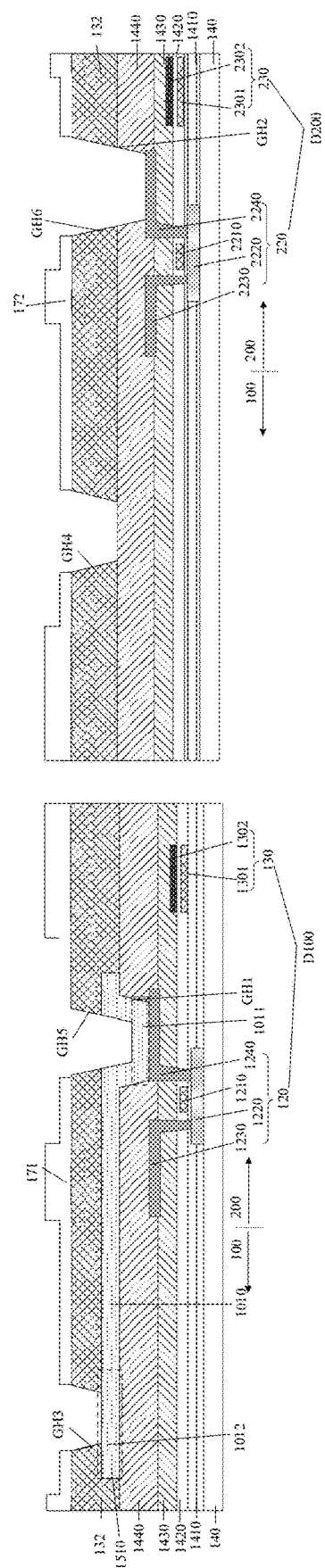

As shown in FIG. 10B, the photoresist 170 is developed, and the portion of the photoresist 170 which is fully exposed is removed, that is, the portions corresponding to the third via hole GH3, the fourth via hole GH4, the fifth via hole GH5 and the sixth via hole GH6 of the second insulating layer 2450 are removed. The portion of the photoresist 170 which is partially exposed is thinned, while the thickness of the portion of the photoresist 170 which is not exposed is, for example, substantially unchanged. After the photoresist 170 is developed, a photoresist pattern 171 (in the figure on the left in FIG. 10B) and a photoresist pattern 172 (in the figure on the right in FIG. 10B) are formed. For another example, in the patterning process mentioned above, a negative photoresist may also be used, then the used reticle is, for example, a reticle complementary to the second reticle 14, so that the photoresist pattern 171 (in the figure on the left in FIG. 10B) and the photoresist pattern 172 (in the figure on the right in FIG. 10B) are obtained after exposure and development.

For example, continuing as shown in FIG. 10B, the second insulating material layer 132 is etched to form the second insulating layer 2450, and the third via hole GH3, the fourth via hole GH4, the fifth via hole GH5 and the sixth via hole GH6 are formed in the second insulating layer 2450.

For example, as shown in FIG. 10C, an ashing process is performed to remove the portions of the photoresist pattern 171 (in the figure on the left in FIG. 10B) and the photoresist pattern 172 (in the figure on the right in FIG. 10B) which are partially exposed, while the portions of the photoresist pattern 171 (in the figure on the left in FIG. 10B) and the photoresist pattern 172 (in the figure on the right in FIG. 10B) which are not partially exposed are thinned to form a photoresist pattern 173 (in the figure on the left in FIG. 10C) and a photoresist pattern 174 (in the figure on the right in FIG. 10C). The remaining second insulating material layer 132 is etched and the etched thickness is controlled, so as to form the second insulating layer 2450. The second insulating layer 2450 has two portions with different thicknesses. The second insulating layer 2450 includes a first portion with a higher thickness and a second portion with a lower thickness. The second portion of the second insulating layer 2450 with a lower thickness in the E1 region corresponds to the third via hole GH3 and the fourth via hole GH4, and the second portion of the second insulating layer 2450 with a lower thickness in the E2 region corresponds to the fifth via hole GH5 and the sixth via hole GH6. Therefore, by reducing the height of a portion of the second insulating layer 2450, the heights of the third via hole GH3, the fourth via hole GH4, the fifth via hole GH5 and the sixth via hole GH6 can be reduced, and the slope angles of the first connecting wire 1010 and the first electrode 1141 of the first light-emitting device 1140 can be improved, thereby preventing the first connecting wire 1010 and the first electrode 1141 of the first light-emitting device 1140 from being broken.

For example, as shown in FIG. 10D, the photoresist pattern 173 (in the figure on the left in FIG. 10C) and the photoresist pattern 174 (in the figure on the right in FIG. 10C) are removed. The second insulating layer 2450 may further be etched and the etched thickness can be controlled to provide a planarized surface.

Figure 10E:
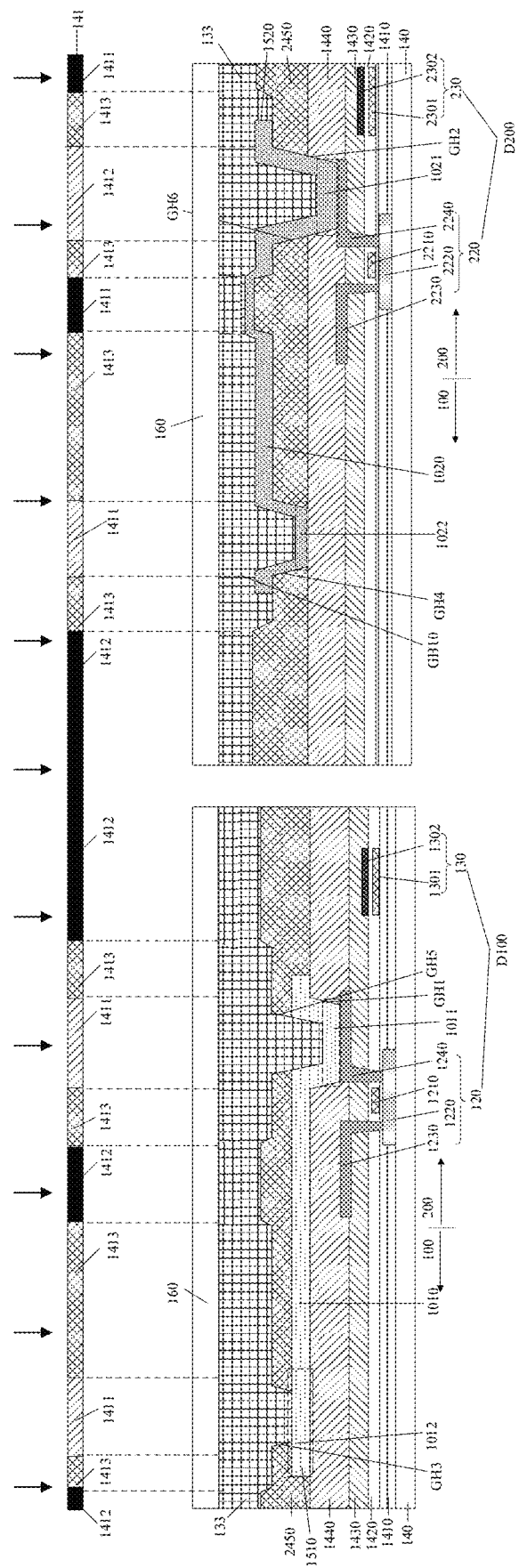

For example, as shown in FIG. 10E, the second wiring layer 1520 is formed on the second insulating layer 2450, and the second wiring layer 1520 includes the second connecting wire 1020. A third insulating material layer 133 is deposited on the second insulating layer 2450. The third insulating material layer 133 includes an inorganic insulating material such as silicon oxide, silicon nitride, or silicon oxynitride, or the like, or include an organic insulating material such as polyimide, polyphthalimide, polyphthalamide, acrylic resin, benzocyclobutene, or phenolic resin, or the like. A photoresist 160 is deposited on the third insulating material layer 133. A second reticle 141 is provided to expose the photoresist 160. The second reticle 141 and the second reticle 141 shown in FIG. 10A for manufacturing the second insulating layer 2450 are the same one reticle. A fully light-transmitting pattern 1411 of the second reticle 141 corresponds to the third via hole GH3, the fourth via hole GH4, the fifth via hole GH5 and the sixth via hole GH6, and a partially light-transmitting pattern 1413 of the second reticle 141 is the partially light-transmitting pattern 1413 corresponding to the E1 region and the E2 region of the third insulating layer 2460 in FIG. 6A. The second reticle 141 is a gray-tone reticle or a half-tone reticle. The photoresist 160 is a positive photoresist, correspondingly, the light transmittance of the partially light-transmitting pattern 1413 is lower than the light transmittance of the fully light-transmitting pattern 1411. During the exposure process, the portion of the photoresist 160 corresponding to the partially light-transmitting pattern 141 is partially exposed under the condition that the portion of the photoresist 160 corresponding to the fully light-transmitting pattern 1411 is fully exposed. The portion of the photoresist 160 corresponding to the opaque pattern 1412 is not exposed.

Figure 10F:
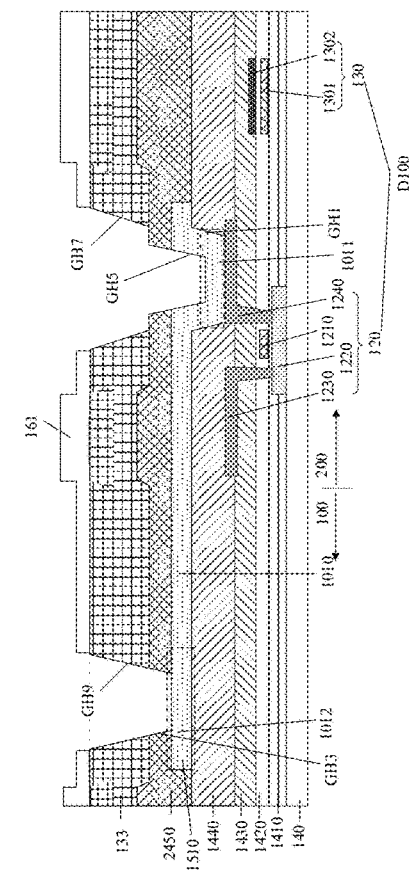
Figure 10F:
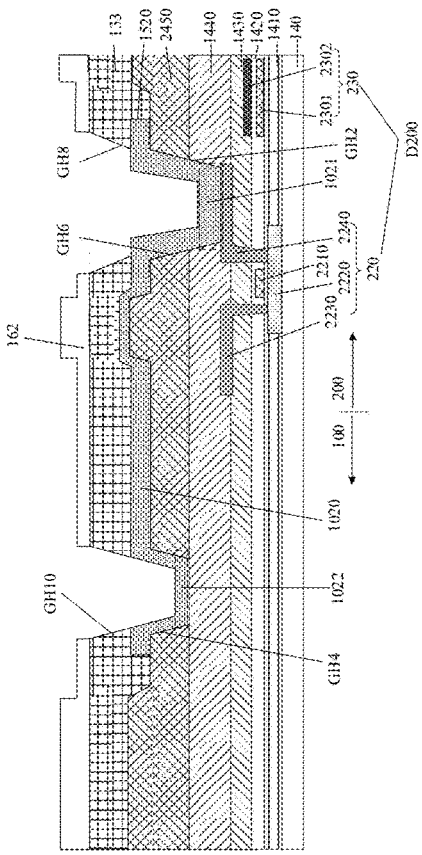

As shown in FIG. 10F, the photoresist 160 is developed, and the portion of the photoresist 160 which is fully exposed is removed, that is, the portions of the photoresist 160 corresponding to the seventh via hole GH7, the eighth via hole GH8, the ninth via hole GH9 and the tenth via hole GH10 of the third insulating layer 2460 are removed. The portion of the photoresist 160 which is partially exposed is thinned, while the thickness of the portion of the photoresist 160 which is not exposed is, for example, substantially unchanged. The photoresist 160 is developed to form a photoresist pattern 161 (in the figure on the left in FIG. 10F) and a photoresist pattern 162 (in the figure on the right in FIG. 10F). For another example, in the patterning process mentioned above, a negative photoresist may also be used, then the used reticle is, for example, a reticle complementary to the second reticle 141, so that the photoresist pattern 161 (in the figure on the left in FIG. 10F) and the photoresist pattern 162 (in the figure on the right in FIG. 10F) are obtained after exposure and development.

For example, continuing as shown in FIG. 10F, the third insulating material layer 133 is etched to form the third insulating layer 2460, and the seventh via hole GH7, the eighth via hole GH8, the ninth via hole GH9 and the tenth via hole GH10 are formed in the third insulating layer 2460.

Figure 10G:
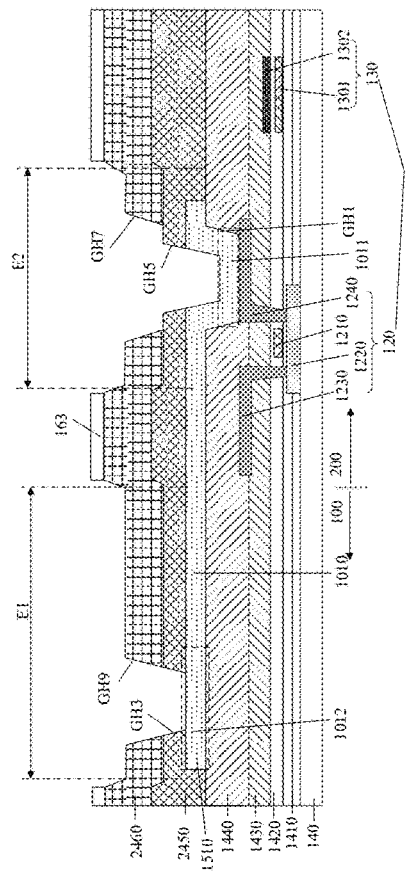
Figure 10G:
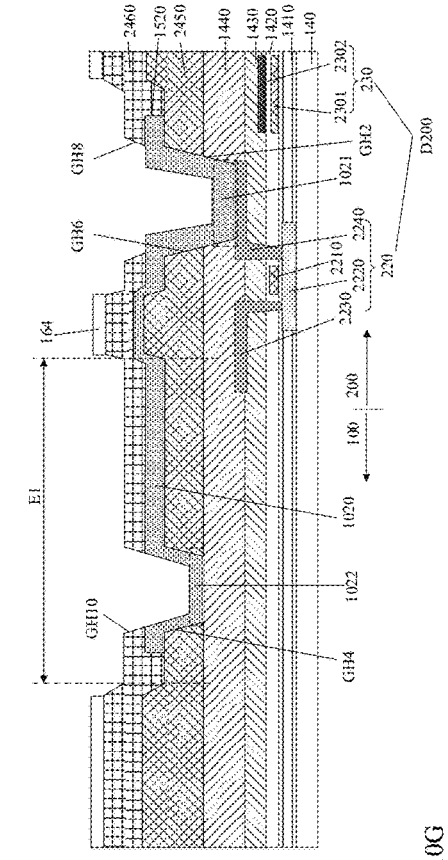

For example, as shown in FIG. 10G, an ashing process is performed to remove the portions of the photoresist pattern 161 (in the figure on the left in FIG. 10F) and the photoresist pattern 162 (in the figure on the right in FIG. 10F) which are partially exposed, while the portions of the photoresist pattern 161 (in the figure on the left in FIG. 10F) and the photoresist pattern 162 (in the figure on the right in FIG. 10F) which are not partially exposed are thinned to form a photoresist pattern 163 (in the figure on the left in FIG. 10G) and a photoresist pattern 164 (in the figure on the right in FIG. 10G). The remaining third insulating material layer 133 is etched and the etched thickness is controlled to form the third insulating layer 2460. The third insulating layer 2460 has two portions with different thicknesses. The third insulating layer 2460 includes a first portion with a higher thickness and a second portion with a lower thickness. The second portion of the third insulating layer 2460 with a lower thickness in the E1 region corresponds to the ninth via hole GH9 and the tenth via hole GH10, and the second portion of the third insulating layer 2460 with a lower thickness in the E2 region corresponds to the seventh via hole GH7 and the eighth via hole GH8. Therefore, by reducing the height of a portion of the third insulating layer 2460, the heights of the seventh via hole GH7, the eighth via hole GH8, the ninth via hole GH9 and the tenth via hole GH10 can be reduced, and the slope angles of the second connecting wire 1020 and the first electrode 1151 of the second light-emitting device 1150 can be improved, thereby preventing the second connecting wire 1020 and the first electrode 1151 of the second light-emitting device 1150 from being broken.

Figure 10H:
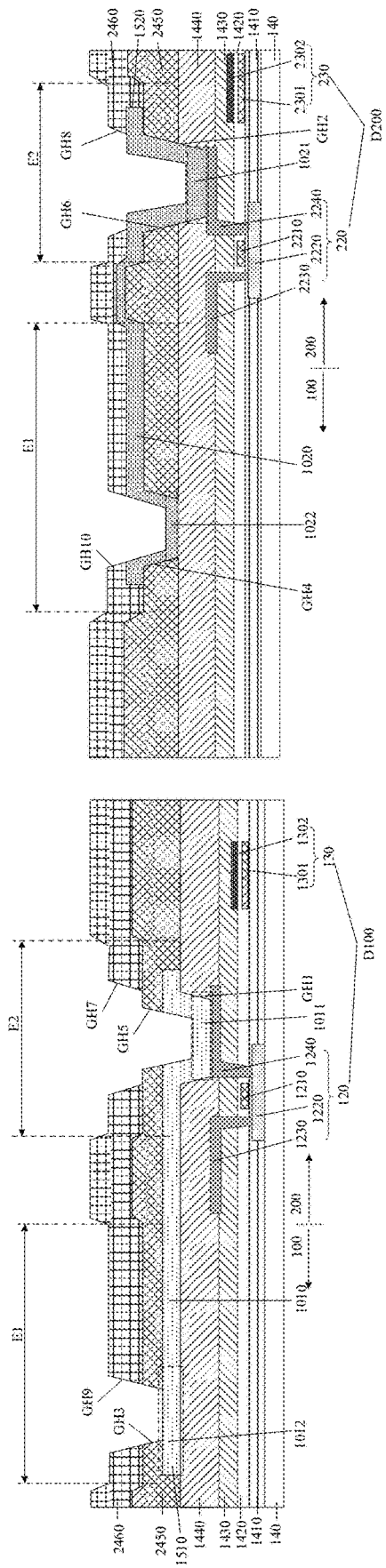

For example, as shown in FIG. 10H, the photoresist pattern 163 (in the figure on the left in FIG. 10G) and the photoresist pattern 164 (in the figure on the right in FIG. 10G) are removed. The third insulating layer 2460 may further be etched and the etched thickness may be controlled to provide a planarized surface.

For example, the manufacturing process of other film layers of the display substrate shown in FIG. 6A, such as the first light-emitting device D100, the second light-emitting device D200, and the pixel defining layer 1470, etc., may refer to the manufacturing process shown in FIG. 8K-FIG. 8M, which will not be described in detail again here.

For example, the manufacturing process of the display substrate shown in FIG. 6B may refer to the manufacturing process shown in FIG. 9A-FIG. 9F and FIG. 10A-FIG. 10H, which will not be described in detail again here.

For example, forming the first conductive layer further includes: forming a first dummy wire. As shown in FIG. 7, the first dummy wire DML1 is connected to the second end 1012 of the first connecting wire 1010, that is, while the first conductive layer 1510 (as shown in FIG. 8C) is formed, the first dummy wire DML1 is formed integrally with the first connecting wire 1010. The extending direction (e.g., the second direction Y1) of the first dummy wire DML1 intersects with the extending direction (e.g., the first direction X1) of the first connecting wire 1010.

For example, forming the second conductive layer further includes: forming a second dummy wire. As shown in FIG. 7, the second dummy wire DML2 is connected to the second end 1022 of the second connecting wire 1020, that is, while the second conductive layer 1520 (as shown in FIG. 8G) is formed, the second dummy wire DML2 is formed integrally with the second connecting wire 1020. The extending direction (e.g., the second direction Y1) of the second dummy wire DML2 intersects with the extending direction (e.g., the first direction X1) of the second connecting wire 1020. The setting of the first dummy wire DML1 and the second dummy wire DML2 can enable the wires of the first display region 100 more uniform, thereby enabling the light transmission of the first display region 100 uniform, as well as improving the uniformity of wire etching in the first display region 100.

Figure 11:
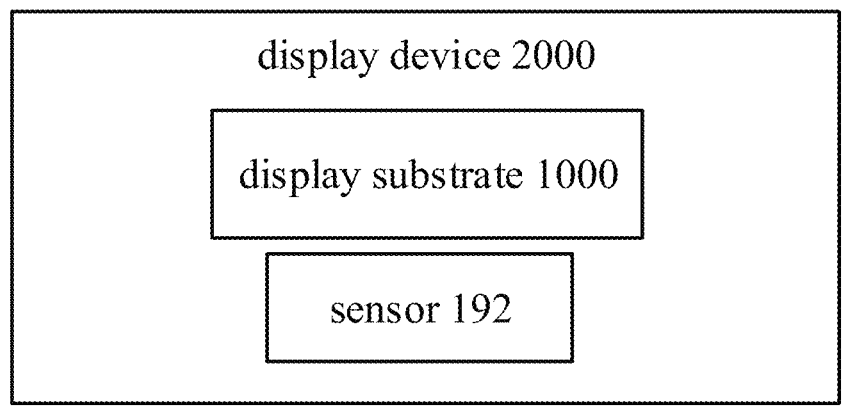
FIG. 11 is a schematic view of a display device provided by at least one embodiment of the present disclosure.

FIG. 11 is a schematic view of a display device provided by at least one embodiment of the present disclosure. At least one embodiment of the present disclosure provides a display device 2000, and the display device 2000 includes the display substrate 1000 of any one of the embodiments mentioned above.

For example, as shown in FIG. 11, the display device 2000 may further include a flexible circuit board and a control chip. For example, the flexible circuit board is bonded to a bonding region of the display substrate 1000, and the control chip is mounted on the flexible circuit board, thereby being electrically connected to the display region; or, the control chip is directly bonded to the bonding region, thereby being electrically connected to the display region.

For example, the control chip may be a central processing unit, a digital signal processor, a system-on-chip (SoC), or the like. For example, the control chip may further include a memory, a power supply module, etc., and implements power supply and signal input and output functions through additionally disposed conductive lines, signal lines, or the like. For example, the control chip may further include a hardware circuit, computer executable codes, or the like. The hardware circuit may include conventional very large-scale integration (VLSI) circuit or gate array as well as existing semiconductors such as logic chips, transistors, or other discrete components, and the hardware circuit may also include field programmable gate array, programmable array logic, programmable logic device, etc.

For example, the display device 2000 provided by at least one embodiment of the present disclosure may be any product or component with a display function, such as an OLED panel, an OLED TV, a QLED panel, a QLED TV, a mobile phone, a tablet computer, a notebook computer, a digital photo frame, a navigator, etc. The display device 2000 may further include other components, such as a data drive circuit, a timing controller, etc., which are not limited in the embodiments of the present disclosure.

For example, as shown in FIG. 11, the display device 2000 further includes a sensor 192. The sensor 192 is disposed on the non-display side of the display substrate 1000. The arrangement of the sensor 192 may refer to FIG. 1B. The sensor 192 is configured to receive a light (e.g., a collimated light) from the display side of the display substrate 1000. The orthographic projection of the sensor 192 on the base substrate 140 at least partially overlaps with the first display region 100. Therefore, the first display region 100 provides convenience for the setting of the sensor 192 while realizing the display.

For example, the sensor 192 is an image sensor, an infrared sensor, a distance sensor, etc., and the sensor 192 is, for example, implemented in the form of a chip or the like.

For example, the sensor 192 is an image sensor, and can be used to collect images of the external environment that the light-connecting surface of the sensor 192 faces. For example, the image sensor may be a CMOS image sensor or a CCD image sensor, and the sensor 192 may also be an infrared sensor, a distance sensor, etc. The sensor 192 can be used to implement a camera of a mobile terminal such as a mobile phone or a notebook, and may also include an optical device such as a lens, a mirror, or an optical waveguide as needed to modulate an optical path. The embodiments of the present disclosure do not limit the type, function and arrangement of the sensor 192.

It should be noted that, for the sake of clarity and conciseness, the embodiments of the present disclosure do not provide all units of the display device. In order to realize the substrate function of the display device, those skilled in the art can provide or set other structures not shown according to specific needs, which are not limited by the embodiments of the present disclosure.

Regarding the technical effect of the display device provided by the embodiments mentioned above, reference can be made to the technical effect of the display substrate provided in the embodiments of the present disclosure, which will not be repeated here.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined to obtain new embodiments.

What have been described above are only specific implementations of the present disclosure, but the protection scope of the present disclosure is not limited thereto. Any variations or substitutions that may be readily achieved by person skilled in the art based on the scope of the disclosure should be included within the scope of the present disclosure. Therefore, the protection scope of the present disclosure should be based on the protection scope of the claims.

What is claimed is:

1. A method of manufacturing a display substrate, comprising:
providing a base substrate, wherein the base substrate has a plurality of pixel drive circuits formed thereon, and the plurality of pixel drive circuits comprise a first pixel drive circuit and a second pixel drive circuit;
forming a first insulating layer on the base substrate, wherein the first insulating layer is formed to partially expose the plurality of pixel drive circuits, respectively;
forming a first wiring layer on the first insulating layer, wherein the first wiring layer comprises a first connecting wire, and the first connecting wire is formed to be electrically connected to the first pixel drive circuit through the first insulating layer;

forming a second insulating layer on the first wiring layer, and patterning the second insulating layer;

forming a second wiring layer on the second insulating layer, wherein the second wiring layer comprises a second connecting wire, and the second connecting wire is formed to be electrically connected to the second pixel drive circuit through the first insulating layer and the second insulating layer; and forming a third insulating layer on the second wiring layer, and patterning the third insulating layer, wherein the third insulating layer and the second insulating layer are subjected to a patterning process using a same reticle.

2. The method according to claim 1, further comprising:

forming a plurality of light-emitting devices on the third insulating layer, wherein each of the plurality of light-emitting devices comprises a first electrode, and the plurality of light-emitting devices comprise a first light-emitting device and a second light-emitting device;

a first electrode of the first light-emitting device is electrically connected to the first connecting wire through the second insulating layer and the third insulating layer; and a first electrode of the second light-emitting device is electrically connected to the second connecting wire through the third insulating layer.

3. The method according to claim 2, wherein forming the first insulating layer on the base substrate comprises:

forming a first via hole and a second via hole in the first insulating layer, wherein the first via hole partially exposes the first pixel drive circuit, and the second via hole partially exposes the second pixel drive circuit.

4. The method according to claim 3, wherein forming the first wiring layer on the first insulating layer comprises:

forming a first end of the first connecting wire to be electrically connected to the first pixel drive circuit through the first via hole in the first insulating layer, wherein a second end of the first connecting wire is formed for electrically connecting the first light-emitting device.

5. The method according to claim 4, wherein forming the second insulating layer comprises:

forming a third via hole and a fourth via hole in the second insulating layer, wherein the third via hole exposes the second end of the first connecting wire, and an orthographic projection of the fourth via hole on the base substrate overlaps with an orthographic projection of a second end of the second connecting wire on the base substrate.

6. The method according to claim 5, wherein forming the second insulating layer further comprises:

forming a fifth via hole and a sixth via hole in the second insulating layer, wherein an orthographic projection of the fifth via hole on the base substrate overlaps with an orthographic projection of the first via hole on the base substrate, and the fifth via hole exposes the first end of the first connecting wire, and the sixth via hole corresponds to the second via hole.

7. The method according to claim 6, wherein forming the second wiring layer comprises:

forming a first end of the second connecting wire to be electrically connected to the second pixel drive circuit through the second via hole in the first insulating layer and the sixth via hole in the second insulating layer, wherein the second end of the second connecting wire is formed for connecting the second light-emitting device.

8. The method according to claim 7, wherein forming the third insulating layer comprises:

forming a seventh via hole and an eighth via hole in the third insulating layer, wherein an orthographic projection of the seventh via hole on the base substrate overlaps with orthographic projections of the first via hole of the first insulating layer and the fifth via hole of the second insulating layer on the base substrate, and the seventh via hole exposes the first end of the first connecting wire, an orthographic projection of the eighth via hole on the base substrate overlaps with orthographic projections of the second via hole of the first insulating layer and the sixth via hole of the second insulating layer on the base substrate, and the eighth via hole exposes the first end of the second connecting wire.

9. The method according to claim 8, wherein forming the third insulating layer further comprises:

forming a ninth via hole and a tenth via hole in the third insulating layer, wherein an orthographic projection of the ninth via hole on the base substrate overlaps with an orthographic projection of the third via hole of the second insulating layer on the base substrate, the ninth via hole exposes the second end of the first connecting wire, an orthographic projection of the tenth via hole on the base substrate overlaps with an orthographic projection of the fourth via hole of the second insulating layer on the base substrate, and the tenth via hole exposes the second end of the second connecting wire.

10. The method according to claim 9, wherein forming the second wiring layer further comprises:

forming a third pad layer at the fifth via hole of the second insulating layer, wherein the third pad layer at least partially overlaps with the fifth via hole of the second insulating layer, so as to be electrically connected to the first end of the first connecting wire, and the seventh via hole of the third insulating layer at least partially exposes the third pad layer to allow electrical connection to the first connecting wire through the third pad layer; and forming a fourth pad layer on the second insulating layer, wherein the fourth pad layer at least partially overlaps with the third via hole of the second insulating layer and covers the second end of the first connecting wire, and the ninth via hole of the third insulating layer at least partially exposes the fourth pad layer.

11. A display substrate, having a first side for display and a second side opposite to the first side, comprising:

a base substrate, comprising:

a display region, wherein the display region comprises a first display region and a second display region at least partially surrounding the first display region, wherein the first display region comprises a first sub-pixel array, and the first display region allows light from the first side of the display substrate to be at least partially transmitted to the second side of the display substrate, the first sub-pixel array comprises a plurality of light-emitting devices arranged in array, and the plurality of light-emitting devices comprise a first light-emitting device and a second light-emitting device, the second display region comprises a first pixel drive circuit array, the first pixel drive circuit array comprises a plurality of first pixel drive circuit units, and the plurality of first pixel drive circuit units comprise a first pixel drive circuit and a second pixel drive circuit;

a first insulating layer, disposed on the base substrate, wherein the first insulating layer comprises a first via hole and a second via hole, and the first via hole and the second via hole respectively expose the first pixel drive circuit and the second pixel drive circuit;

a first connecting wire, located in the first display region and the second display region, wherein the first connecting wire is located on a side of the first insulating layer away from the base substrate, a first end of the first connecting wire is formed to be electrically connected to the first pixel drive circuit through the first via hole, and a second end of the first connecting wire is electrically connected to the first light-emitting device;

a second insulating layer, disposed on a side of the first insulating layer away from the base substrate, wherein the second insulating layer comprises a plurality of via holes, and the plurality of via holes of the second insulating layer are formed for electrical connection to the first light-emitting device, the second light-emitting device, the first pixel drive circuit and the second pixel drive circuit;

a second connecting wire, located in the first display region and the second display region, wherein the second connecting wire is located on a side of the second insulating layer away from the base substrate, a first end of the second connecting wire is formed to be electrically connected to the second pixel drive circuit through the second via hole and one of the plurality of via holes in the second insulating layer for connection to the second pixel drive circuit, and a second end of the second connecting wire is electrically connected to the second light-emitting device; and a third insulating layer, disposed on the side of the second insulating layer away from the base substrate, wherein the third insulating layer comprises a plurality of via holes, wherein positions of the plurality of via holes of the third insulating layer are in one-to-one correspondence with positions of the plurality of via holes of the second insulating layer, so as to form a plurality of via holes penetrating through the second insulating layer and the third insulating layer.

12. The display substrate according to claim 11, wherein each of the plurality of light-emitting devices comprises a first electrode, the first electrode of the first light-emitting device is connected to the second end of the first connecting wire through via holes of the second insulating layer and the third insulating layer, and the first electrode of the second light-emitting device is connected to the second end of the second connecting wire through a via hole of the third insulating layer.

13. The display substrate according to claim 12, wherein the plurality of via holes of the second insulating layer comprise a third via hole, a fourth via hole, a fifth via hole and a sixth via hole, the third via hole and the fourth via hole are located in the first display region, the third via hole exposes the second end of the first connecting wire, and an orthographic projection of the fourth via hole on the base substrate overlaps with an orthographic projection of the second end of the second connecting wire on the base substrate; and the fifth via hole and the sixth via hole are located in the second display region, an orthographic projection of the fifth via hole on the base substrate overlaps with an orthographic projection of the first via hole of the first insulating layer on the base substrate, the fifth via hole exposes the first end of the first connecting wire, and an orthographic projection of the sixth via hole on the base substrate overlaps with an orthographic projection of the second via hole of the first insulating layer on the base substrate.

14. The display substrate according to claim 13, wherein the first end of the second connecting wire is electrically connected to the second pixel drive circuit through the second via hole of the first insulating layer and the sixth via hole of the second insulating layer, and the second end of the second connecting wire is used to electrically connect to the second light-emitting device.

15. The display substrate according to claim 14, wherein the plurality of via holes of the third insulating layer comprise a seventh via hole, an eighth via hole, a ninth via hole and a tenth via hole, the seventh via hole and the eighth via hole are located in the second display region, an orthographic projection of the ninth via hole on the base substrate overlaps with an orthographic projection of the third via hole of the second insulating layer on the base substrate, the ninth via hole exposes the second end of the first connecting wire, an orthographic projection of the tenth via hole on the base substrate overlaps with an orthographic projection of the fourth via hole of the second insulating layer on the base substrate, and the tenth via hole exposes the second end of the second connecting wire; and the ninth via hole and the tenth via hole are located in the first display region, an orthographic projection of the seventh via hole on the base substrate overlaps with orthographic projections of the first via hole of the first insulating layer and the fifth via of the second insulating layer on the base substrate, and the seventh via hole exposes the first end of the first connecting wire, an orthographic projection of the eighth via hole on the base substrate overlaps with orthographic projections of the second via hole of the first insulating layer and the sixth via hole of the second insulating layer on the base substrate, and the eighth via hole exposes the first end of the second connecting wire.

16. The display substrate according to claim 15, wherein the first electrode of the first light-emitting device is connected to the second end of the first connecting wire through the third via hole of the second insulating layer and the ninth via hole of the third insulating layer, and the first electrode of the second light-emitting device is connected to the second end of the second connecting wire through the tenth via hole of the third insulating layer.

17. The display substrate according to claim 16, wherein the first light-emitting device further comprises a first protective layer, and the second light-emitting device further comprises a second protective layer; and the first protective layer covers the seventh via hole of the third insulating layer and the fifth via hole of the second insulating layer, and the second protective layer covers the eighth via of the third insulating layer.

18. The display substrate according to claim 15, further comprising a first pad layer and a second pad layer, wherein the first pad layer at least partially covers the second via hole of the first insulating layer and is electrically connected to the second pixel drive circuit;

the sixth via hole of the second insulating layer at least partially exposes the first pad layer, so as to allow the second connecting wire to be electrically connected to the second pixel drive circuit through the first pad layer; and the second pad layer is electrically connected to the second end of the second connecting wire, and the fourth via hole of the second insulating layer at least partially exposes the second pad layer.

19. The display substrate according to claim 11, further comprising a pixel defining layer disposed on a side of the first electrodes of the plurality of light-emitting devices and the third insulating layer away from the base substrate, wherein the pixel defining layer comprises a plurality of first pixel openings, and the plurality of first pixel openings are in one-to-one correspondence with the plurality of light-emitting devices to form light-emitting regions of the plurality of light-emitting devices; and the plurality of light-emitting devices further comprise a first light-emitting layer and a second electrode, the second electrode is located on a side of the pixel defining layer away from the base substrate, and the first light-emitting layer is located in the first pixel opening and between the first electrode and the second electrode.

20. The display substrate according to claim 11, further comprising a first dummy wire and a second dummy wire located in the first display region, wherein the first dummy wire is connected to the second end of the first connecting wire, and the second dummy wire is connected to the second end of the second connecting wire; and the first dummy wire and the first connecting wire are disposed in a same layer and formed integrally, the second dummy wire and the second connecting wire are disposed on a same layer and formed integrally, an extending direction of the first dummy wire intersects with an extending direction of the first connecting wire, and an extending direction of the second dummy wire intersects with an extending direction of the second connecting wire.

* * * * *